(12) United States Patent
Fujiu et al.

(10) Patent No.: US 7,257,032 B2
(45) Date of Patent: Aug. 14, 2007

(54) METHOD OF WRITING DATA TO A SEMICONDUCTOR MEMORY DEVICE

(75) Inventors: Masaki Fujiu, Yokohama (JP); Noboru Shibata, Kawasaki (JP); Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 11/270,499

(22) Filed: Nov. 10, 2005

(65) Prior Publication Data

US 2006/0120162 A1    Jun. 8, 2006

(30) Foreign Application Priority Data

Nov. 12, 2004  (JP)  ............................ P2004-328971
Jan. 21, 2005  (JP)  ............................ P2005-014627

(51) Int. Cl.
*G11C 11/34* (2006.01)

(52) U.S. Cl. ........................... 365/185.24; 365/185.17; 365/185.22

(58) Field of Classification Search ........... 365/185.24, 365/185.17, 185.18, 185.22, 185.05, 185.21, 365/185.29

See application file for complete search history.

(56) References Cited

U.S. PATENT DOCUMENTS 6,320,785 B1 * 11/2001 Yoshida et al. ......... 365/185.03

6,650,568 B2 * 11/2003 Iijima .................... 365/185.18
6,925,004 B2    8/2005 Shibata et al.
6,987,695 B2 * 1/2006 Park et al. ............. 365/185.18
2006/0120162 A1 6/2006 Fujiu et al.

OTHER PUBLICATIONS

U.S. Appl. No. 11/610,193, filed Dec. 13, 2006, Fukuka et al.
U.S. Appl. No. 11/270,499, filed Nov. 10, 2005, Fujiu et al.

* cited by examiner

*Primary Examiner*—Richard T. Elms
*Assistant Examiner*—Hien N Nguyen
(74) *Attorney, Agent, or Firm*—Oblon, Spivak, McClelland, Maier & Neustadt, P.C.

(57) ABSTRACT

A method of writing data to a semiconductor memory device with memory cells, each of which stores data defined by threshold voltage thereof in a non-volatile manner, the device having first and second memory cells disposed adjacent to each other to be sequentially written in this order, the method including: performing a first data write operation for writing data defined by a threshold voltage lower than a desired threshold voltage into the first memory cell; performing a second data write operation for writing data into the second memory cell; and performing a third data writing operation for writing data defined by the desired threshold voltage into the first memory cell.

20 Claims, 48 Drawing Sheets

First Write Scheme
(All Word Lines Selected in BLK)

Initial State

WLi Write

Initial State

WLi Write

WLi+1 Write

|  | Col, 0 | Col, 1 | Col, 2 |
|---|---|---|---|
| WLi Write Data | MCi, 0<br>0 | MCi, 1<br>1 | MCi, 2<br>0 |
| WLi+1 Write Data | MCi+1, 0<br>1 | MCi+1, 1<br>0 | MCi+1, 2<br>0 |
| WLi Verify-voltage | Vv12 | — | Vv11 |

Fourth Write Scheme
Lower Page Write State

Fourth Write Scheme
Upper Page Write

Sixth Write Scheme
Lower Page Write State

Seventh Write Scheme
Four-Value Data Threshold Distribution

FIG. 36
Seventh Write Scheme
Initial States of Sectors X,Y,Z and W
(a) Threshold Distribution in Sector X
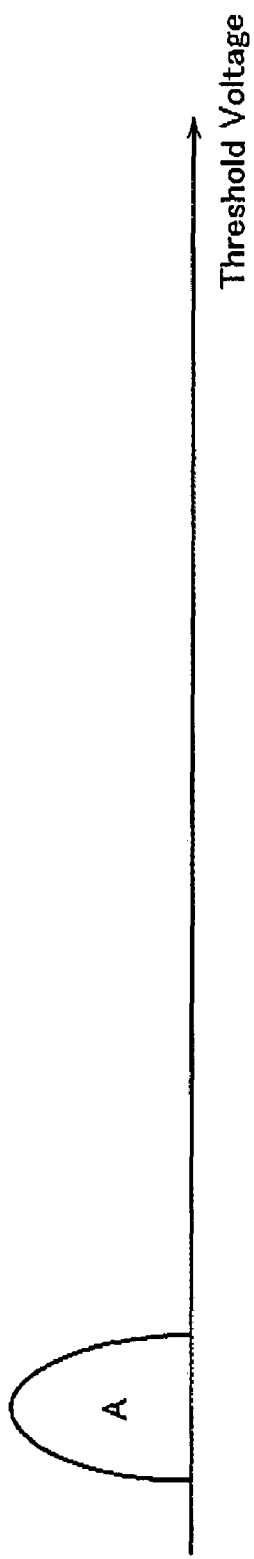
(b) Threshold Distribution in Sectors Y,Z and W
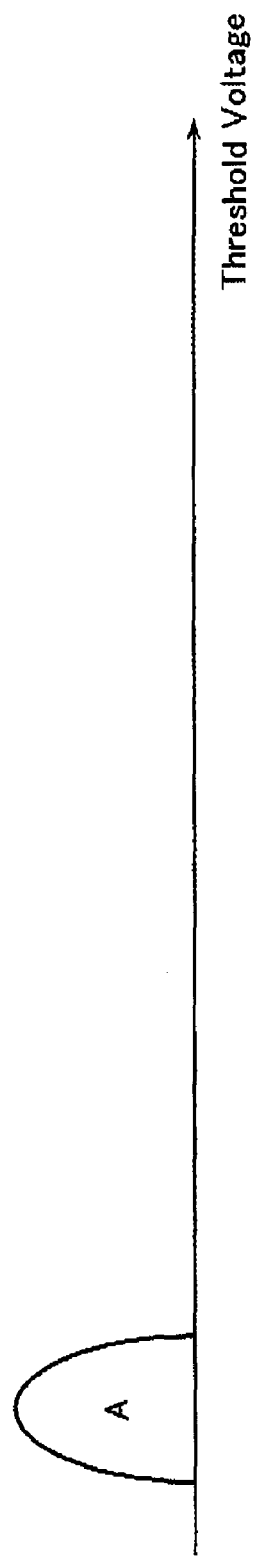

FIG. 37
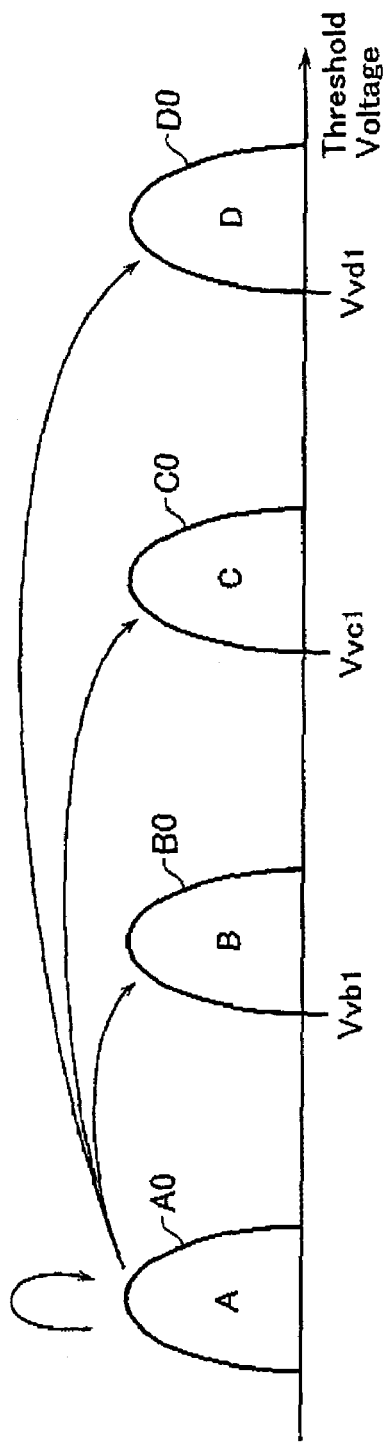
(a) Threshold Change in Sector X
Seventh Write Scheme
Preliminary Write for Sector X
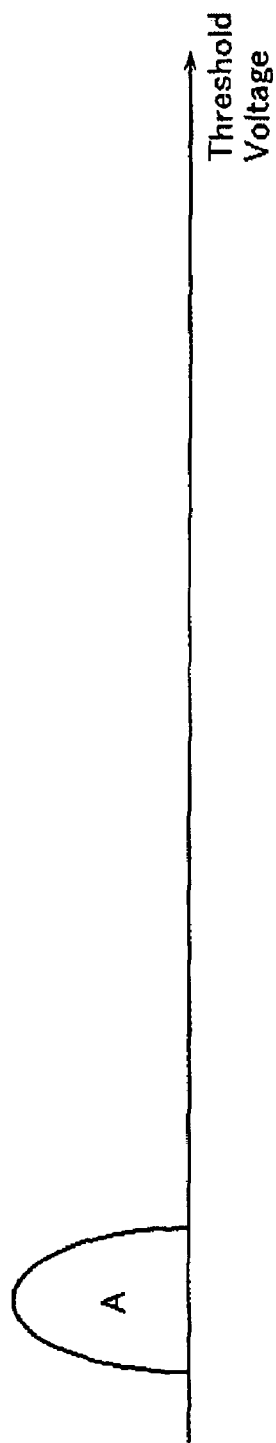
(b) Threshold Distribution in Sectors Y, Z and W FIG. 38
Seventh Write Scheme
Preliminary Write for Sector Y
(a) Threshold Change in Sector X
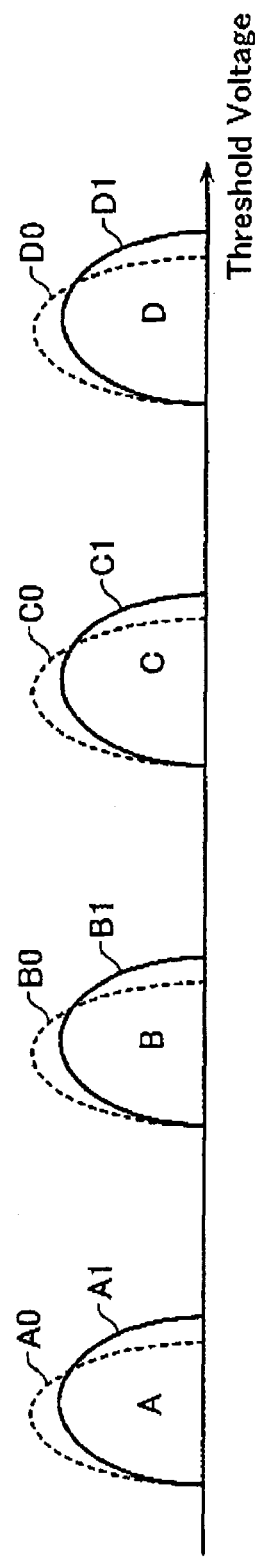
(b) Threshold Change in Sector Y
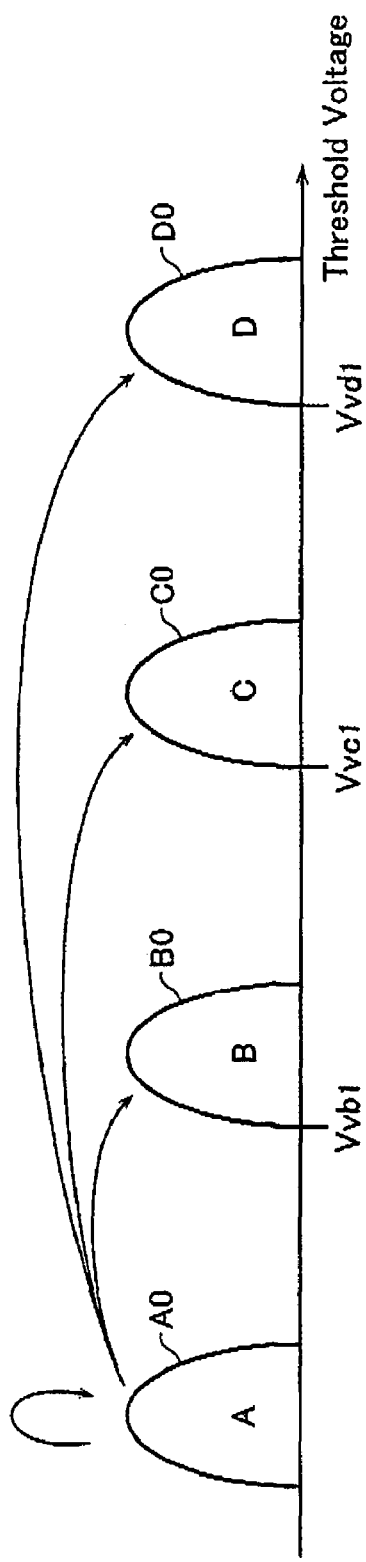

FIG. 39
Seventh Write Scheme
Preliminary Write for Sector Z
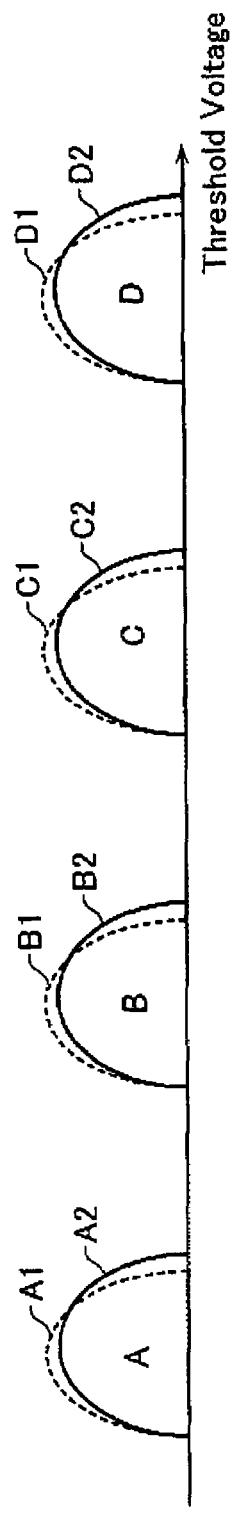
(a) Threshold Change in Sector X
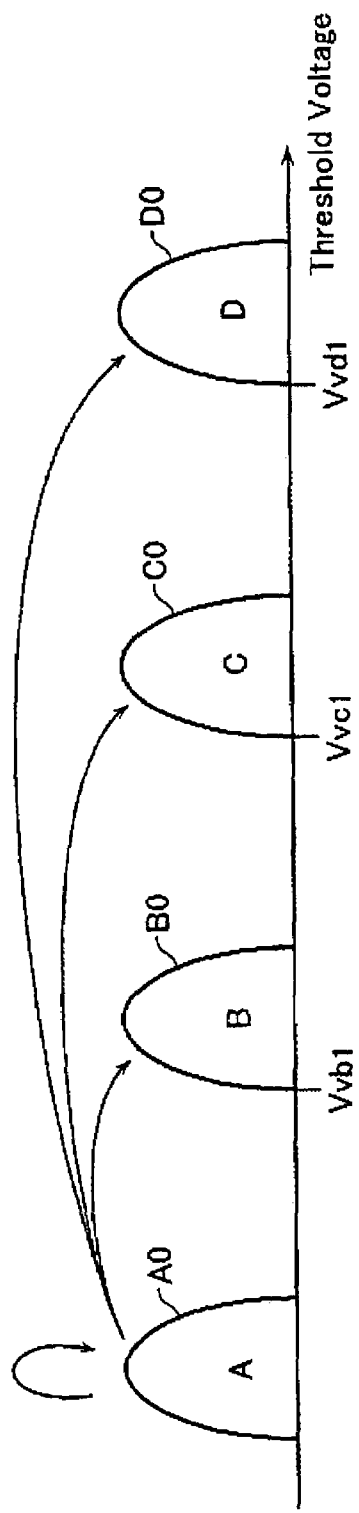
(b) Threshold Change in Sector Z FIG. 40
Seventh Write Scheme
Preliminary Write for Sector W
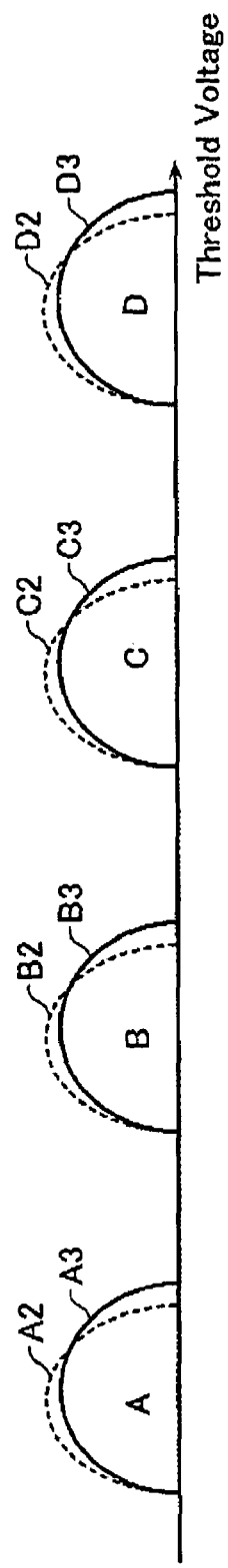
(a) Threshold Change in Sector X
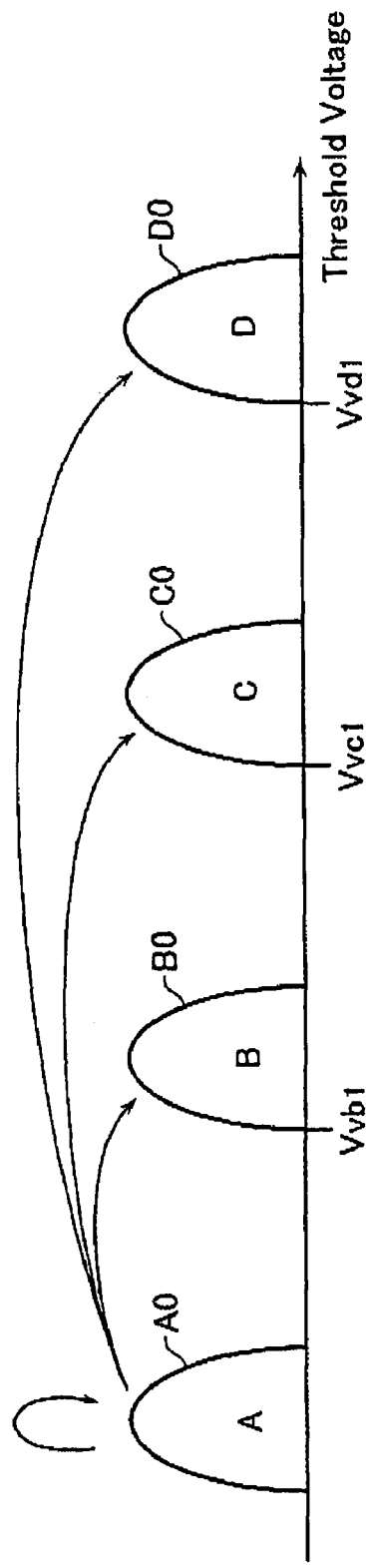
(b) Threshold Change in Sector W FIG. 41
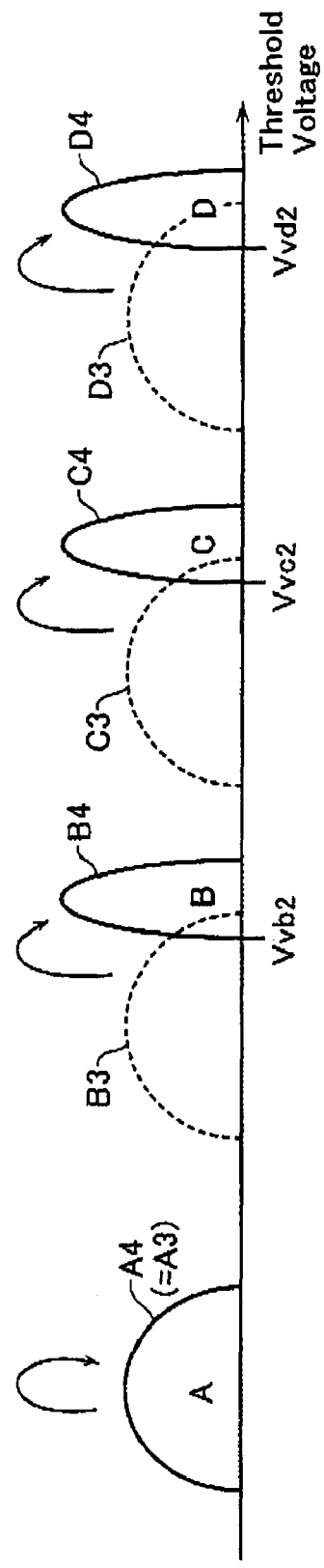
(a) Threshold Change in Sector X
Seventh Write Scheme
Finishing Write for Sector X
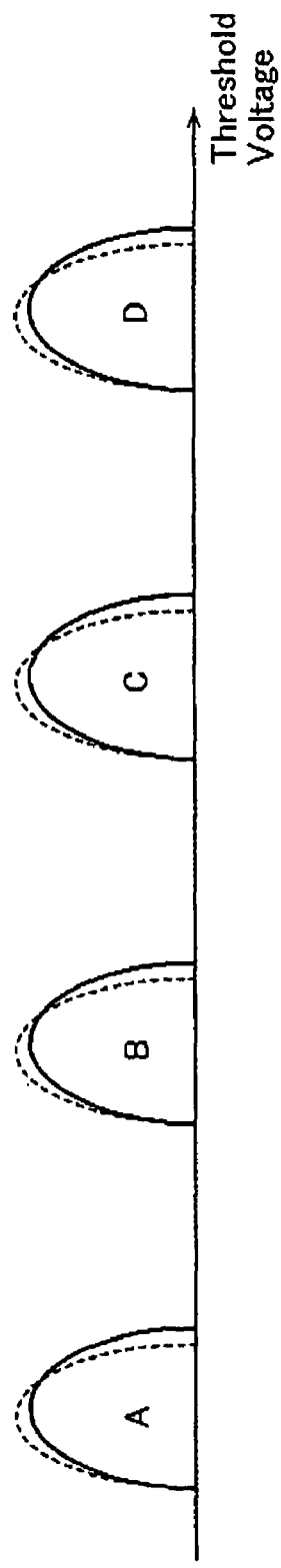
(b) Threshold Change in Sectors Y, Z and W FIG. 42
Seventh Write Scheme
Finishing Write for Sectors Y,Z and W
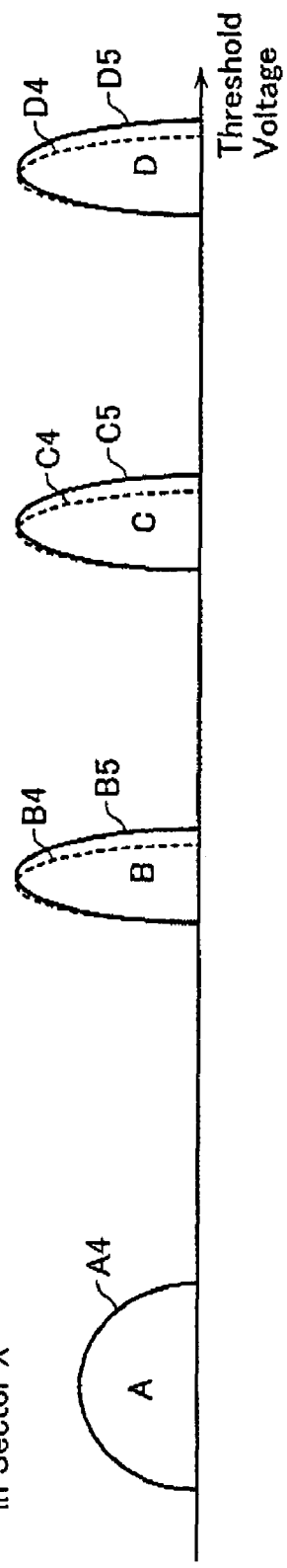
(a) Threshold Change in Sector X
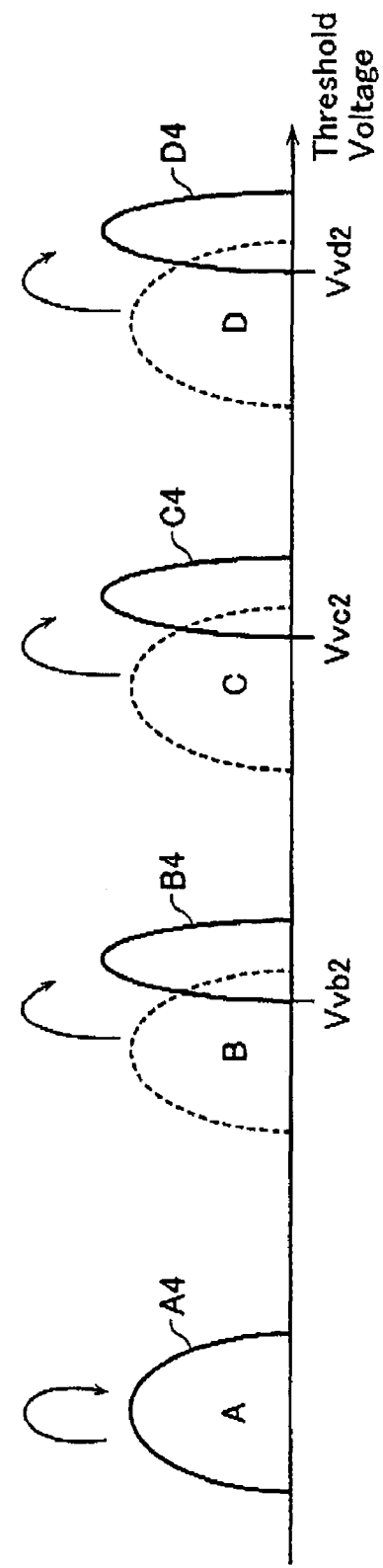
(b) Threshold Change in Sectors Y,Z and W

METHOD OF WRITING DATA TO A SEMICONDUCTOR MEMORY DEVICE

CROSS-REFERENCE TO RELATED APPLICATIONS

This application is based on and claims the benefit of priority from the prior Japanese Patent Applications No. 2004-328971, filed on Nov. 12, 2004 and No. 2005-014627, filed on Jan. 21, 2005, the entire contents of which are incorporated herein by reference.

BACKGROUND OF THE INVENTION

1. Field of the Invention

This invention relates to a method of writing data to a semiconductor memory device with electrically rewritable and non-volatile memory cells.

2. Description of Related Art

A NAND-type flash memory is known as one of electrically rewritable (i.e., erasable and programmable) and non-volatile semiconductor memories (EEPROMs). The NAND-type flash memory has a feature that it is possible to make unit cell area thereof smaller than that of a NOR-type one, and thereby easily increasing the memory capacity, because it has a memory cell array with NAND cell units, each of which has a plurality of memory cells connected in series.

A transistor is used as a memory cell in such the flash memory device, which has a charge storage layer (for example, floating gate) and a control gate stacked thereabove. This memory cell usually stores binary data in such a manner that data "0" is defined as a high threshold voltage state (usually, positive threshold voltage state) where electrons have been injected into the floating gate; and data "1" is defined as a low threshold voltage state (usually, negative threshold voltage state) where electrons stored in the floating gate have been released.

To increase the data storage capacity of the flash memory, it may be used a multi-value data storage scheme so that one memory cell stores plural bits. For example, as a four-value data storage scheme, there has already been provided such a data bit assignment method that four-value data "xy", which is defined by upper page data (i.e., upper bit data) "x" and lower page data (i.e., lower bit data) "y", are arranged in order of threshold voltage as follows: "A"="11", "B"="10", "C"="00" and "D"="01" (refer to, for example, Unexamined Japanese Patent Application Publication No. 2001-93288).

According to this data assignment method, there is obtained advantageous effects such as: the number of lower page read operations may be decreased; and high-rate data write may be achieved.

There has been provided another data bit assignment example in which "A"="11", "B"="10", "C"="01" and "D"="00" are arranged in order of threshold voltage. In this method, however, it is necessary for reading data to do one upper page read operation and three lower page read operations.

SUMMARY OF THE INVENTION

According to an aspect of the present invention, there is provided a method of writing data to a semiconductor memory device with memory cells, each of which stores data defined by threshold voltage thereof in a non-volatile manner, the device having first and second memory cells disposed adjacent to each other to be sequentially written in this order, the method including:

performing a first data write operation for writing data defined by a threshold voltage lower than a desired threshold voltage into the first memory cell;

performing a second data write operation for writing data into the second memory cell; and performing a third data write operation for writing data defined by the desired threshold voltage into the first memory cell.

BRIEF DESCRIPTION OF THE DRAWINGS

FIG. 36 shows initial data states of sectors X, Y, Z and W.

FIG. 37 shows data states after the preliminary write for the sector X.

FIG. 38 shows data states after the preliminary write for the sector Y.

FIG. 39 shows data state after the preliminary write for the sector Z.

FIG. 40 shows data states after the preliminary write for the sector W.

FIG. 41 shows data states after the finishing write for the sector X.

FIG. 42 shoe data states after the finishing write for the sectors Y, Z and W.

DETAILED DESCRIPTION OF THE EMBODIMENTS

Figure 1:
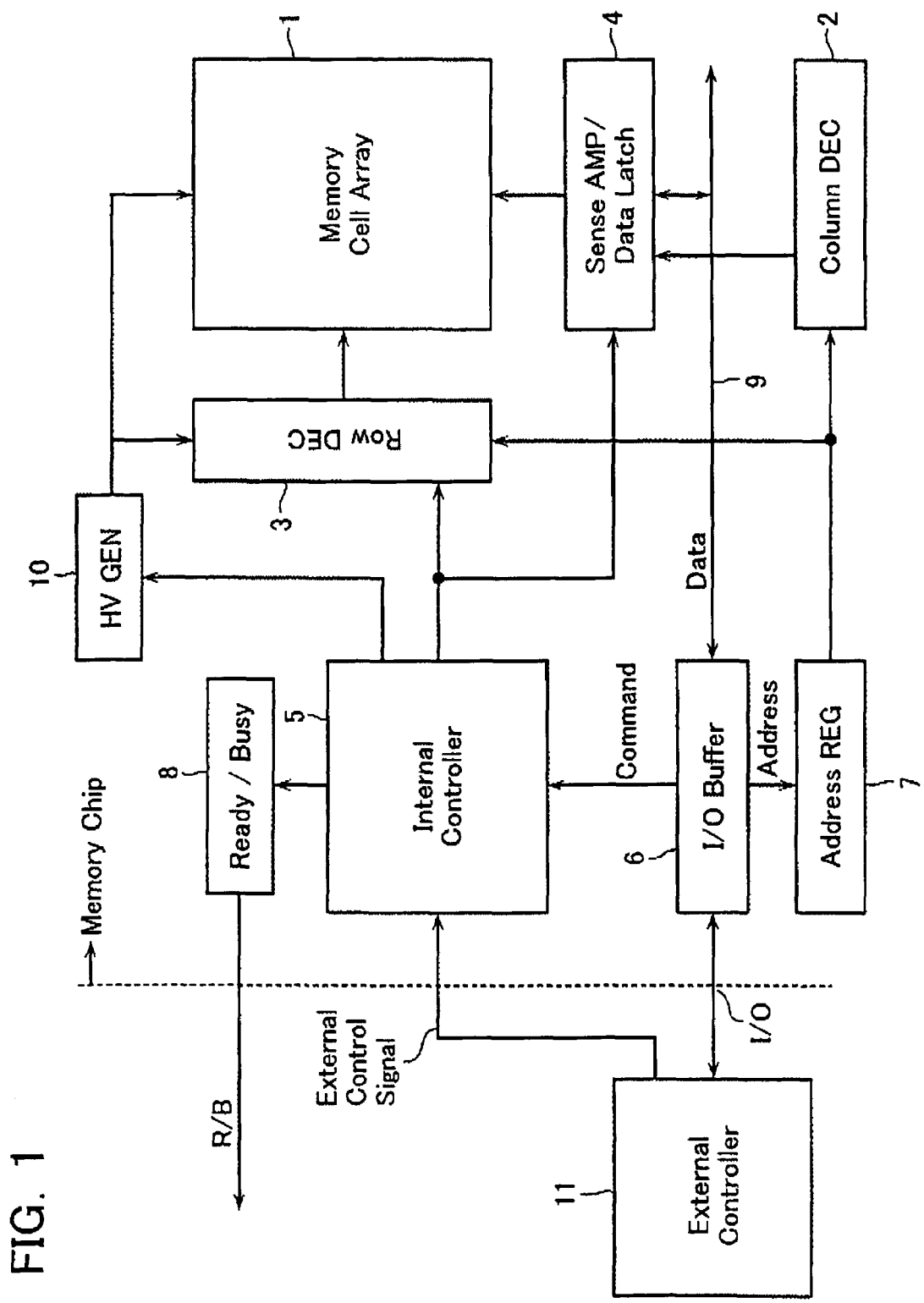
FIG. 1 shows a functional block configuration of a flash memory in accordance with an embodiment of the present invention.

Illustrative embodiments of this invention will be explained with reference to the accompanying drawings below.

As a NAND-type flash memory is further miniaturized, capacitive coupling between adjacent cells' floating gates becomes to influence on cell data. This situation will be explained in detail with reference to FIG. 49, which shows three memory cells MCi−1, MCi and MCi+1 arranged in the direction of a bit line in a NAND cell unit. Each memory cell is a MOS transistor with such a stacked gate structure that floating gate FG and control gate CG are stacked. The floating gate FG serves as a carrier storage layer. Therefore, a threshold voltage state defined by the amount of carrier stored in the floating gate will be stored as data in a non-volatile manner. Control gates CG are formed to be continued in the direction perpendicular to the drawing space and serve as word lines WLi−1, WLi and WLi+1.

Figure 49:
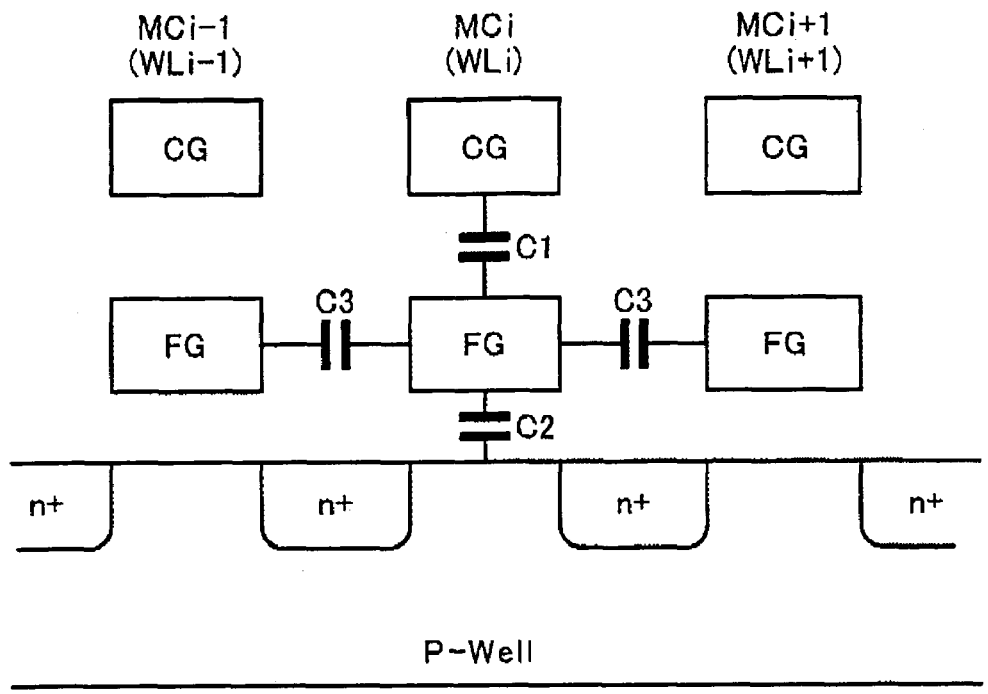
FIG. 49 shows a capacitive coupling situation between floating gates of memory cells.

As shown in FIG. 49, capacitances C1 and C2 are formed between the floating gate FG and the control gate CG and the channel, respectively; and capacitance C3 is formed between the adjacent cell's floating gates (FG-FG). Capacitances C1 and C2 define the write performance of the memory cell. More miniaturized the cell pitch, larger the capacitance C3 between the floating gates, and this fact leads to data shift or variation after data write.

The data shift or variation will be described bellow. Prior to data write, the entire memory cells in a selected block are set in an erased state (i.e., low threshold voltage state). Supposing that memory cells MCi−1, MCi and MCi+1 are sequentially written, when memory cell MCi is written, memory cell MCi+1 is held in the erase state. When memory cell MCi+1 is written after having written memory cell MCi, the floating gate of memory cell MCi+1 is determined in potential in accordance with the written data. In response to this, data of memory cell MCi, which has already been written, will be shifted due to capacitive coupling via capacitance C3.

The detail is as follows. Suppose that memory cells MCi and MCi+1 are sequentially written into a high threshold voltage state, i.e., "0" data state. If floating gate FG of the memory cell MCi+1 is lowered in potential due to "0" write (i.e., electron injection), the threshold voltage of the memory cell MCi, which has already been written into a "0" state, will be shifted to be higher in the positive direction due to capacitive coupling based on FG-FG capacitance C3.

Figure 48:
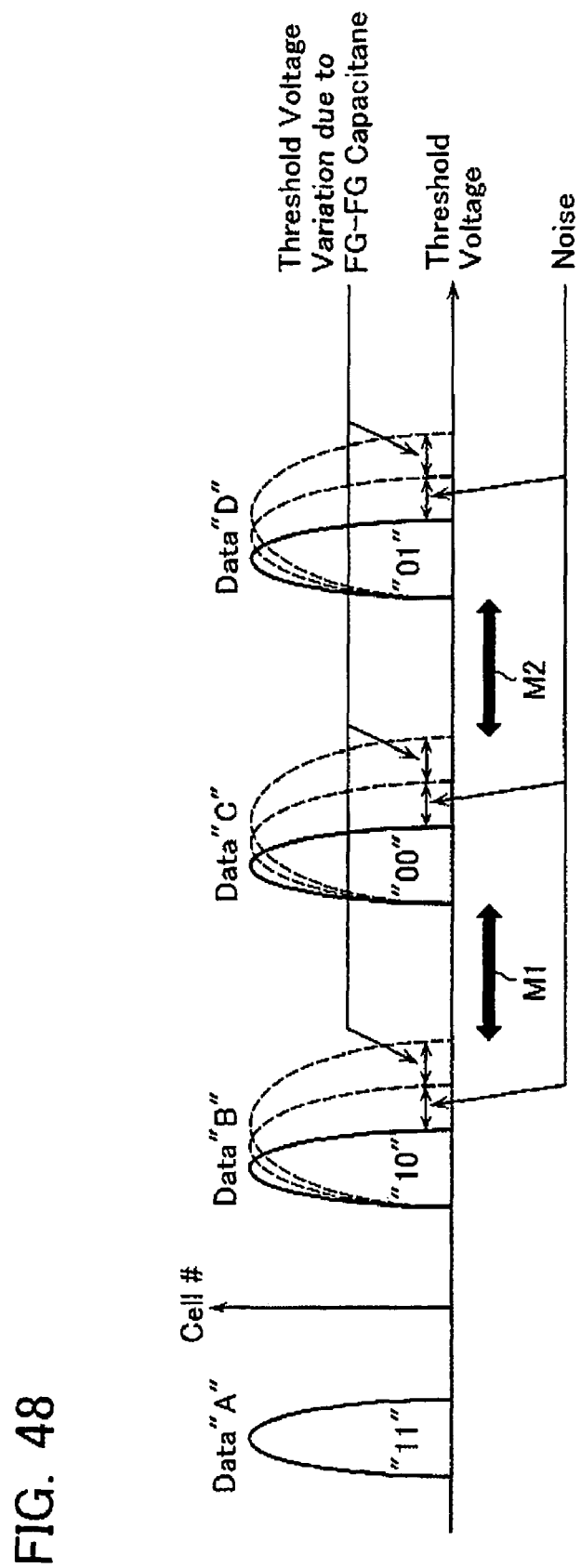
FIG. 48 shows data variations in four-value data due to capacitive coupling between floating gates.

Therefore, as shown by dotted lines in FIG. 48, data threshold distributions in accordance with a four-value data storage scheme will vary due to FG-FG capacitance in addition to variations due to the ordinary noises (such as back pattern, source line potential variation and so on). As a result, data read margins M1 and M2 are lessened.

As described above, as the cell pitch of the memory cell array is miniaturized more, the capacitive coupling between floating gates becomes larger so that data threshold voltages are varied, and it leads to reduction of data read margins. This becomes especially a large problem in a case that a multi-value data storage scheme is used. If the cell's miniaturization is further made progress, it becomes impossible to ignore the problem also in a case that a binary data storage scheme is used.

In the embodiments described bellow, it is used data write schemes for suppressing data variations due to the above-described FG-FG capacitances in the NAND-type flash memory.

Figure 2:
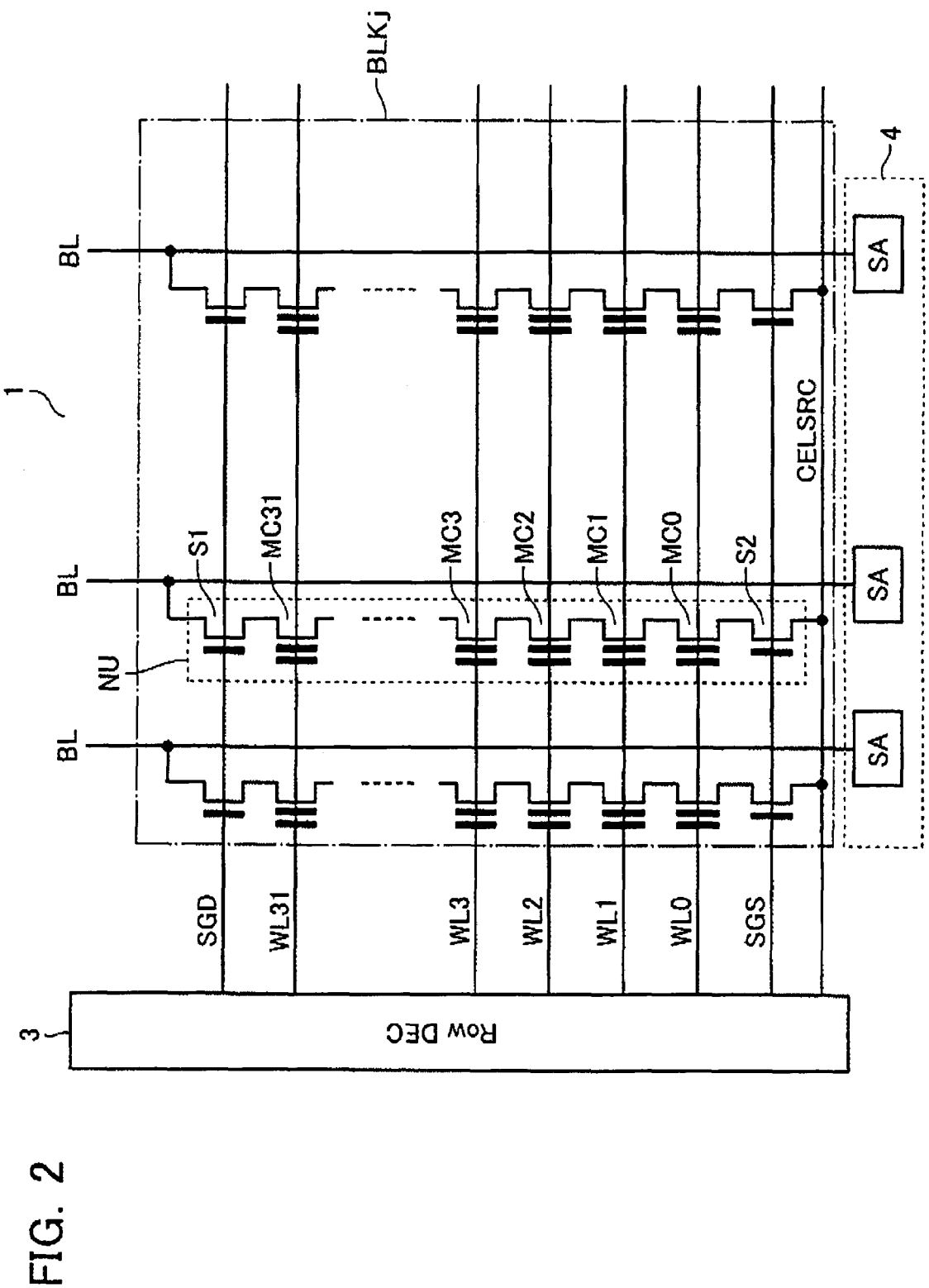
FIG. 2 shows the memory cell array and sense amplifier circuit of the flash memory.

FIG. 1 shows a functional block diagram of a NAND-type flash memory. The memory cell array 1 is, as shown in FIG. 2, formed of NAND cell units NU arranged in a matrix manner. Each NAND cell unit NU is constituted by electrically rewritable and non-volatile memory cells, thirty-two cells in this case, M0-M31 connected in series, and select gate transistors S1 and S2 for connecting both ends thereof to bit line BL and source line SL, respectively.

Control gates of the memory cells M0-M31 in a NAND cell unit NU are coupled to different word lines WL0-WL31, respectively. Gates of the select gate transistors S1 and S2 are coupled to select gate lines SGD and SGS, respectively.

A set of plural NAND cell units sharing a word line constitutes a block BLKj serving as a unit of data erase. Only one block BLKj is typically shown in FIG. 2, but it is usually disposed plural blocks in the direction of the bit line BL.

A row decoder 3 is disposed to selectively drive word lines and select gate lines; and a column decoder 2 to select bit lines. A sense amplifier 3 is disposed to be connected to bit lines for reading data and serving as a data latch for holding read/write data.

At a data read time, the read data in the sense amplifier circuit 4 are transferred via a data bus 9 and I/O buffer 6 to be output to the external I/O terminals I/O. At a data write time, write data are supplied to the I/O terminals from the external controller 11, and transferred via the I/0 buffer 6 and data bus 9 to be loaded in the sense amplifier circuit 4.

Command supplied via I/O terminals is decoded in an internal controller 5, and address supplied via I/O terminals is transferred to the row decoder 3 and column decoder 2 via an address resister 7. The internal controller 5 executes data write and erase sequence controls and a data read control in response to external control signals and commands.

A status register 8 is prepared to output a status signal R/B to exterior, which designates whether the chip is in a ready state for data reading or writing or in a busy state. For generating various voltages higher than a power supply voltage in accordance with operation modes, there is provided a high voltage generation circuit 10, which is controlled with the controller 5.

FIG. 2 shows a case where sense amplifiers SA are disposed for every bit line BL. According to this arrangement, in case binary data storage scheme is used, a set of memory cells arranged along a word line constitutes a page, which serves as a unit of data write and read. In case four-value data storage scheme is used, the set of memory cells arranged along a word line constitute two pages.

Figure 3:
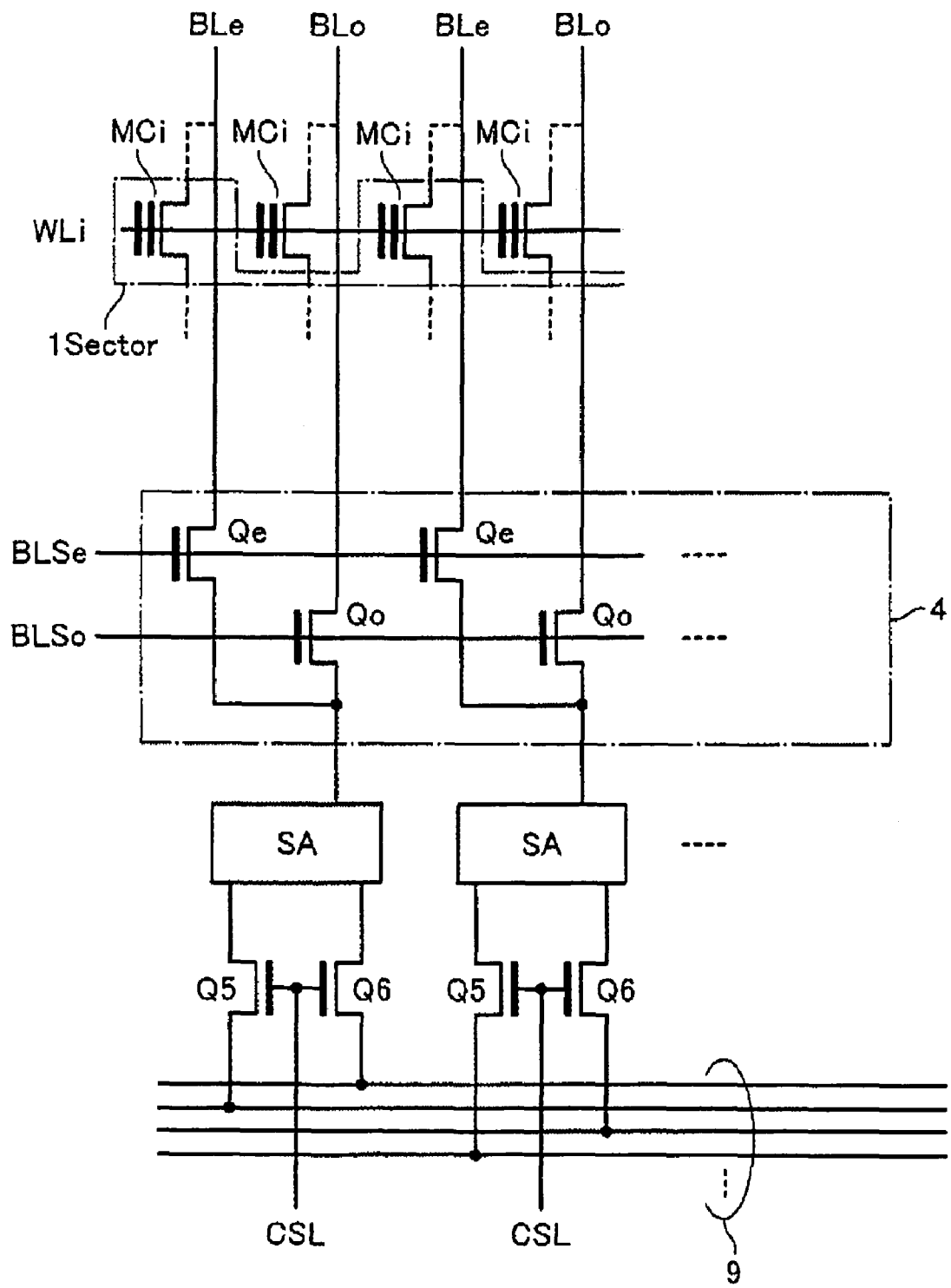
FIG. 3 shows a relationship between the bit lines and sense amplifiers in a state where a shared sense amplifier scheme is used.

However, in case the memory cell array 1 is more miniaturized, it becomes not only difficult to arrange the sense amplifiers for the respective bit line pitches one by one but also impossible to ignore the influences of noises between adjacent cells. By this reason, as shown in FIG. 3, it is usually used such a shared sense amplifier scheme that adjacent two bit lines, even-numbered bit line BLe and odd-numbered bit line BLo, share a sense amplifier SA. In this scheme, bit line select transistors Qe and Qo are disposed between the even/odd bit lines BLe/BLo and sense amplifier SA, and one of even/odd bit lines BLe/BLo is selectively coupled to the sense amplifier SA, while the other serves as a shield line.

In case the shared sense amplifier scheme shown in FIG. 3 is utilized, a set of memory cells arranged along a word line is divided into two sectors. That is, memory cells disposed at crossings between a word line WLi and even bit lines BLe constitute one sector; and memory cells disposed at crossings between the word line WLi and odd bit lines BLo constitute the other sector. In case of binary data storage, each sector serves as a page; and in case of four-value data storage, one sector serves as two pages (i.e., upper page and lower page).

Figure 4:
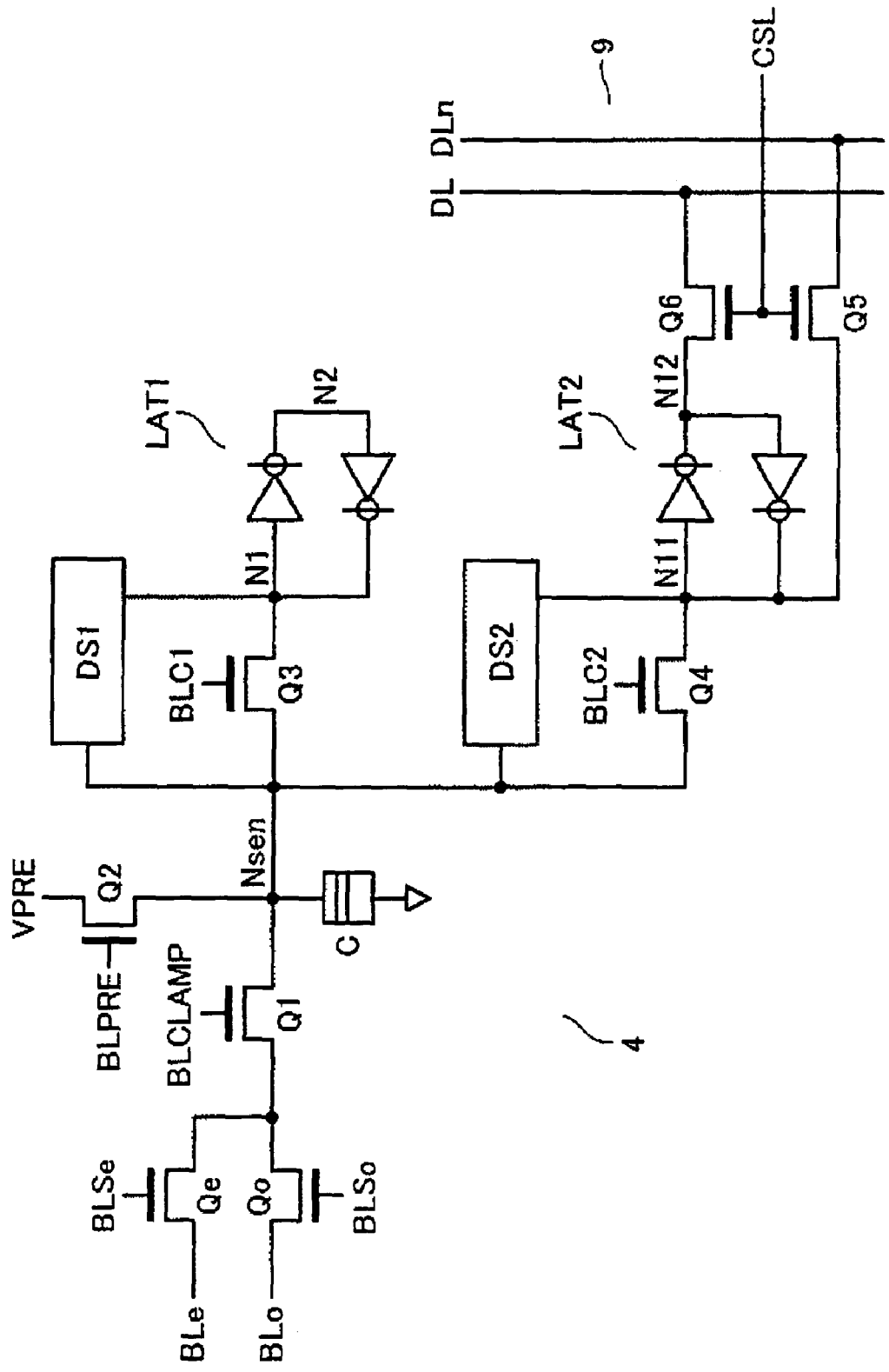
FIG. 4 shows a sense amplifier unit configuration in the sense amplifier circuit of the flash memory.

FIG. 4 shows a sense unit, which is connected to a pair of bit lines BLe and BLo, in the sense amplifier circuit 4. A sense node Nsen is selectively coupled to one of bit lines BLe and BLo via a clamping NMOS transistor Q1 and bit line select transistor Qe or Qo. The clamping transistor Q1 serves for clamping the bit line voltage and serves as a pre-sense amplifier for detecting bit line voltage.

Connected to the sense node Nsen is a precharging NMOS transistor Q2, which serves for precharging the bit line and sense node Nsen to a certain voltage.

The sense node Nsen is connected to two data storage circuits (data latches) LAT1 and LAT2 via transferring transistors Q3 and Q4, respectively. These data latches LAT1 and LAT2 are adaptively used in accordance with operation modes. For example, data latch LAT2 serves as a data cache for transmitting/receiving read and write data between itself and the external terminals I/O. For this purpose, data nodes N11 and N12 of this data latch LAT2 are coupled to data lines DLn and DL via column gate transistors Q5 and Q6. With this configuration, one page read/write data are serially transferred column by column (i.e., by 8 bits or 16 bits) between the sense amplifier circuit 4 and the external I/O terminals.

At a data write time, write data is loaded in the data latch LAT2 and then transferred to and held in the data latch LAT1. Data write is performed with plural write cycles each defined by write voltage application and the following write-verify for verifying a write state.

In each write cycle, write-verify is performed for every bit, and write data in the following write cycle is determined. For this purpose, a data storage circuit DS1 is disposed between the data latch LAT1 and sense node Nsen for temporarily storing a write data.

Data write will be explained in brief bellow. Write data is set in the data latch LAT1 as follows: "0" write data is set as N1="L" for letting the cell threshold voltage be increased in the positive direction; and "1" write data (i.e., write-inhibiting) is set as N1="H" for letting the cell threshold voltage be kept as being negative (i.e., erased state).

At a write-verify read time, a "verify-voltage", which corresponds to the lowest value of the data threshold voltage distribution to be verified, is applied to a selected word line, and it is detected whether the precharged bit line is discharged or not by a selected memory cell. "0" write cell is not turned on with the verify-voltage application, so that the bit line will not be discharged. This data state is read as Nsen="H", and hereinafter write data is set to be "1" data (write-inhibiting). By contrast, "0" write is incomplete, or "1" write is performed, the memory cell turns on, thereby discharging the bit line. As a result, the sense amplifier senses it as "L" data. Therefore, in the following write cycle, "1" write data is written back to the data latch LAT1 as "H" data again based on the write data held in the data storage circuit DS1.

When the entire "0" write data in a selected page have been sufficiently written, all nodes N1 of data latches LAT1 in a page become "H" (all "1" state). One page write completion may be judged by detecting this all "1" state of the data latches LAT1. There is not shown the verify-judging circuit in FIG. 4.

In the example shown in FIG. 4, another data storage circuit DS2 Is disposed at the data latch LAT2, but it is not always necessary. In a four-value data storage scheme, it is required to do lower page write and upper gage write. Further, in the upper page write, it is necessary to perform write-verify with different verify conditions for verifying two data states. In addition, in the upper page write sequence, it is required to perform the write-verify with reference to the lower page data which has already been written. For this purpose, it is required of the data latch LAT2 to hold the lower page data read out of the memory cell array during the upper page write time.

Figure 5:
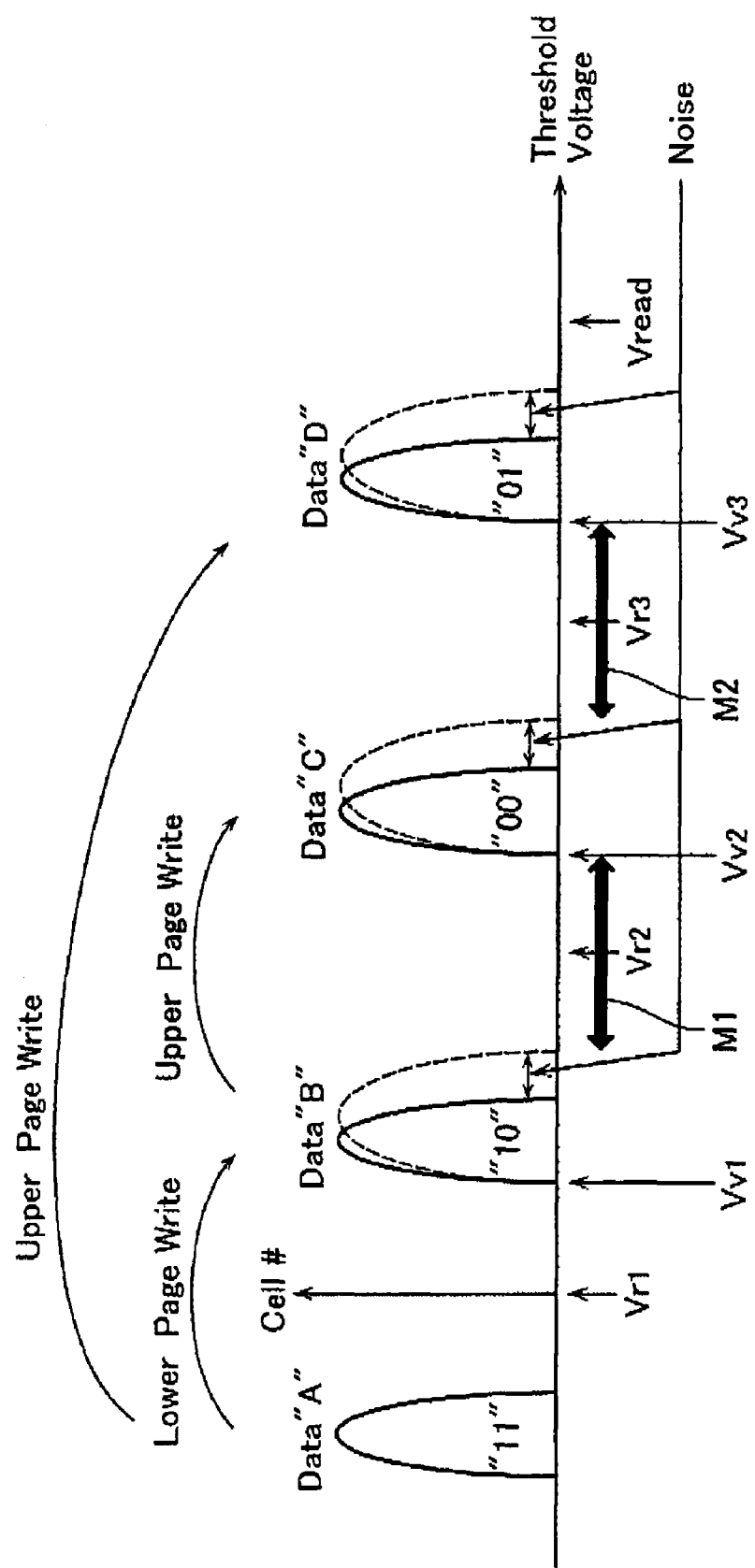
FIG. 5 shows data threshold distributions in a four-value data storage scheme.

FIG. 5 shows an example of data threshold distributions in case a four-value data storage scheme is used. The four-value data A, B, C and D are defined in order of threshold voltage. Supposing that the four-value data is defined as "xy", where "x" and "y" are upper and lower page data, respectively, data bits are assigned as follows: A=11, B=10, C=00 and D=10. Data "A" is an erased state with the lowest threshold voltage (i.e., negative threshold voltage).

Data erase is performed by a block as follows. 0V is applied to the entire word lines in a selected block; and erase voltage Vera (e.g., 20V) is to a p-type well on which the cell array is formed. Wit this voltage application, the entire memory cells in the selected block are set to be in a negative threshold voltage state (i.e., data "A") as a result of that electrons of these floating gates are released.

As shown in FIG. 5, data write is performed with lower page write and upper page write. The lower page write is defined as an operation for selectively changing cell(s) with data "A" to a state of data "B". Write data to be loaded in the data latch LAT1 is "0" (when data "B" is to be written) or "1" (when data "A" is to be kept, i.e., write-inhibiting). In accordance with this write data "0" and "1". NAND cell channels are set at Vss and Vdd-Vt (Vt; threshold voltage of the select gate transistor), respectively, via bit lines. When write voltage Vpgm is applied to a selected word line, electron injection occurs at cell(s) with "0" data applied, and electron injection does not occur at cell(s) with "1" data applied. Based on such the operations, it is able to selectively make cell(s) boosted in threshold voltage in a selected page.

At a write-verify step in each write cycle, verify-voltage Vv1 is used, which is set to be equal to the lowest value of the threshold distribution of data "B".

The upper page write includes a first upper page write mode that selectively changes cell(s) with data "B" to have data "C", and a second upper page write mode that selectively changes cell(s) with data "A" to have data "D". These two types of upper page write modes are performed in such a sequence that common write voltage application is performed for a selected page with selectively applying "0" and "1" data. That is, first and second upper page write modes are simultaneously performed as "0" write operations.

Note here that since different verify-voltages are necessary for the two types of upper page write modes, it is required to do different write-verify steps as follows: verify-voltage Vv2 is used for the first upper page write; and verify-voltage Vv3 for the second upper page write.

At the write-verify step of the first write-verify, it is necessary for verifying only data "C" write state, excluding data "D" from the verify target. For this purpose, lower page data is referred, which has already been written. In detail, prior to upper page write, lower page data "A" and "B" are read out as data "1" and "0", respectively, with applying read voltage Vr1 to a selected word line, and loaded in the data latch LAT2. Although the detailed explanation is omitted, data "D" may be excluded from the verify target at the first upper page write-verify by the aid of the data held in the latch LAT2.

At the second upper page write with the verify-voltage Vv3, it is possible to verify "D" write state without reference to the lower page data because data "C" is read out as "1" data.

For reading data, it is necessary to perform one upper page read operation and two lower page read operations. Initially, upper page read is performed with a read voltage Vr2 that is set between data "B" and "C" threshold voltage distributions. At this time, data "A" or "B", upper page data "X" of which is "1", is read out as data "1", while data "C" or "D", upper page data of which is "0", is read out as data "0".

Following it a first lower page read operation with read voltage Vr1 that is set between data "A" and "B" threshold voltage distributions, and a second lower page read operation with read voltage Vr3 that is set between data "C" and "D" threshold voltage distributions are sequentially performed. As a result, it is able to distinguish between data "A" and "B", and between data "C" and "D".

Note here that the above-described read voltages Vr1-Vr3 used at data read times are ones applied to the selected word line. Applied to non-selected word lines and select gate lines is a read pass voltage Vread as shown in FIG. 5, which is set to be higher than the uppermost value of the entire data threshold voltage distributions. With applying this pass voltage, it is possible to turn on non-selected memory cells without regard to cell data, thereby making it possible to detect whether bit line current flows or not in response to cell's data under the selected word line so as to judge data.

So far, a NAND-type flash memory and basic operations thereof have been described. In a practical data write in accordance with this embodiment, some write schemes are used, which may suppress data variations due to capacitive coupling between floating gates of adjacent cells. Such the write schemes will be described in detail bellow.

[First Write Scheme]

A first write scheme is defined as including the steps of: performing a first data write operation for selectively writing a threshold voltage state lower than a desired threshold voltage into a first set of memory cells arranged along a first word line; then performing a second data writing operation for selectively writing data into a second set of memory cells arranged along a second word line adjacent to the first word line; and then performing a third data writing operation (i.e., finishing write operation) for writing the desired threshold voltage state into the first set of memory cells with the same data pattern as in the first data write operation.

It will be explained in detail such a case that data "B" defined as a positive threshold voltage state is selectively written into a set of memory cells with data "A" (i.e., erased state) defined as a negative threshold voltage state. This corresponds to lower page write in the above-described four-value data storage scheme, but it may also be adapted to upper page write. Further, this may be adapted to a binary data storage scheme as it is on the assumption of: "A"="1"; and "B"="0".

Figure 6:
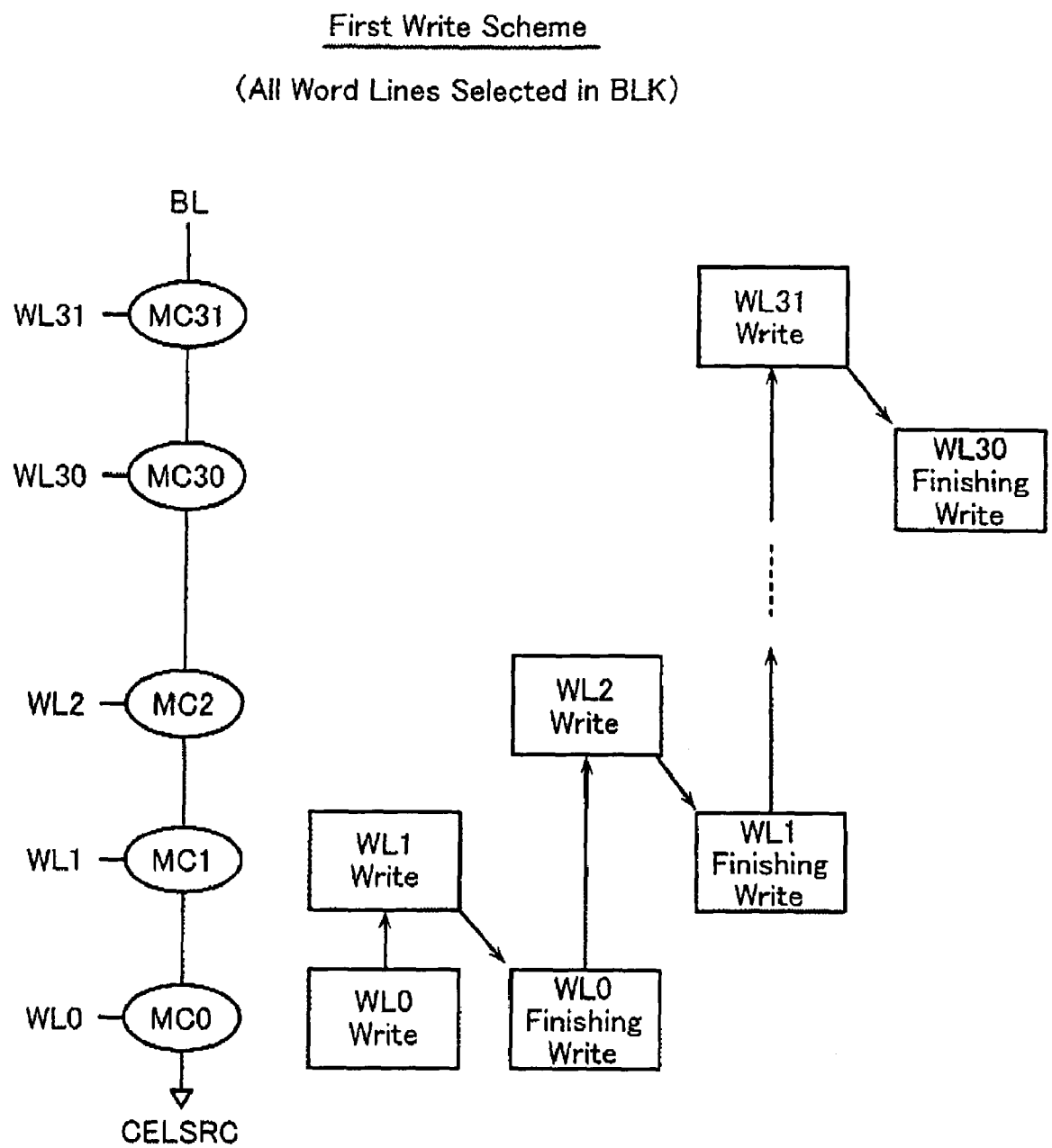
FIG. 6 shows a write order in a case that the entire word lines are selected in a selected block in accordance with a first write scheme of an embodiment.

FIG. 6 shows a write order of an example, to which the first write scheme is adapted. In this example, data write is performed in order of: from a word line WL0 nearest to the common source line (CELSRC) contact toward the final word line WL31 nearest to the bit line (BL) contact in a selected block.

First, data write is performed for a set of memory cells arranged along word line WL0. This data write is so-called a "preliminary write" for selectively writing a threshold voltage state lower than a desired threshold voltage with a certain value, which corresponds to a threshold voltage variation due to data written later into adjacent cells. Next, data write (this also is a preliminary write) is performed for a set of memory cells arranged along next word line WL1. Then, a finishing write (i.e., additional write) is performed for aiming to selectively write the desired threshold voltage state into the set of memory cells arranged along the word line WL0.

Thereafter, a preliminary data write is performed for memory cells along word line WL2, and then a finishing data write is performed for memory cells along the word line WL1. Following this it will be repeated similar write operations.

FIGS. 7 to 10 show, referring to adjacent two word lines WLi and WLi+1, an example of threshold variations in three memory cells (MCi,0-MCi,2) and three memory cells (MCi+1,0-MCi+1,2) disposed on the word lines WLi and WLi+1, respectively, into which data "B" is selectively written.

Figure 7:
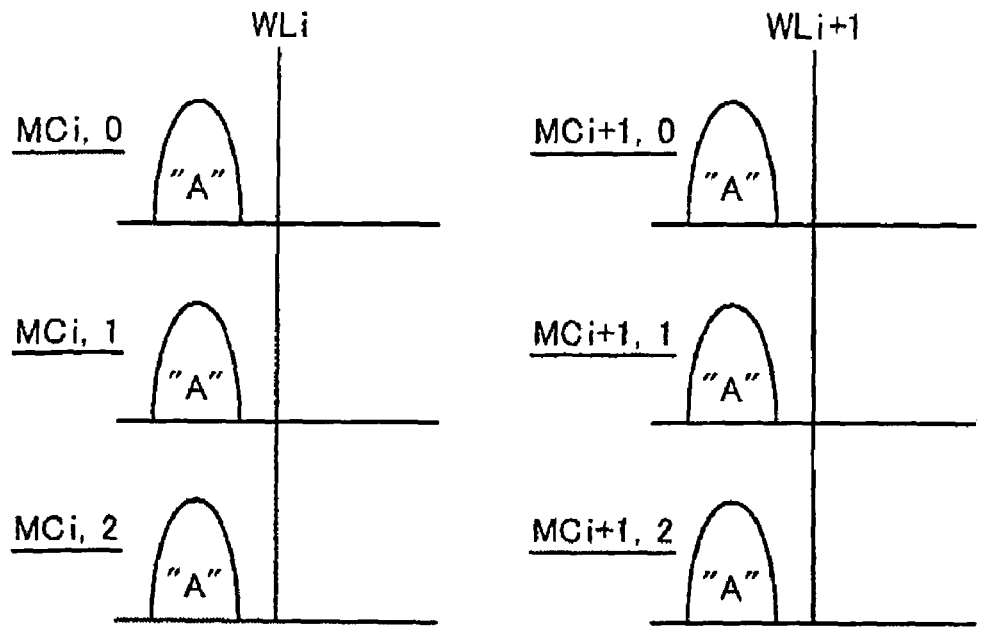
FIG. 7 shows an initial data state of 3×3 memory cells for explaining the first write scheme.
Figure 8:
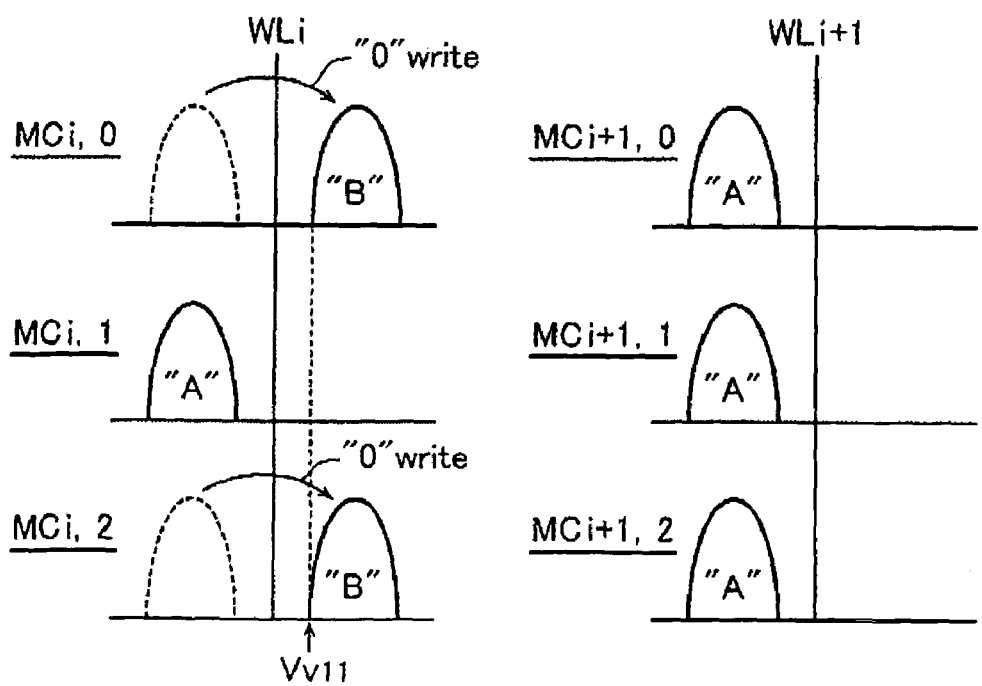
FIG. 8 shows data state variations due to data write in the word line WLi in accordance with the first write scheme.

FIG. 7 shows an initial state, where the entire memory cells are set in the erased state (i.e., data "A" state) in a selected block. FIG. 8 shows a first write state for the word line WLi. At this write time, a verify-read voltage Vv11, which is lower than the lowest value of a desired threshold voltage distribution of data "B", is used in consideration of data threshold voltage variations in future. This example shows a case that data "B" is written into memory cells MCi,0 and MCi,2 with applying write data "0". At this write time, the entire memory cells along the word line WLi+1 are held in a data "A" state.

Figure 9:
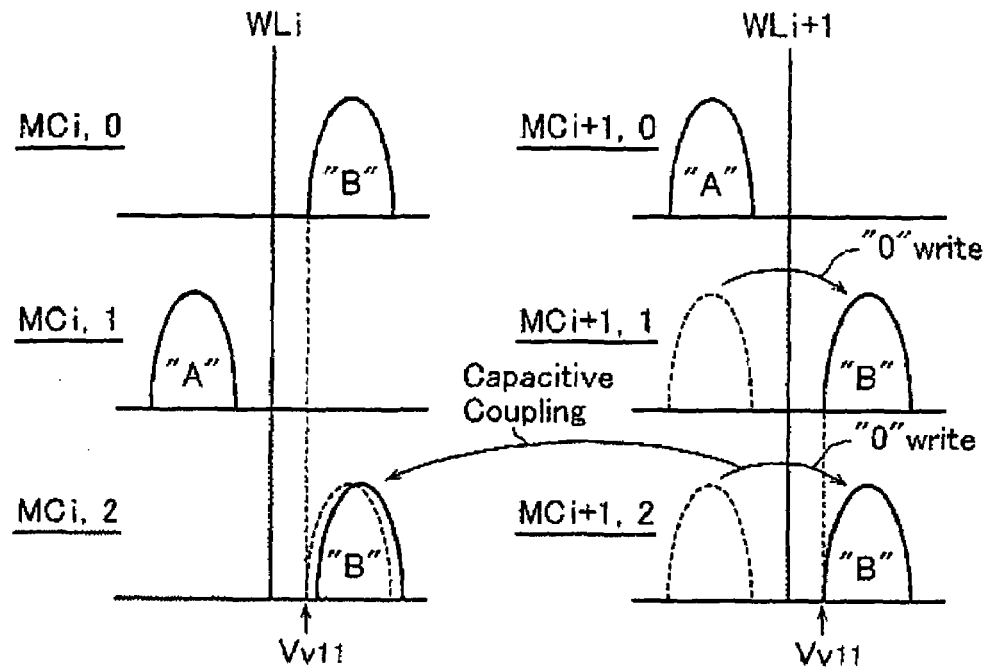
FIG. 9 shows data state variations due to data write in the word line WLi+1 in accordance with the first write scheme.

FIG. 9 shows a first write for the next word line WLi+1. In this example, write data "0" is applied to the memory cells MCi+1,1 and MCi+1,2, and data "B" is written into them. At this write time, verify-voltage Vv11 is used as well as in FIG. 8.

As a result of this data write for the word line WLi+1, the threshold voltage of the memory cell MCi,2, into which data "B" has already been written, will be shifted in the positive direction as shown by a dotted line due to capacitive coupling between adjacent floating gates because data "B" is written into the adjacent memory cell MCi+1,2. For the memory cell MCi,0, there is no data threshold shift because the adjacent memory cell MCi+1,0 is held in the data "A" state as it is. Written Into the memory cell MCi,1 is data "A". Therefore, even if the adjacent memory cell MCi+1,1 becomes to store data "B", it may be ignored the data threshold variation of this memory cell MCi,1.

Figure 10:
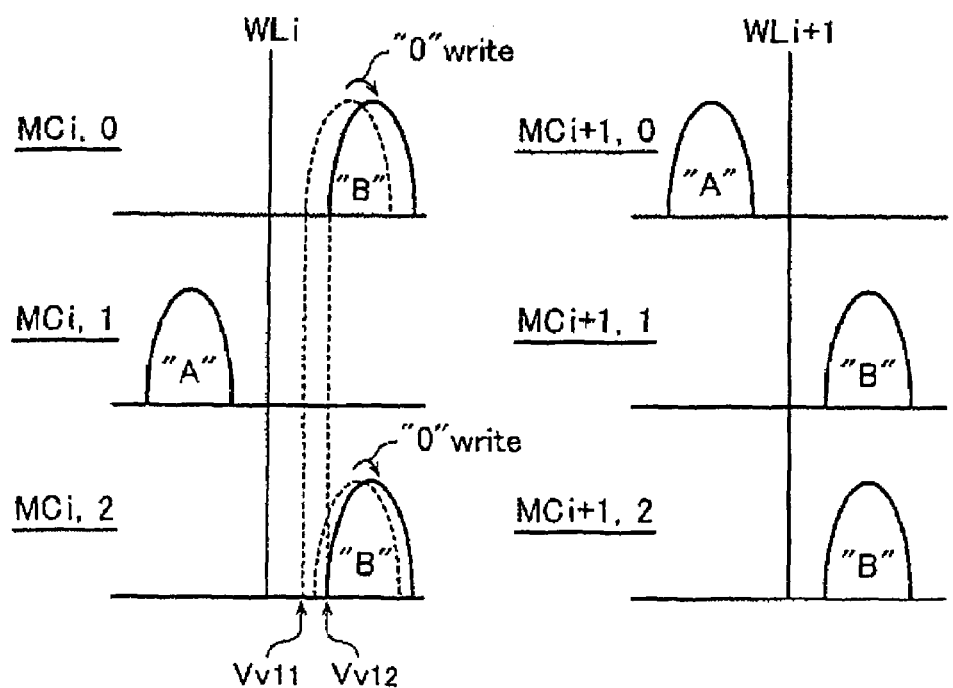
FIG. 10 shows data state variations due to finishing data write in the word line WLi in accordance with the first write scheme.

Thereafter return to the word line WLi, as shown in FIG. 10, and perform finishing write for it with the same data pattern as the first data write time and with verify-voltage Vv12 set at the lowest value of the desired threshold distribution of data "B". As a result, it is possible to reduce threshold voltage variations of data "B" written into the memory cells MCi,0 and MCi,2, which have been generated under the influence of the memory cells on the word line WLi+1.

Note that the final word line WL31 has no word line which is to be written after this. Therefore, data write for this final word line is performed only one time with the verify-voltage Vv12 equal to the lowest value of the desired threshold voltage distribution.

Figure 11:
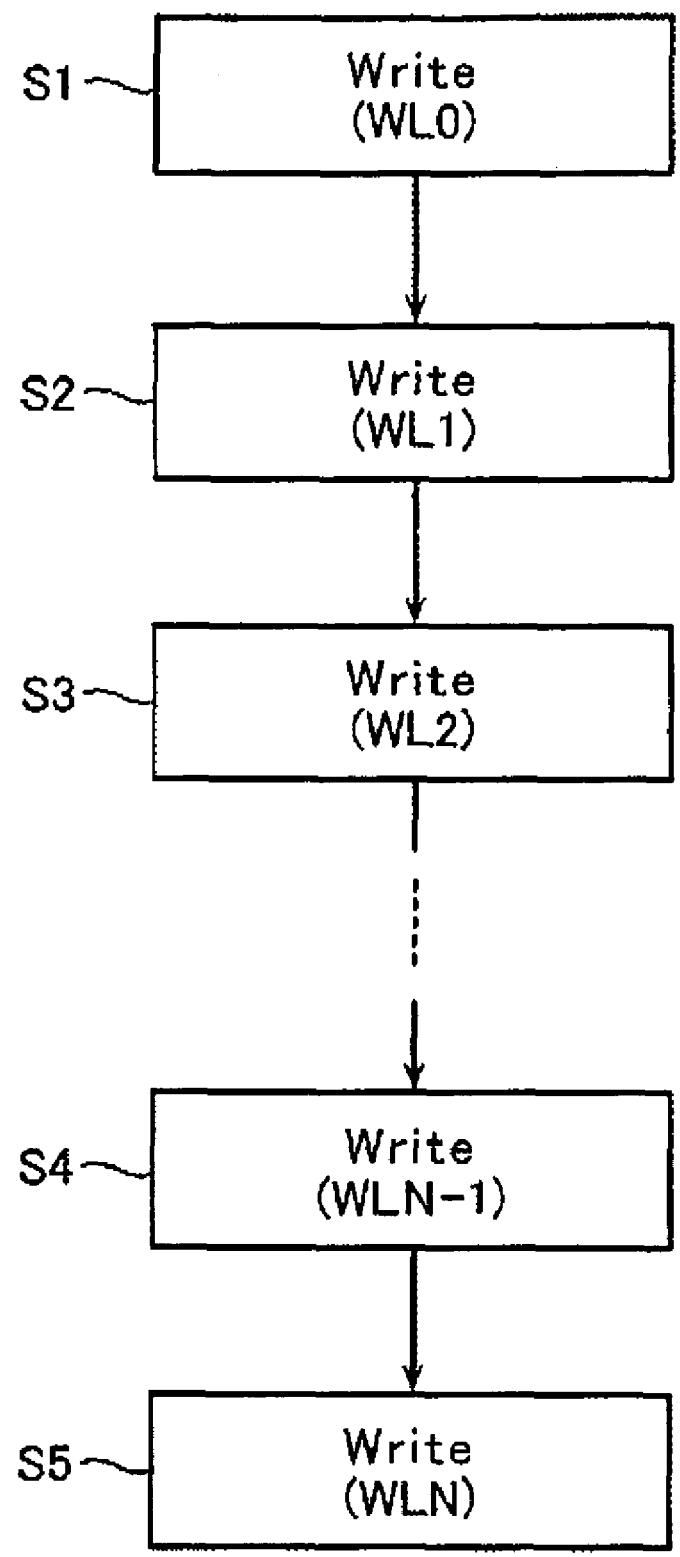
FIG. 11 shows a write operation flow in the first write scheme.

FIG. 11 shows a basic data write sequence for sequentially selecting word lines to write data for a write area defined as a range of word lines WL0-N. The data write for each word line will be automatically performed under the control of the internal controller in response to write command input, address input, write data load and write-start command input. In the write sequence for each word line, finishing write is performed for the preceding word line.

Figure 12:
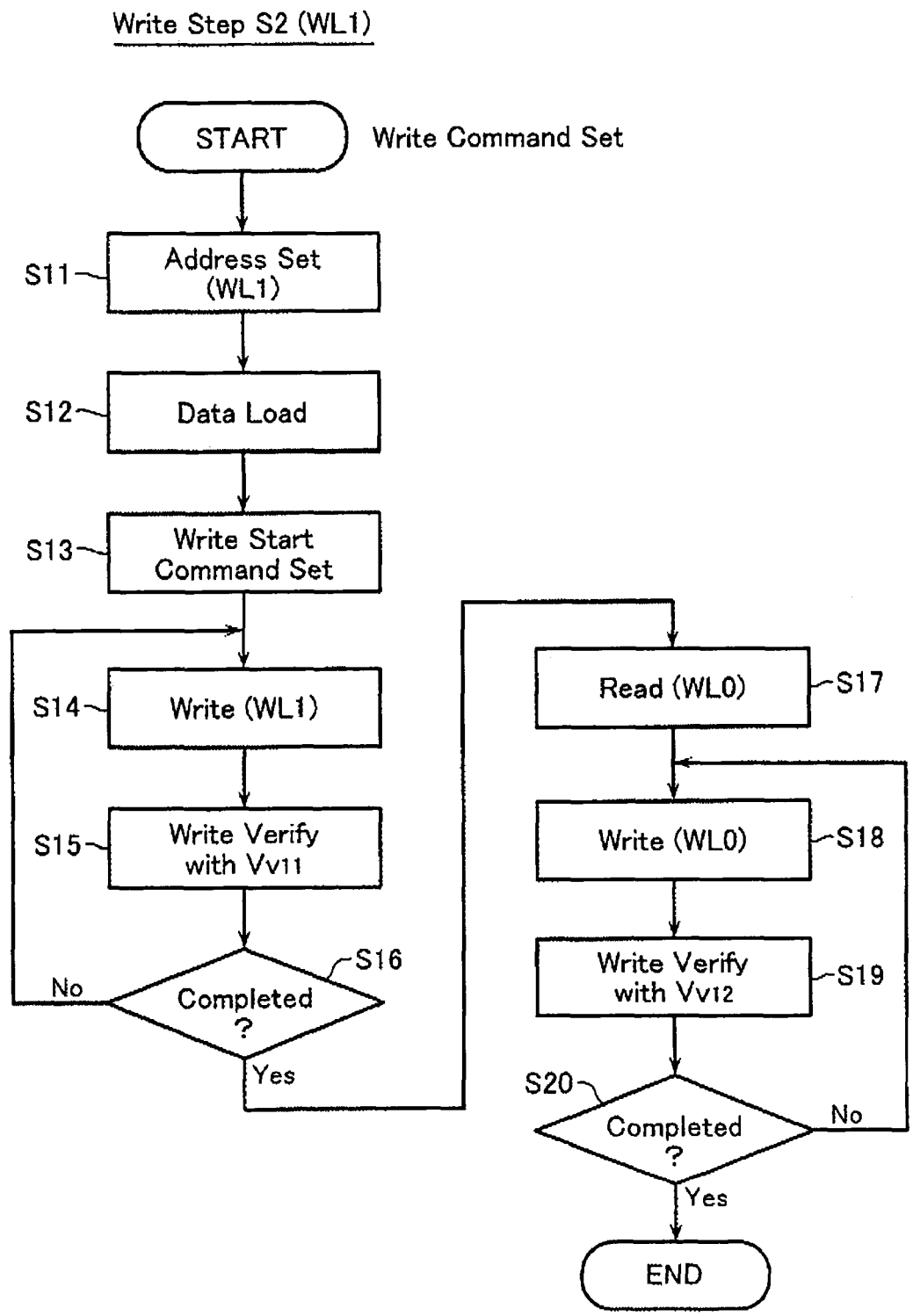
FIG. 12 shows a write sequence of the write step S2 in FIG. 11.

FIG. 12 shows a detailed sequence of the data write step S2 for word line WL1 in FIG. 11. Input write command, and this write sequence starts. In response to address input (step S11), write data load (step S12), and write-start command input (step S13), the controller 5 starts to control the write sequence.

Data write is performed by repeat of write voltage application (step S14) and write-verify (step S15). At this time, verify-voltage Vv11 is used. At the step S16 for judging write completion, it is judged whether data latches LAT1 have become all "1" state or not.

Following the write completion judgment, write data of the preceding word line WL0 are read out the memory cell array and held in the data latches LAT1 as write data (step S17). Thereafter, the finishing write for the memory cells on the word line WL0 is preformed (step S18).

The page address of the finishing data writing for this word line WL0 may be generated by address decrement in the chip. Alternatively, it is also possible to input the page address with another write command. Further, it is also possible to input command, address and write data again from the external in place of the data read operation of the step S17, and perform the finishing write.

At the write-verify step S19, verify-voltage Vv12 is used. This finishing write also is performed by repeat of write voltage application (step S18) and write-verify (step S19) until write completion is detected at the write completion judgment step S20.

Figure 50:
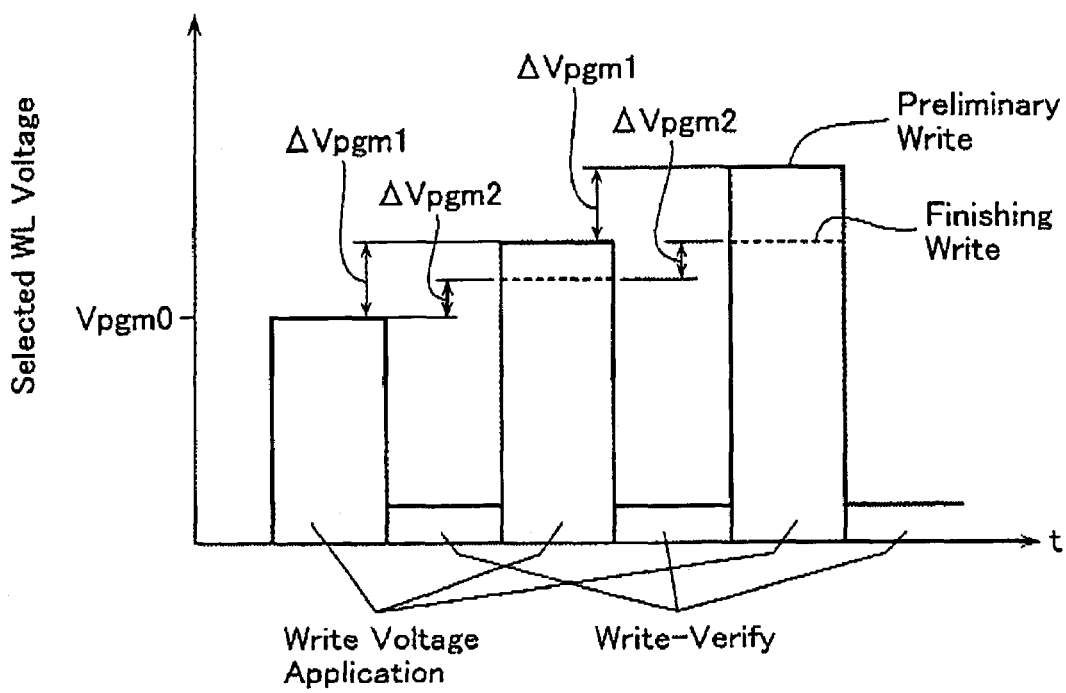
FIG. 50 shows write voltage changes in preliminary write operations and finishing write operations.

Write voltages are usually boosted in accordance with write cycle increase. FIG. 50 shows write voltage changes in this embodiment. Supposing that the amount of threshold voltage change in the finishing write step (step S18) is set to be less than that in the preliminary write step (step S14), it is desired that, as shown in FIG. 50, the write voltage step-up "Δpgm2" in the finishing write cycles is set to be lower than the write voltage step-up "Δpgm1" in the preliminary write cycles. By use of these write voltages, it becomes possible to high-precisely control the threshold voltage distributions.

Note here that only the write step S1 for the head word line WL0 shown in FIG. 11 will be performed with the steps S11-S16. In each write sequence for the remaining word lines except this write step S1 for the head word line WL0, finishing write is performed for the preceding word line as well as the above-described write sequence for the word line WL1. Data write for the memory cells on the final word line is different from those of other word lines, in which verify-voltage Vv12 is used at the write-verify step S15.

By use of the above-described write scheme, it becomes possible to reduce the data threshold voltage variations due to capacitive coupling between floating gates of adjacent cells, thereby becoming possible to do data write with improved data reliability. For example, in the four-value data storage scheme, data threshold voltage variations are defined only by the ordinary noises (such as back pattern, source line potential variation and the like) as shown by dotted lines in FIG. 5. Therefore, the data read margins M1 and M2 between data "B", "C" and "D" may be secured to be larger than those in the case shown in FIG. 48.

Although the above-described first write scheme is performed with preliminary write and finishing write, the preliminary write is performed with a threshold voltage target which is lower than the desired threshold voltage by a certain value, which corresponds to a threshold voltage variation due to data written later into adjacent cells. Therefore, the data write time may become shorter than that of the ordinary data write. In addition, the finishing write may also be done within a short time because the threshold voltage variation is small. As a result, although it is necessary to do data write with two steps, the total write time will not become so long as the ordinary data write scheme.

Figure 13:
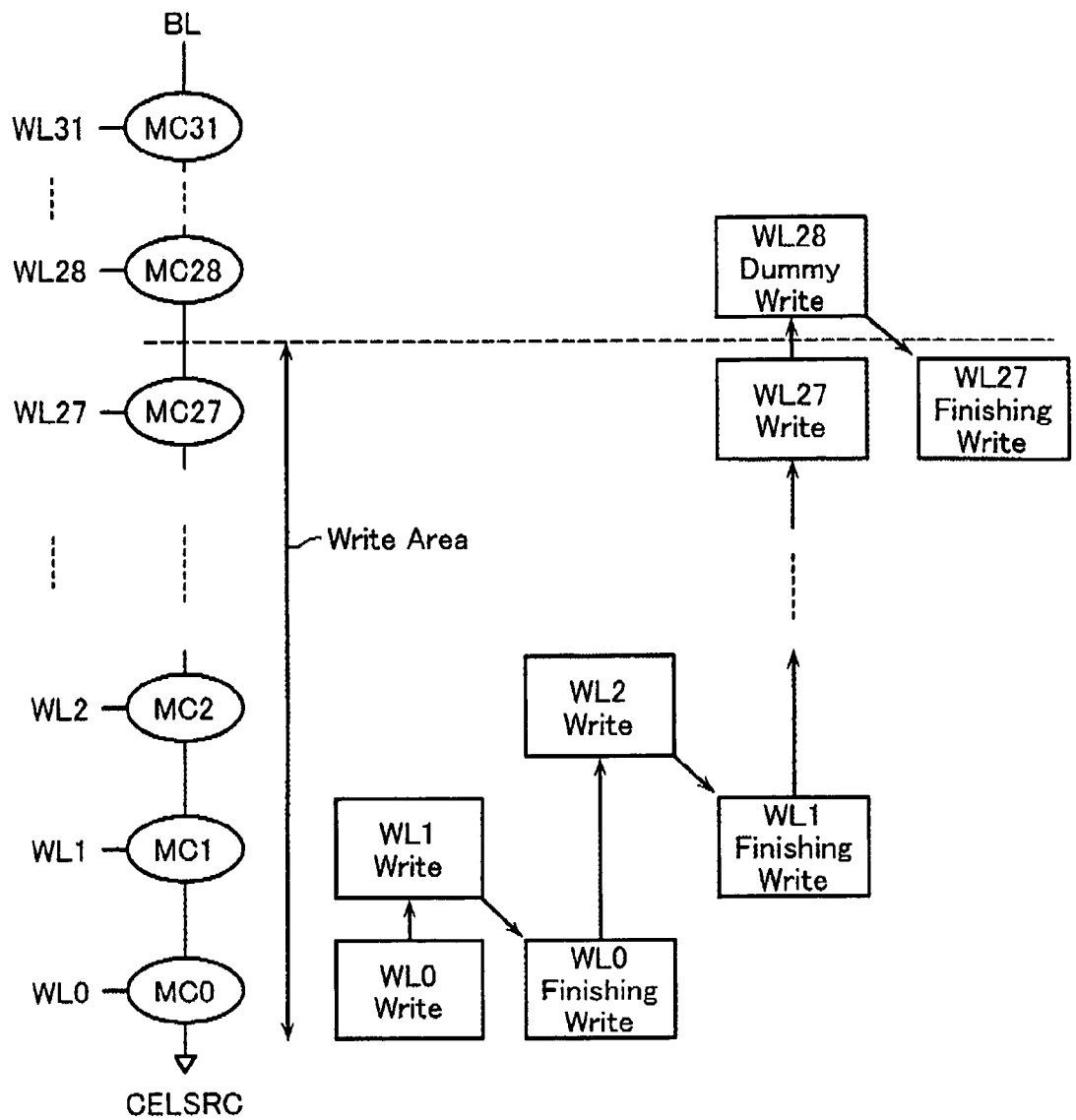
FIG. 13 shows a write order in a case that a specified area is selected in a selected block in accordance with the first write scheme.

FIG. 13 shows a data write order of another case in accordance with the above-described first write scheme, corresponding to FIG. 6, in which a specified range of word lines is selected as a "write area" in a selected block. In this case, dummy data write is performed for word line WL28 disposed adjacent to and outside of the write area, and then finishing write is performed for word line WL27.

Dummy data pattern is, for example, all "0" data, repeated data pattern of "1" and "0" or the like. Since the data on the word line WL27 is influenced by this dummy data write on the word line WL28, finishing write is performed for the word line WL27.

Note here that word line WL28, on which dummy data is written, becomes an idle area. Therefore, a range of word lines WL29-WL31 serves as a remaining write area, into which effective data may be written. Alternatively, it is useful for letting the word line WL28 be remained as an erased state of all "1" as it is, thereby serving it as an idle area. In this case, with respect to the final word line WL27 in the write area, only the data write with verify-voltage Vv12, which is set to be equal to the lowest value of the desired threshold voltage distribution, is performed as well as the final word line WL31 in the case shown in FIG. 6.

Although, in the above-described example, finishing write for the preceding word line is performed with address decrement in a write sequence for a currently selected word line, the present invention is not limited to this. For example, the finishing write may be performed under the control of independent command input. Further, it is not limited to such a manner that finishing write is performed for the preceding word line after having written for a word line. For example, it is useful for doing finishing write, after having written sequentially for plural word lines, for a word line previous to the plural word lines.

[Second Write Scheme]

A second write scheme is a variation of the first write scheme. The second write scheme is defined as including: sequentially selecting word lines in an area with plural word lines disposed sequentially and performing data write (i.e., preliminary data write) into the respective sets of memory cells with certain data patterns, respectively, together with write-verify using a first verify-voltage lower than a desired threshold voltage; and thereafter sequentially selecting the word lines in the area again and performing data write (i.e., finishing data write or additional write) into the respective sets of memory cells with the certain data patterns, respectively, together with write-verify using a second verify-voltage equal to the desired threshold voltage.

Figure 14:
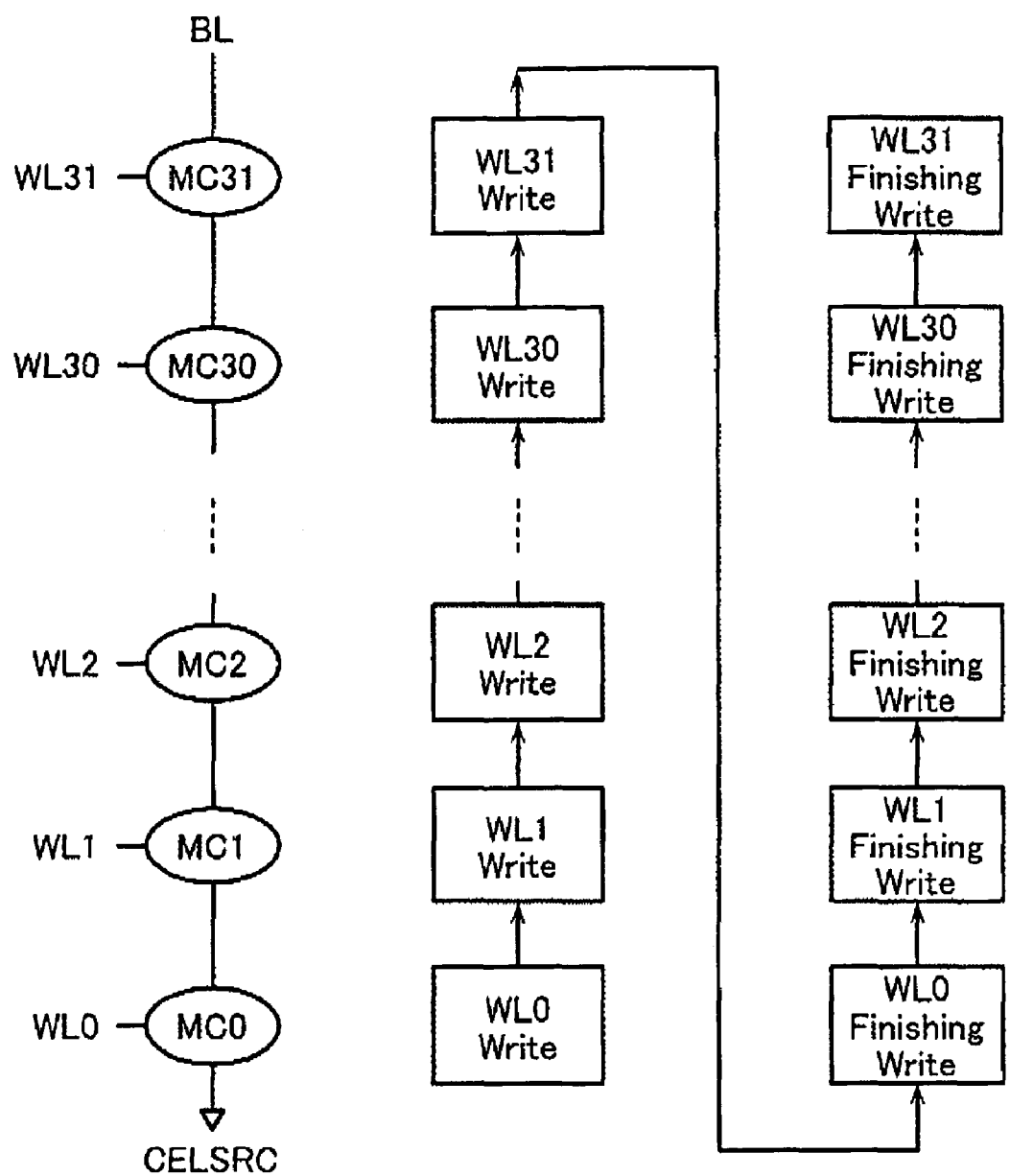
FIG. 14 shows a write order in a second write scheme.

FIG. 14 shows a data write order in accordance with the second write scheme. Suppose that data write is performed for a range of the entire word lines WL0-WL31 in a selected block as sequentially from the word line WL0 nearest to the common source line CELSRC. First, data write is performed for the word lines WL0-WL31 in this order with write-verify using verify-voltage Vv11, which is set to be lower than the lowest value of a desired threshold voltage distribution, as well as in FIG. 8. The write sequence for each word line is defined by the steps S11 to S16 shown in FIG. 12, and it ends by detecting write completion at the step S16.

Then, return back to the word line WL0, and perform finishing write for the word lines WL0-WL31 in this order with write-verify using verify-voltage Vv12, which is set to be equal to the lowest value of the desired threshold voltage distribution.

Figure 15:
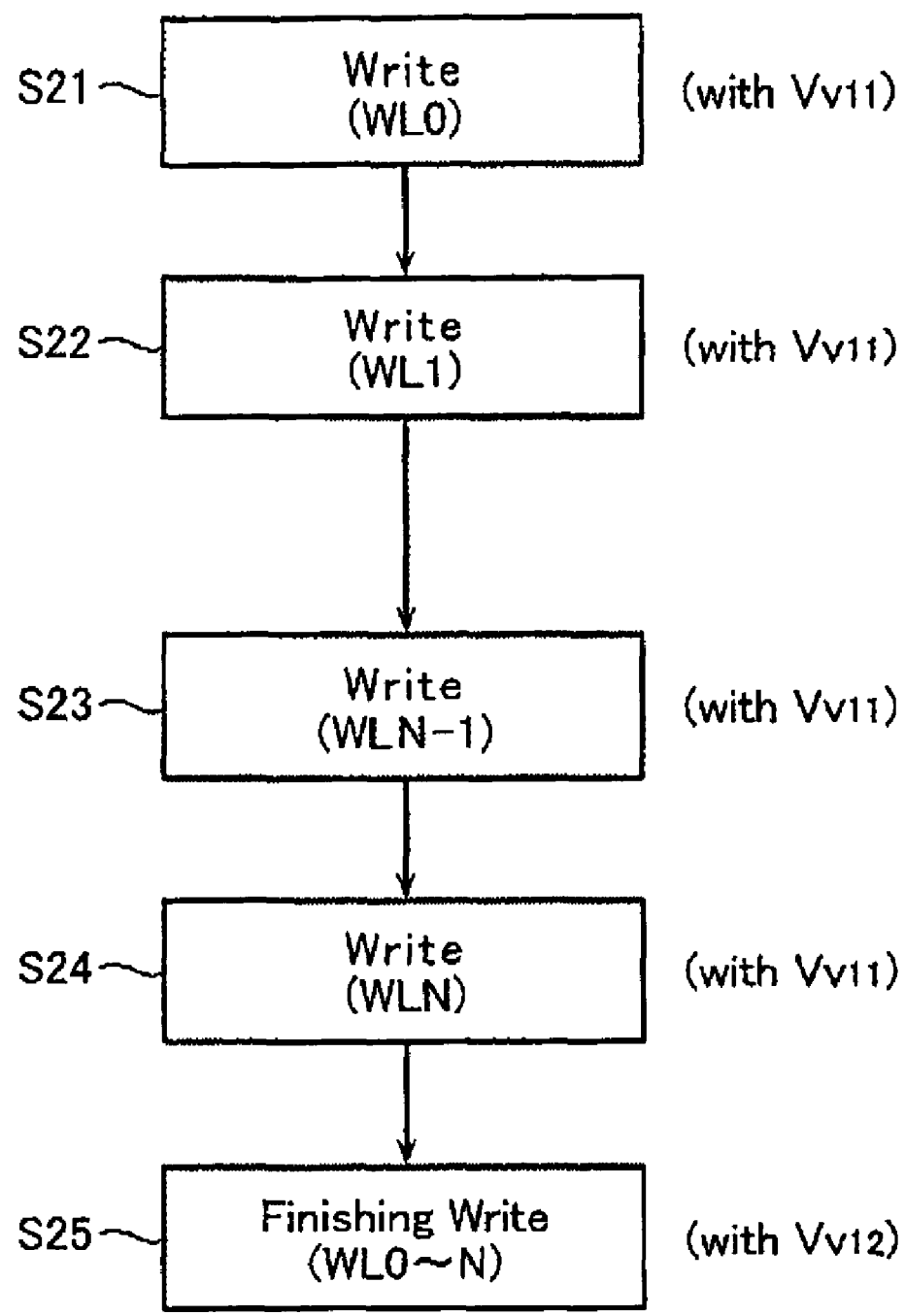
FIG. 15 shows a write operation flow in the second write scheme.

FIG. 15 shows a write sequence in a case that the second write scheme is adapted for a write area defined by word lines WL0-N. At each of the first write steps S21 to S24 for the range of word lines WL0-N, verify-voltage Vv11 is used. At the step S25, finishing write operations are performed for the entire word lines WL0-N with verify-voltage Vv12.

Note here that in case the final word line WLN in the write area is not the final one in the block as the example shown in FIG. 14, it is preferable for writing dummy data into this word line to treat it as an idle area as well as the example of the above-described first write scheme. The reason is in that even if finishing write is performed for the word line WLN, when data is written into the next word line WLN+1, the data on the word line WLN is influenced by those on the word line WLN+1.

Figure 16:
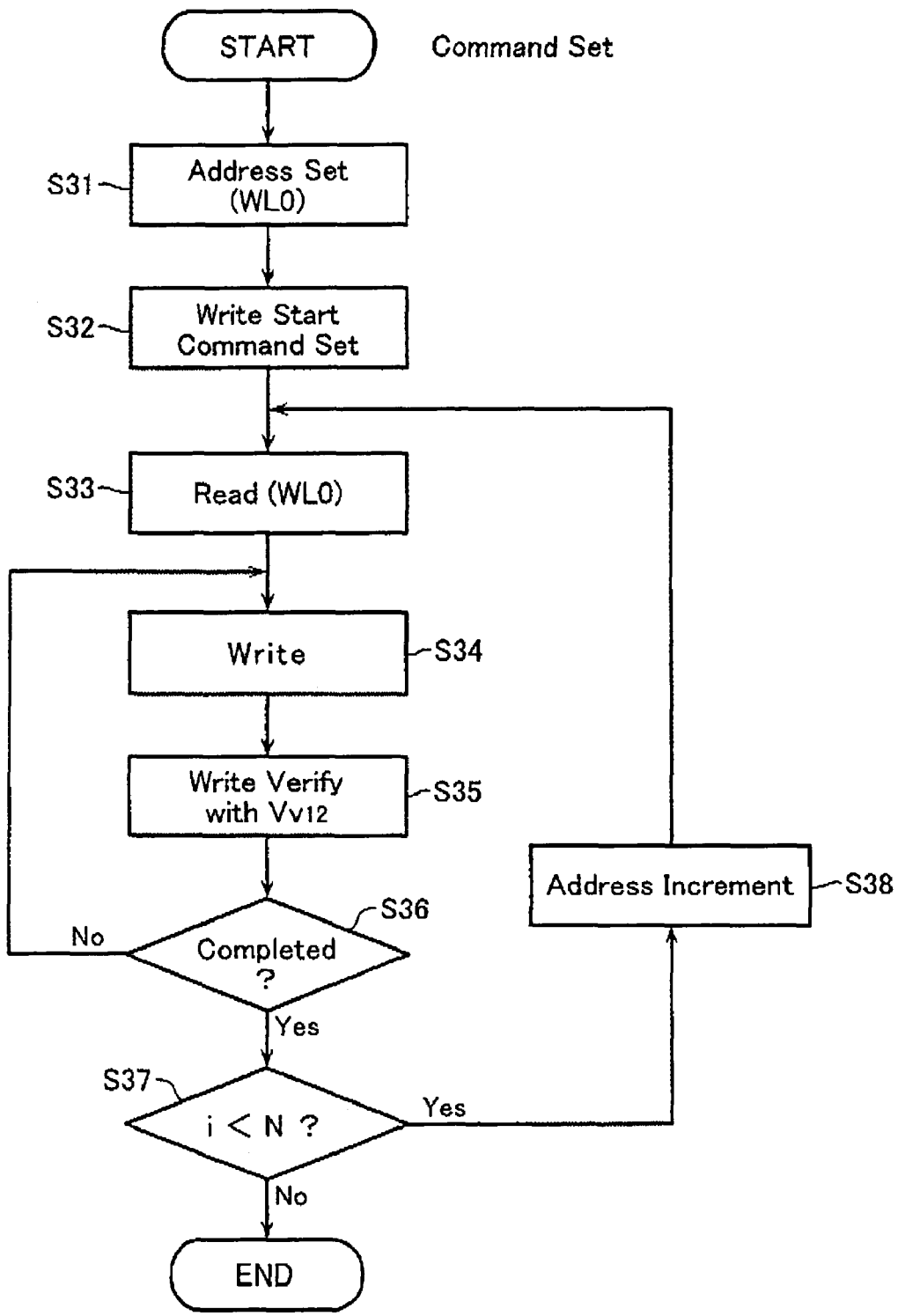
FIG. 16 shows a write sequence of the finishing write step S25 in FIG. 15.

FIG. 16 shows a detailed write sequence of the write step S25 in FIG. 15. After finishing write command input, input address for selecting the word line WL0 (step S31), following it input write-start command (step S32), and a finishing write sequence starts under the control of the internal controller 5.

Memory cell data on the selected word line WL0 are read out and held in the data latches LAT1 as write data (step S33). Based on this write data, write voltage application (step S34) and write-verify (step S35) are repeated. At the write-verify step, verify-voltage Vv12 is used.

If write completion has been judged at the step S36, judge whether the currently selected word line WLi is the final word line WIN or not (step S37). For this judgment, address information of the final word line WLN should be preliminarily stored in, for example, the address register as reference address data. If it is not reached the final word line WLN, increase the address (step S38), and then read out write data on the next word line (step S39). Following it similar finishing write will be repeated.

In this second write scheme, the write voltage step-up in the finishing write cycles is preferably set to be lower than that in the preliminary write cycles as well as the first write scheme. By use of the write voltages, it becomes possible to high-precisely control the threshold voltage distributions.

According to this second write scheme, the data threshold voltage variation due to capacitive coupling between adjacent cells' floating gates may be reduced, and it becomes possible to store data with a high reliability as well as the first write scheme. Additionally, in this second write scheme, preliminary write is performed for the whole write area with a threshold voltage target which is lower than the desired threshold voltage, and then finishing write is performed for achieving the desired threshold voltage state for the same write area. Therefore, there is provided such an effect that the threshold voltage variation due to back pattern (i.e., data dispersion state in the memory cell array) is reduced more in comparison with the ordinary write scheme.

Note here that although the above-described finishing write has been performed for plural word lines in response to a command, it is possible to input a finishing write command for each word line.

The above-described first and second write schemes are summarized as follows: a write method in a case that the memory device has first and second memory cells disposed adjacent to each other to be sequentially written in this order into a data state defined by a threshold voltage, including: performing a data write operation (i.e., preliminary write operation) for writing a data state defined by a threshold voltage lower than a desired threshold voltage into the first memory cell prior to the data write operation for the second memory cell; and performing another data write operation (i.e., finishing write or additional write operation) for writing a final data state defined by the desired threshold voltage into the first memory cell after the data write operation for the second memory cell.

[Third Write Scheme]

In a third write scheme described bellow, in a case that first and second memory cells are disposed adjacent, when data write is performed for the first memory cell, threshold voltage thereof is controlled in accordance with data to be written into the second memory cell later.

In detail, in this third write scheme, based on the predictable data shift due to adjacent cell's data which is to be written later, two times write-verify operations with different verify conditions are performed in one write cycle.

Figure 17:
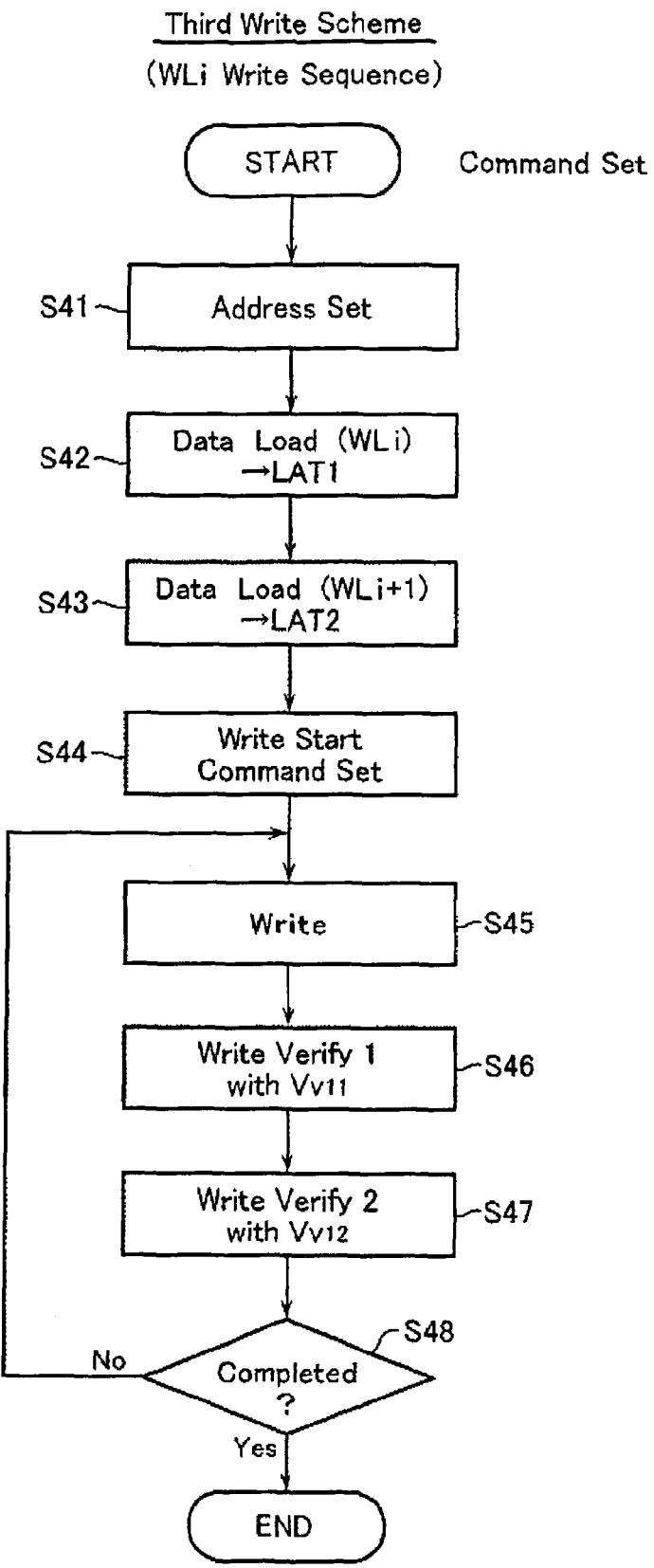
FIG. 17 shows a write sequence in the word line WLi in accordance with a third write scheme.
Figure 18:
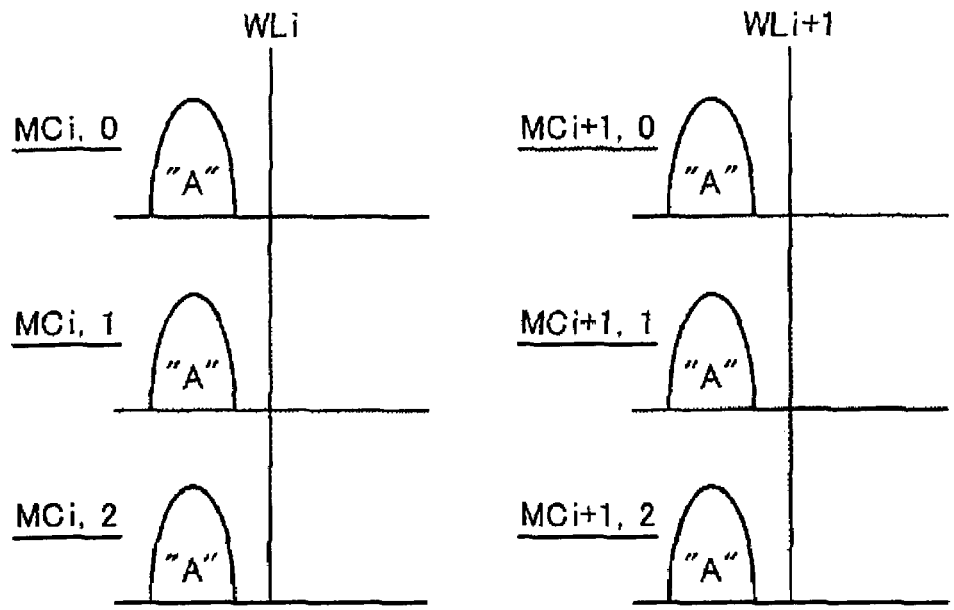
FIG. 18 shows an initial data state of 3×3 memory cells for explaining the third write scheme.
Figure 19:
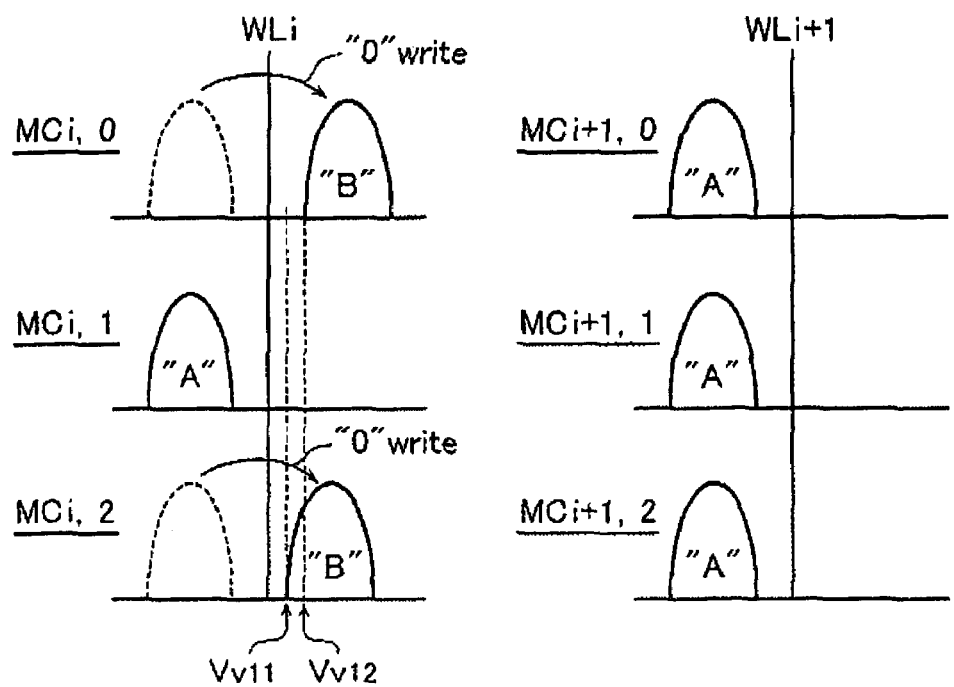
FIG. 19 shows data variations due to data write in the word line WLi in accordance with the third scheme.
Figures 20, 21:
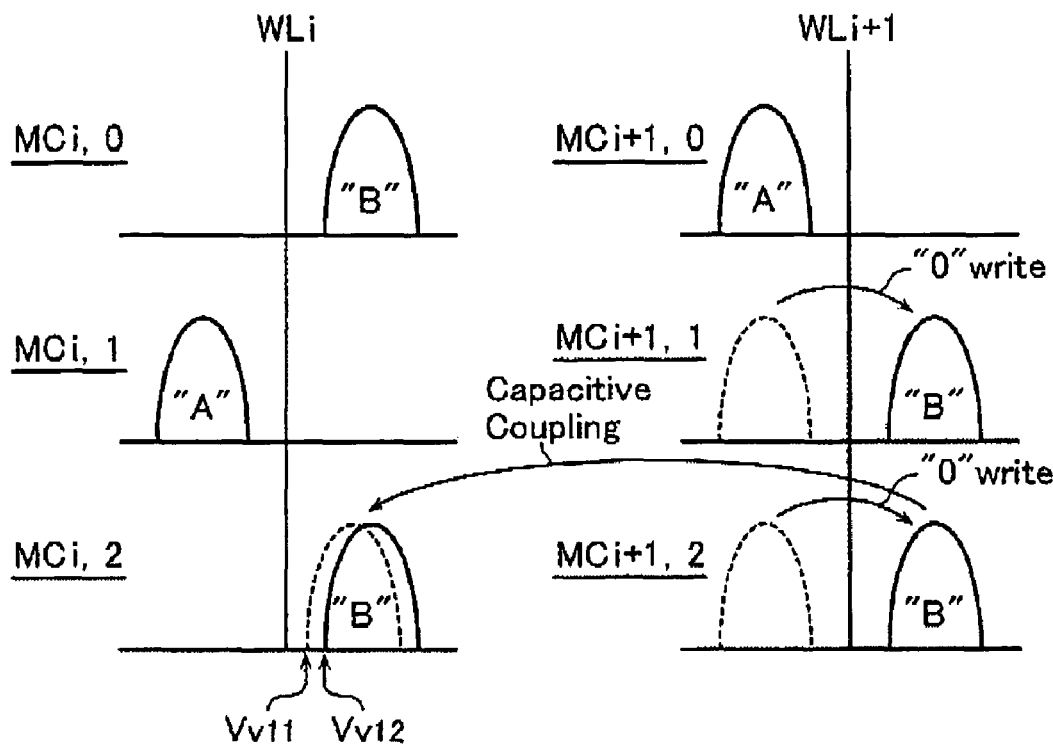
FIG. 20 shows data variations due to data write in the word line WLi+1 in accordance with the third write scheme.
FIG. 21 shows a relationship between write data and verify-voltages in the third write scheme.

FIG. 17 shows a write sequence for a word line WLi, to which the third write scheme is adapted. FIGS. 18 to 20 show an example of data threshold voltage variations with reference to adjacent two word lines WLi and WLi+1 in a case that data "B" is selectively written into each three memory cells (MCi,0 to MCi,2) and (MCi+1,0 to MCi+1,2) disposed on the word lines WLi and WLi+1, respectively.

An initial state is, as shown in FIG. 18, an erased state where the entire memory cells in a selected block have been erased into a data "A" state. FIG. 19 shows threshold variations due to data write on the word line WLi. In this example, data "0" is written into memory cells MCi,0 and MCi,2. In this write cycle, twice write-verifies are performed with different verify-voltages Vv11 and Vv12 in accordance with data to be written into memory cells MCi+1,0 and MCi+1,2 on the word line WLi+1, which is to be selected following the word line WLi.

For example, suppose here that, as shown in FIG. 21, data "B" is written based on "0" write into both of memory cells MCi,0 and MCi,2 on the word line WLi, which are assigned to columns Col.0 and Column Col.2, respectively, while data "A" and "B" are written based on "1" and "0" write into memory cells MCi+1,0 and MCi+1,2 of columns Col.0 and Col.2, respectively, on the word line WLi+1. In this case, data threshold voltage of memory cell MCi,0 is not influenced by the floating gate of memory cell MCi+1,0 written later, while data threshold voltage of memory cell MCi,2 will be influenced by the floating gate of memory cell MCi+1,2 when "0" data is written into it.

In consideration of the above-described situation, at the data write time for the word line WLi, referring to data of memory cells MCi+1,0 and MCi+1,2 to be written later, write-verify is performed as follows: verify-voltage Vv12, which is equal to the lowest value of the desired threshold voltage distribution, is used for memory cell MCi,0, while verify-voltage Vv11, which is lower than the desired threshold voltage, is used for memory cell MCi,2 in consideration of the threshold voltage variation due to adjacent cell' data to be written later.

Thereafter, as shown in FIG. 20, data write is performed for word line WLi+1. As a result, the threshold voltage of memory cell MCi,2, which has been set to be lower than the desired one, will be shifted in the positive direction under the influence of data "B" in memory cell MCi+1,2. Therefore, data "B" in the memory cells MCi,0 and MCi,2 on the word line WLi, into which "0" data has been written, become to have little variation in the threshold voltage distributions as a result of reduction of the influence due to FG-FG capacitive coupling.

The write sequence shown in FIG. 17 will be explained bellow. In response to write command setting, this sequence starts. Following the write command input, write page address is input for selecting word line WLi (step S41), and then write data are loaded (step S42). The write data are transferred to and loaded in the data latches LAT1 shown in FIG. 4.

Next, write data, which are to be written into memory cells on the next word line WLi+1, are loaded in the data latches LAT2 (step S43). As write-start command is input (step S44), data write is executed under the control of the internal controller 5.

In each write cycle, after write voltage application (step S45), a first write-verify operation with verify-voltage Vv11 (step S46) and a second write-verify operation with verify-voltage Vv12 (step S47) are sequentially performed. In these write-verify operations, verify target memory cells are selected in accordance with data "0" and "1" to be written on the word line WLi+1.

In detail, it is required to do additional operations (data processes) for the two write-verify operations as follows. At the first write-verify time with verify-voltage Vv11, it is necessary for verifying only "0" write of memory cell MCi,2 ("0" write is done for adjacent memory cell MCi+1,2 of the same column Col.2) within the entire memory cells shown in FIG. 21. For this reason, column Col.0, in which the data latch LAT2 is storing "1" data, is excluded from the verify target.

At the second write-verify time with verify-voltage Vv12, it is necessary for verifying only "0" write of memory cell MCi,0 ("1" write is done for adjacent memory cell MC+1,0 of the same column Col.0) within the entire memory cells shown in FIG. 21. For this reason, column Col.2, in which the data latch LAT2 is storing "0" data, is excluded from the verify target.

The additional operations will be explained in detail more. In the data write cycle based on the write data stored in the data latch LAT1, write-verify read is done with applying verify-voltage Vv11 to the selected word line WLi. As a result of this verify-read, the precharged bit lines will be selectively discharged in accordance with selected memory cells' data as follows: a bit line of "0" write column is kept "H" as it is; another bit line of "1" write (i.e., write-inhibit) column or incomplete "0" write column is discharged to be "L". The "H" level after the bit line discharge operation is sensed as "0" write has been done, while the "L" level is sensed as "1" write (write-inhibit) has been done or "0" write is incomplete.

Prior to this data sense, let the bit line of column Col.0 (write data held in data latch LAT2 to be written into adjacent cell is "1") be forcedly discharged and sensed as "L" data (i.e., "1" data) in spite of whether it becomes "H" or not as a result of verify-read. Therefore, at the first write-verify time, only "0" write cell adjacent cell of which is to be written into data "0" is sensed as "H" data. Hereinafter, this "H" data serves as "1" write data (i.e., write-inhibit).

Similarly, at the second write-verify time, the column Col.2, where the data latch LAT2 is storing data "0", is excluded from the verify target. For this purpose, let the bit line corresponding to a column where data of latch LAT2 is "1" be forcedly discharged and sensed as "L" data (i.e., "1" data) within the memory cells defined by "0" write data in the latch LAT1 as well as the first write-verify. Therefore, at this second write-verify time, only "0" write cell adjacent cell of which is to be written into data "1" is sensed as "H" data. This "H" data serves as "1" write data (i.e., write-inhibit) in the following write cycles.

Write completion is judged with detecting that the data latches LAT1 have become all "1" state as a result of the twice write-verify operations (step S48).

As described above, according to the third write scheme, write-verify is controlled in consideration of data to be written into adjacent cell. As a result, it becomes possible to reduce the data threshold variations due to capacitive coupling between floating gates without finishing write.

[Fourth Write Scheme]

So far, it has been explained such a case that data "B" is selectively written into memory cells, which are disposed on adjacent two word lines and initially set in a data "A" state. Although four-value data storage scheme is not excluded from the write scheme, it is basically adapted to binary storage scheme.

Figure 22:
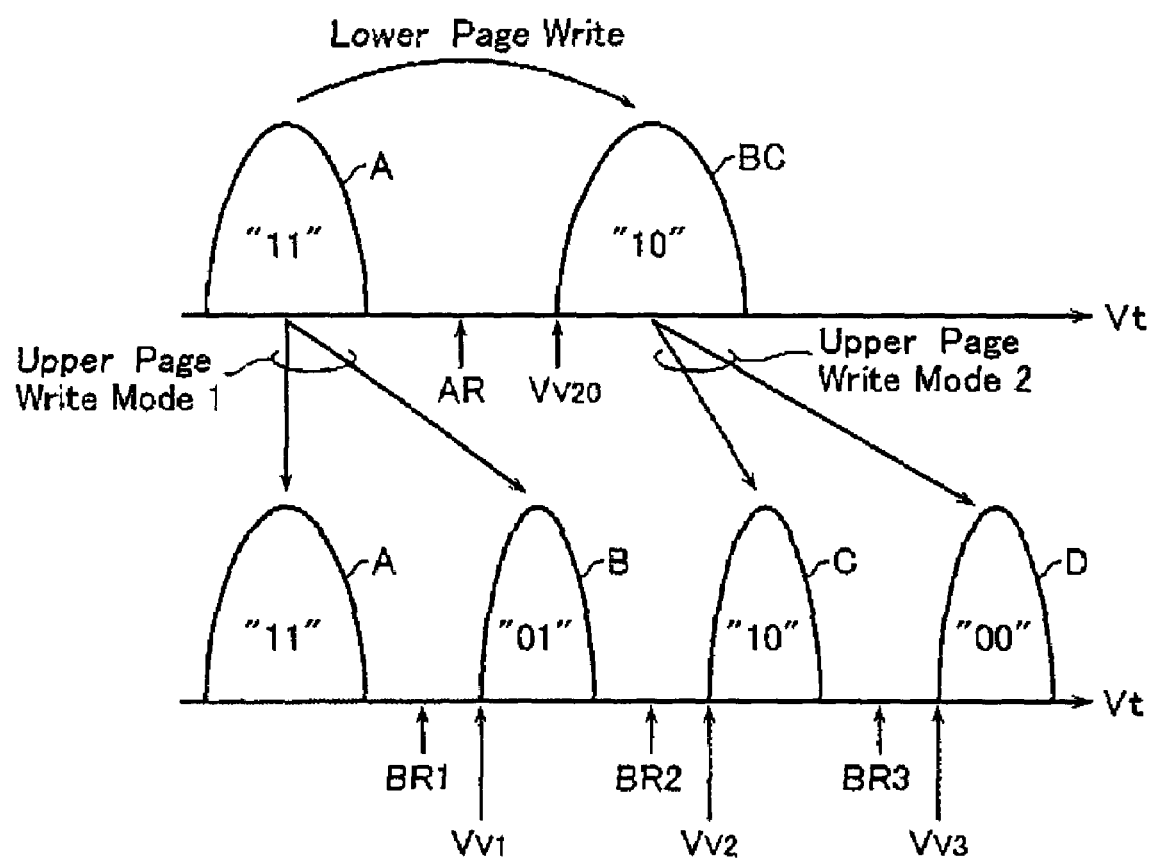
FIG. 22 shows data threshold distributions and write method in accordance with another four-value data storage scheme.

Next, it will be explained a fourth write scheme adapted to a four-value storage scheme. In a case described in detail bellow, upper page data are sequentially written into memory cells disposed on first and second word lines, into which lower page data have been written. In the four-value data storage scheme described bellow, four value data are, as shown in FIG. 22, defined in order of threshold voltage as follows: A="11", B="01", C="10" and D="00".

At the lower page write time, an intermediate data "BC" is selectively written into memory cells of data "A" (i.e., erased cells) with a broad threshold voltage distribution extending from data "B" to data "C". The intermediate data "BC" is written together with write-verify using a verify-voltage Vv20, which is equal to the lowest value of the data threshold voltage distribution.

With respect to the upper page write, there are used a first upper page write mode 1 for selectively writing data "B" into memory cells set in the data "A" state, and a second upper page write mode 2 for selectively writing data "C" or "D" into memory cells, in which the intermediate data "BC" has been written. As shown in FIG. 22, verify-voltages for data "B", "C" and "D" are set as Vv1, Vv2 and Vv3 corresponding to the lowest values of these threshold voltage distributions, respectively.

Write data loaded in the data latches LAT2 from the external for this upper page write are "1", "0", "1" and "0" for writing data "A", "B", "C" and "D", respectively. On the other hand, as shown in FIG. 22, both data write of "C" and "D" are required to be performed as "0" write for shifting the cell's threshold voltage. Therefore, it is required that write data set in the latches LAT1 for controlling the bit line voltages become "1", "0", "0" and "0" for data "A", "B", "C" and "D", respectively. Although the detail is omitted, it is performed such a data process in the sense amplifier circuit that the externally loaded data are transformed into the above-described write data for writing the upper page data.

In this four-value data storage scheme, read voltage AR, which is applied to a selected word line in a state where lower page data have been written, is set at a middle point between the threshold voltage distributions of data "A" and "BC". By contrast, read voltages BR1, BR2 and BR3, which are used after having written the upper page data, are set between the threshold voltage distributions of data "A", "B", "C" and "D", respectively.

At a practical data write time, flag data will be written into a column area different from the normal data storage area in the cell array simultaneously with the upper page data for the purpose of designating a fact that the upper page data have been written. At data read time, it is possible to select a read voltage based on the flag data.

With giving attention to adjacent two word lines WLi and WLi+1, the fourth write scheme will be described in detail bellow.

Figure 23:
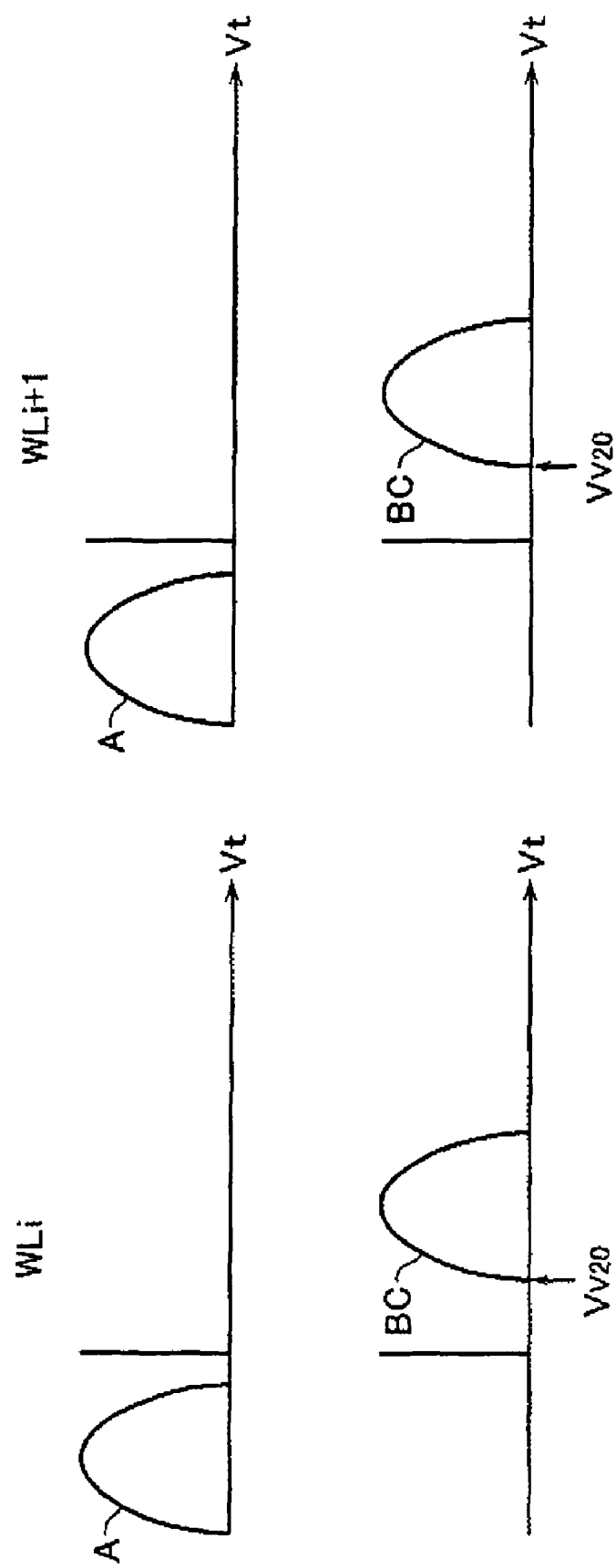
FIG. 23 shows lower page write states in word lines WLi and WLi+1 in accordance with a fourth write scheme.

FIG. 23 shows a state where lower page data have been selectively written into memory cells on the word lines WLi and WLi+1, that is, these memory cells have been set in a data "A" state or an intermediate data state "BC".

Figure 24:
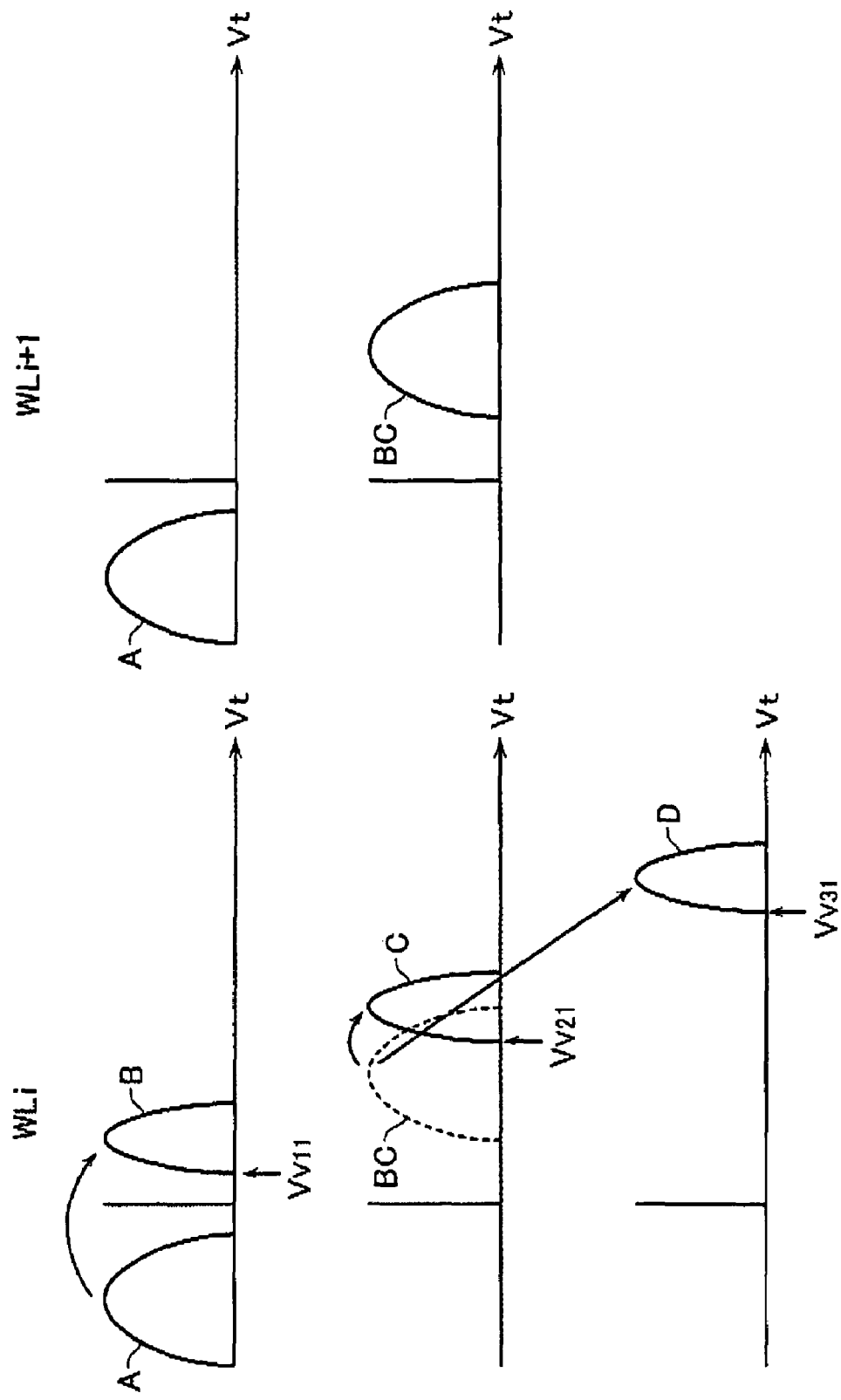
FIG. 24 shows an upper page write state in word line WLi in accordance with the fourth write scheme.

FIG. 24 shows a state where upper page data have been selectively written into memory cells on the word line WLi. At this upper page write time, data "B", "C" and "D" are written with verify-voltages Vv11, Vv21 and Vv31, respectively. The verify-voltages Vv11, Vv21 and Vv31 are set to be lower than the lowest values of the desired threshold voltages of data "B", "C" and "D", respectively.

Figure 25:
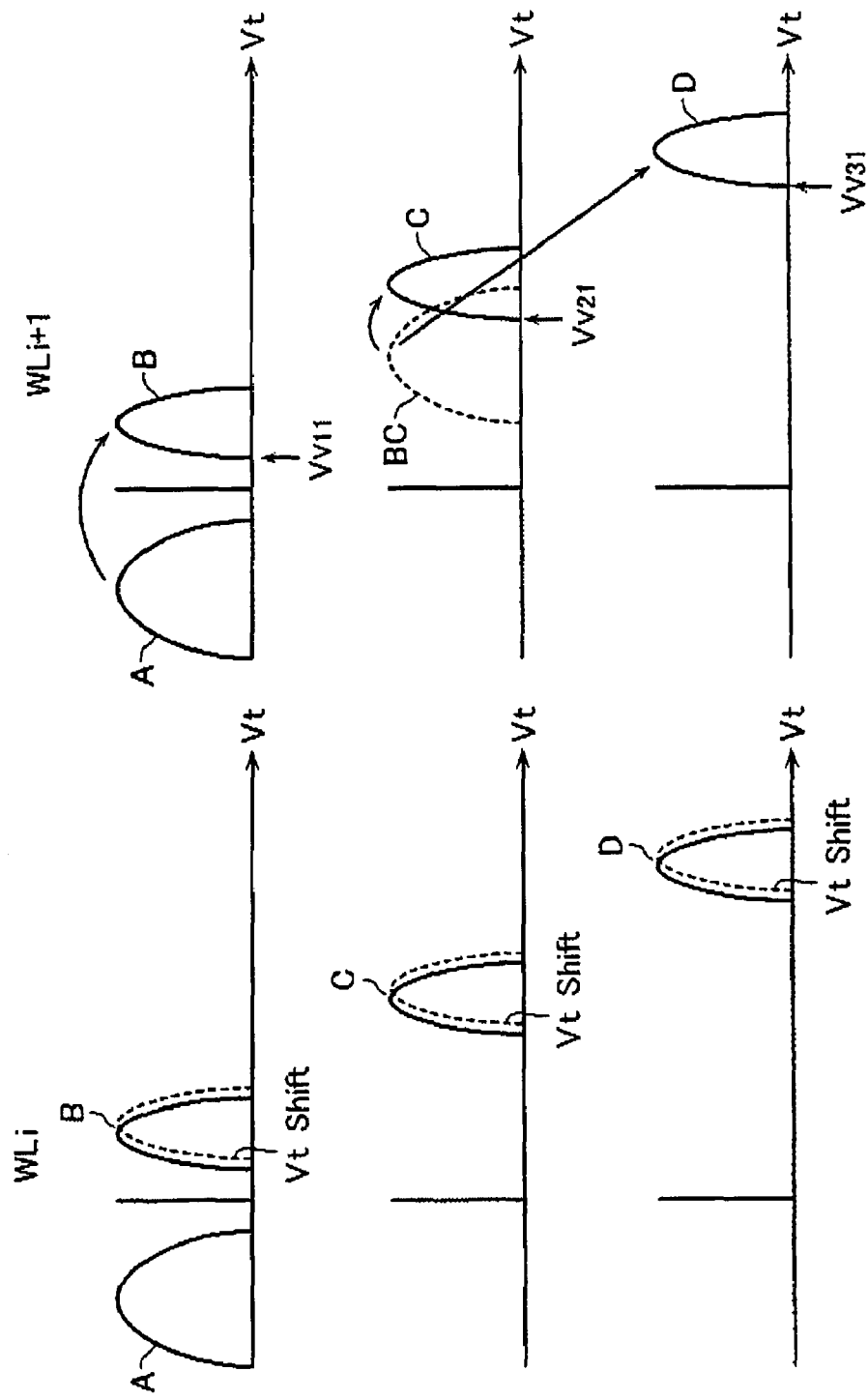
FIG. 25 shows an upper page write state in word line WLi+1 in accordance with the fourth write scheme.

Then, as shown in FIG. 25, upper page data are selectively written into memory cells on the word line WLi+1. That is, data "B", "C" and "D" are written with verify-voltages Vv11, Vv21 and Vv31, respectively. The threshold voltages of memory cells on the word line WLi are influenced by the resultant of the upper page write for the word lines WLi+1.

In FIG. 25, it is shown that in case memory cells on the word lines WLi+1 are written into such data as to boost threshold voltage thereof, threshold voltages of data "B", "C" and "D" on the word lines WLi are shifted as shown by dotted lines due to capacitive coupling between the floating gates.

If a memory cell on the word line WLi+1 is maintained in a data "A" state as a result of upper page write for the word line WLi+1, it has no influence on an adjacent memory cell on the word line WLi. Further, with respect to the upper page write for the word lines WLi+1, the influence of a memory cell with data "C" written on the threshold voltage variation of memory cells on the word line WLi is less than that of another memory cell with data "D" written. That is, the influence on the memory cells on the word line WLi due to capacitive coupling between floating gates is determined in accordance with what upper page data has been written into the memory cell on the word line WLi+1. Therefore, the above-described verify-voltages Vv11, Vv21 and Vv31 should be determined as to be not over the desired threshold voltages when the memory cells on the word line WLi+1 have experienced the maximum threshold voltage variation via the upper page write on the word line WLi+1.

Figure 26:
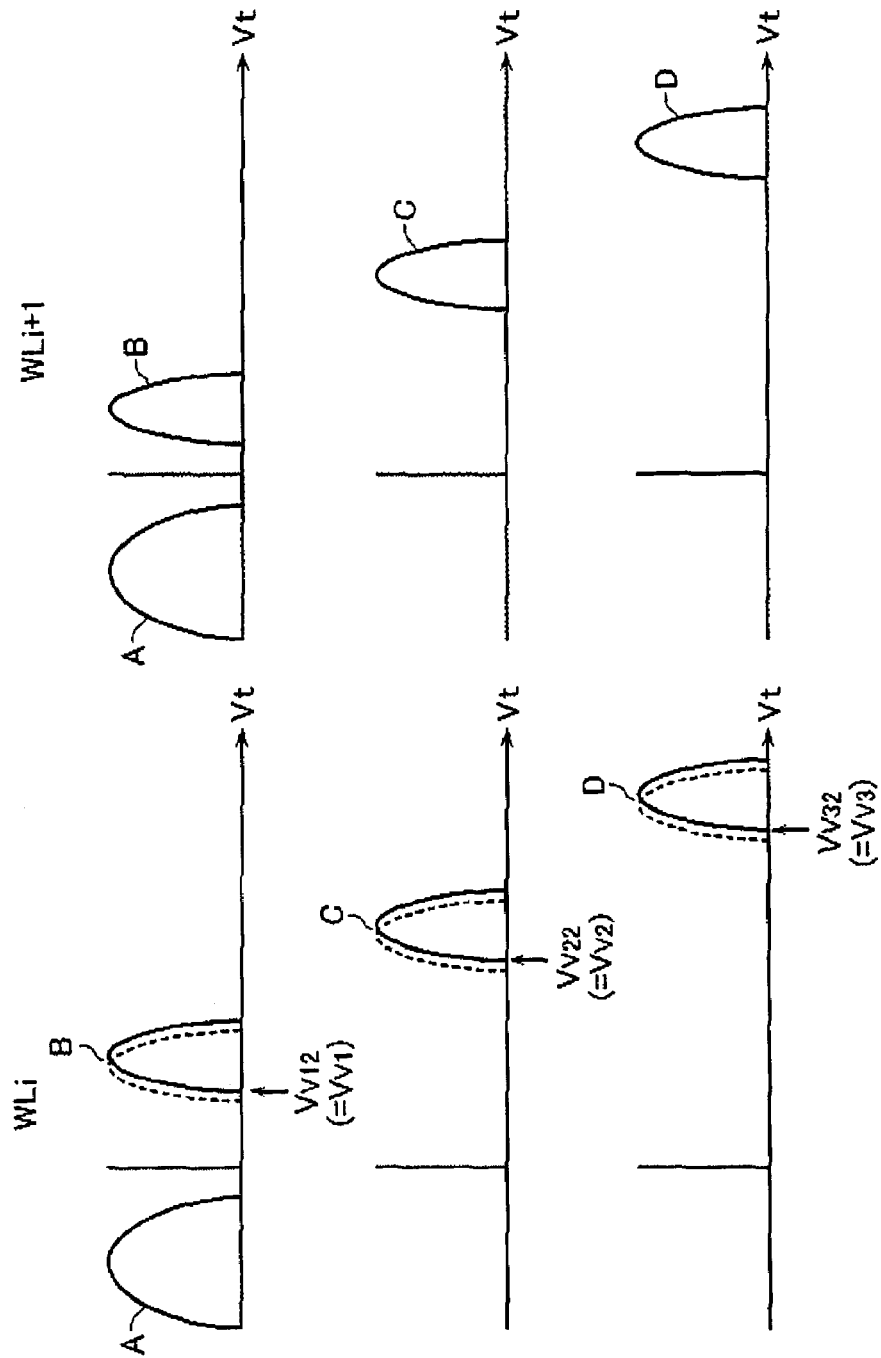
FIG. 26 shows a finishing upper page write state in word line WLi in accordance with the fourth write scheme.

After upper page write for the word line WLi+1, as shown in FIG. 26, finishing upper page write is performed for the memory cells on the word line WLi. In detail, data "B", "C" and "D" are written with the same data pattern as the previous upper page write and with verify-voltages Vv12 (=Vv1), Vv22(=Vv2) and Vv32(=Vv3), respectively.

As a result, the write data variations of memory cells on the word line WLi due to cell data on the adjacent word line WLi+1 may be reduced.

Figure 27:
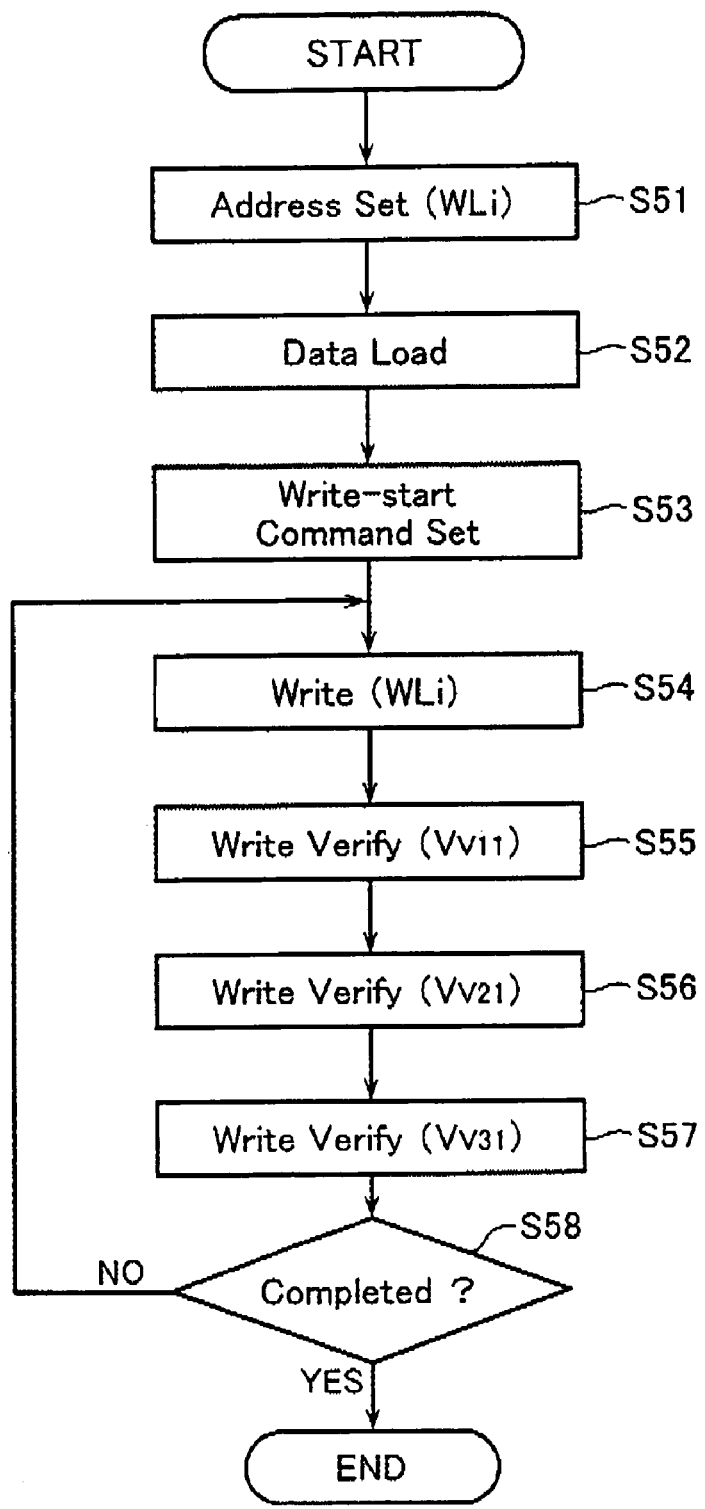
FIG. 27 shows the upper page write sequence in accordance with the fourth write scheme.

FIG. 27 shows an upper page write sequence of this fourth write scheme. This sequence starts with write command setting. For example, in response to address input for selecting word line WLi (step S51), write data load (step S52) and write-start command input (step S53), the controller 5 starts to execute the write sequence.

Data write is performed by repeat of write voltage application (step S54) and multiple write-verify steps (S55-S57). For example, in case of the upper page write shown in FIG. 24, verify-voltages Vv11, Vv21 and Vv31 are used at the verify steps S55, S56 and S57, respectively.

In these write verify steps, it is required to perform data processing such as data transferring, data inverting and the like in the sense amplifier circuit in accordance with to-be-verified data, but the detailed explanation is omitted. After write-verify, it is judged whether data write has been completed or not (step S58). The write voltage application and write-verify will be repeated until the write completion judgment.

This write sequence will be adapted to not only the preliminary write on the word line WLi as shown in FIG. 24 but also the finishing write on the word line WLi as shown in FIG. 26.

Figure 28:
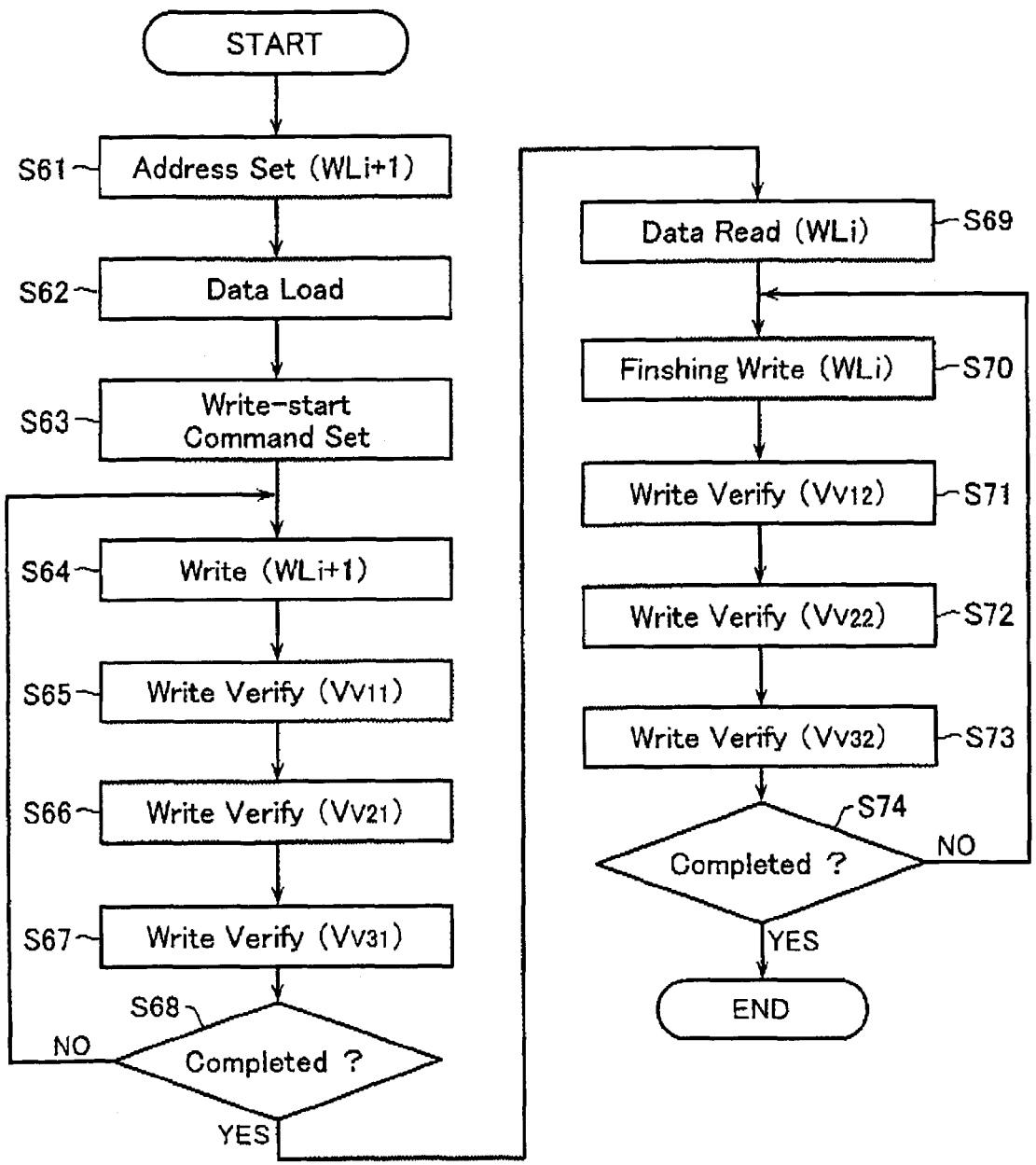
FIG. 28 shows another upper page write sequence in accordance with the fourth write scheme.

FIG. 28 shows another upper page write sequence in accordance with the fourth write scheme. This is a case that finishing write for the word line WLi is performed in the write sequence for the word line WLi+1 as following the upper page write of the word line WLi+1.

Following write command input, as address is input for selecting word line WLi+1 (step S61); write data are loaded (step S62); and write-start command is Input (step S63), write operation control is started.

Data write is performed by repeat of write voltage application (step S64) and multiple write-verify steps (S65-S67). At the initial upper page write time, verify-voltages Vv11, Vv21 and Vv31 are used at the verify steps S65, S66 and S67, respectively.

After write-verify, it is judged whether data write has been completed or not (step S68). The write voltage application and write-verify will be repeated until the write completion judgment. If the write completion has been judged, go to the following finishing write operation. Cell data on the word line WLi, which have been written into the cell array, are read out and held in the sense amplifier circuit (step S69). Based on the holding data, finishing upper page write is performed for the word line WLi (step S70). At the write-verify steps S71, S72 and S73, verify-voltages Vv12, Vv22 and Vv32 are used, respectively, which are equal to the lowest values of the desired threshold voltages of data "B", "C" and "D", respectively. After write-verify, it is judged whether data write has been completed or not (step S74). The write voltage application and write-verify will be repeated until the write completion judgment.

In the above-described fourth write scheme, it has been noted only adjacent two word lines WLi and WLi+1 and write order thereof. This is adaptive to a case as it is, in which the entire memory cells on a word line are simultaneously read and written, that is, a case with the cell array and sense amplifier circuit as shown in FIG. 2.

By contrast, in case the shared sense amplifier scheme is used as shown in FIG. 3, memory cells disposed along a word line are divided into a set of memory cells on the even-numbered bit lines BLe (i.e., first sector) and another set of memory cells on the odd-numbered bit lines BLo (i.e., second sector), and these sectors are read or written at different timings from each other.

Therefore, in case the shared sense amplifier scheme is used, the fourth write scheme with giving attention to the adjacent two word lines WLi and WLi+1 will be adapted as follows: initially, preliminary write operations are sequentially performed for the first and second sectors with respect to the word line WLi; next, preliminary write operations are sequentially performed for the first and second sectors with respect to the word line WLi+1; following it it is returned back to the word line WLi, and finishing write operations are sequentially performed for the first and second sectors on the word line WLi.

In the above-described fourth write scheme, it is desirable that write voltage step-up in the finishing write is set to be lower than that in the preliminary write. In consideration of this, it becomes possible to perform the finishing write with high precise.

[Fifth Write Scheme]

As a fifth write scheme, it will be explained bellow an example, in which the above-described third write scheme is adapted to a four-value data storage scheme.

Figure 29:
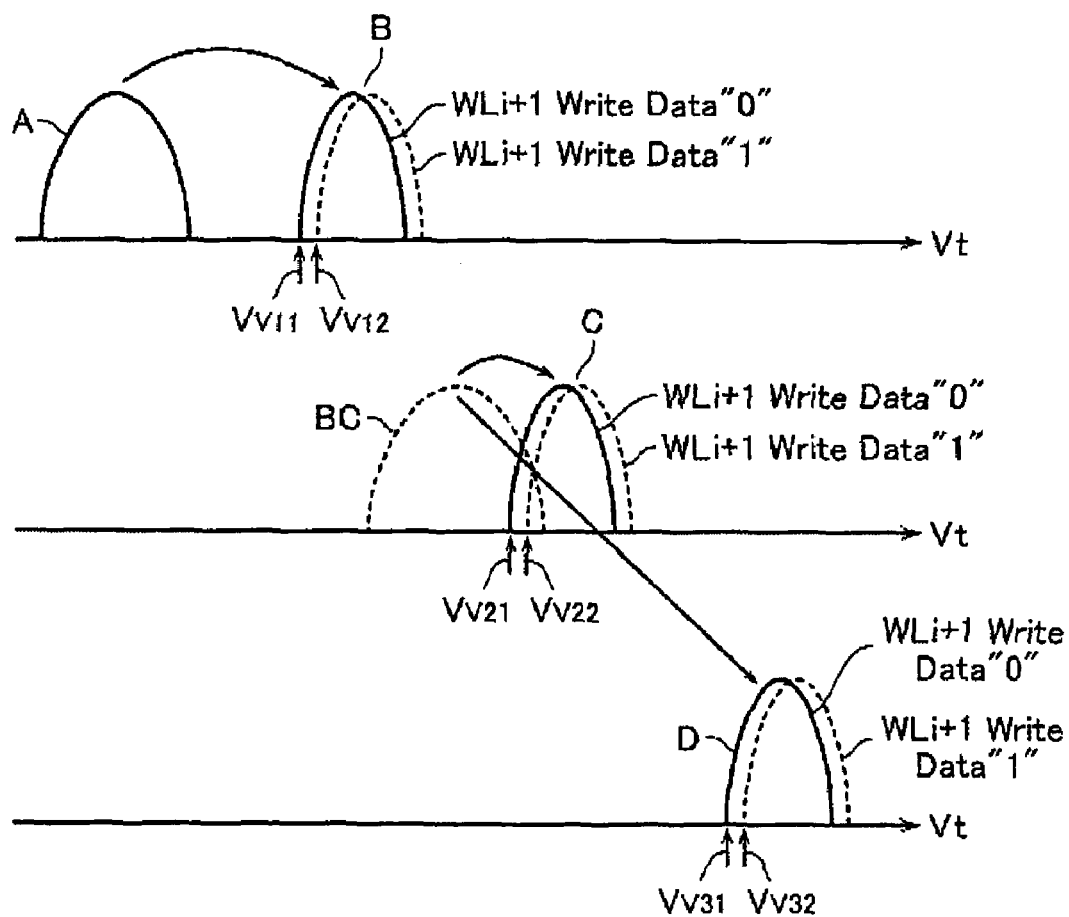
FIG. 29 shows an upper page write state in accordance with a fifth write scheme.

FIG. 29 shows a state of upper page write for the word line WLi within adjacent two word lines WLi and WLi+1. The four-value storage scheme used In this case is the same as explained with FIG. 22. Based on the lower page write, every memory cell on the word lines WLi has been set in either data "A" state (i.e., erased state) or an intermediate data "BC".

Upper page write contains a write mode 1, in which data "B" is selectively written into memory cell(s) with data "A", and another write mode 2, in which data "C" or "D" is written into memory cell(s) with the intermediate data "BC".

For the write-verify of data "B" write, verify-voltages Vv11 and Vv12 are used, which are different in correspondence with upper page data to be written into the memory cells on the next word line WLi+1. In detail, in case data to be written into the adjacent cell is not accompanied with data threshold variation (this write data is, for example, referred to as data "1"), verify-voltage Vv12 is used, which is equal to the lowest value of the desired threshold distribution. In case data to be written into the adjacent cell is accompanied with data threshold variation (this write data is referred to as data "0"), verify-voltage Vv11 is used, which is lower than the lowest value of the desired threshold distribution.

As well as this, for the write-verify of data "C" write, verify-voltages Vv21 and Vv22 are used, which are different in correspondence with upper page data to be written into the memory cells on the next word line WLi+1. For the write-verify of data "D" write, verify-voltages Vv31 and Vv32 are used, which are different in correspondence with upper page data to be written into the memory cells on the next word line WLi+1.

For the purpose of such the data write, at the upper page write time on the word line WLi, it is required to load data to be written later on the word line WLi+1 into the sense amplifier circuit and do write-verify with reference to the loaded data as well as in the above-described third write scheme.

According to this fifth write scheme, since the write-verify is performed with reference to write data to be written into the adjacent cells, it becomes possible to reduce variations of data threshold distributions due to capacitive coupling between floating gates without finishing write.

This fifth write scheme may be adapted to other multi-value data storage schemes such as eight-value storage, sixteen-value storage and so on, where as a memory cell stores more than two bits, the influence between adjacent cells is increased more.

[Sixth Write Scheme]

The first to fifth write schemes as described above have been provided to reduce the interference between memory cells on adjacent two word lines. However, this invention is effective as a method of reducing the interference between memory cells on adjacent two bit lines.

In practice, in case that the shared sense amplifier circuitry shown in FIGS. 3 is used, capacitive coupling between floating gates of adjacent cells on a word line becomes a subject to be solved because a first sector of memory cells selected by a word line WLi and even-numbered bit lines and a second sector of memory cells selected by the word line WLi and odd-numbered bit lines BLo are subjected to data write at different timings from each other.

As a sixth write scheme, referring to FIGS. 30 to 33, it will be explained bellow an example, which is adapted to the four-value data storage scheme shown in FIG. 22 for reducing the influence of interference between cells on adjacent two bit lines.

Figure 30:
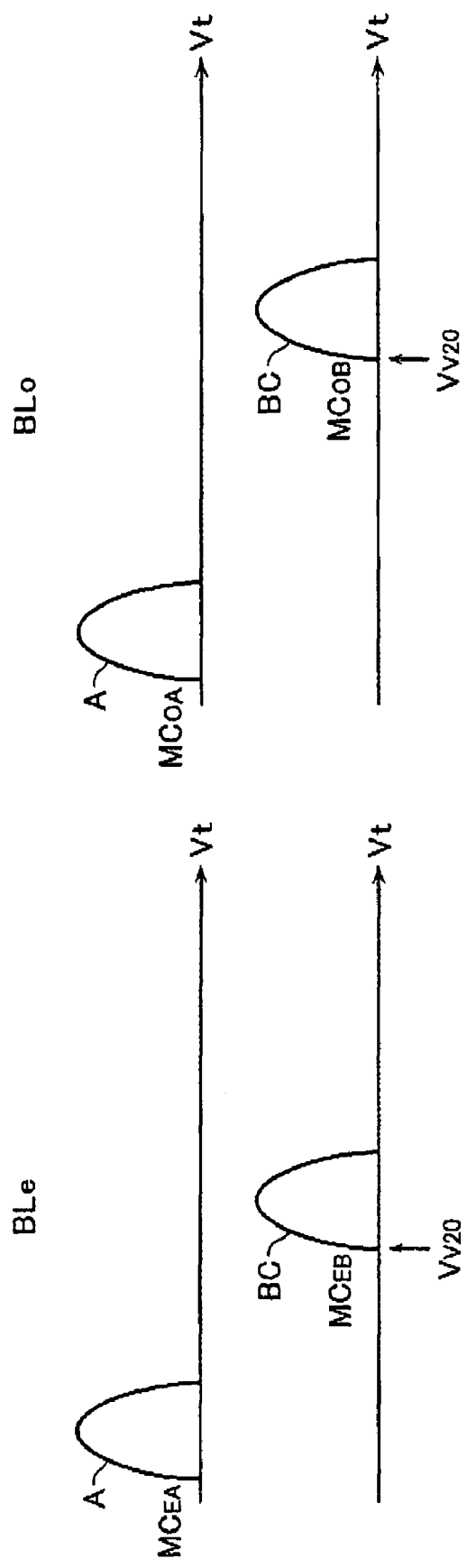
FIG. 30 shows a lower page write state in accordance with a sixth write scheme.

FIG. 30 shows a state where lower page data have been written into memory cells on adjacent even-numbered bit lines BLe and odd-numbered bit lines BLo. Each memory cell has been set in a data "A" state (erased state) or an intermediate data "BC" state.

Figure 31:
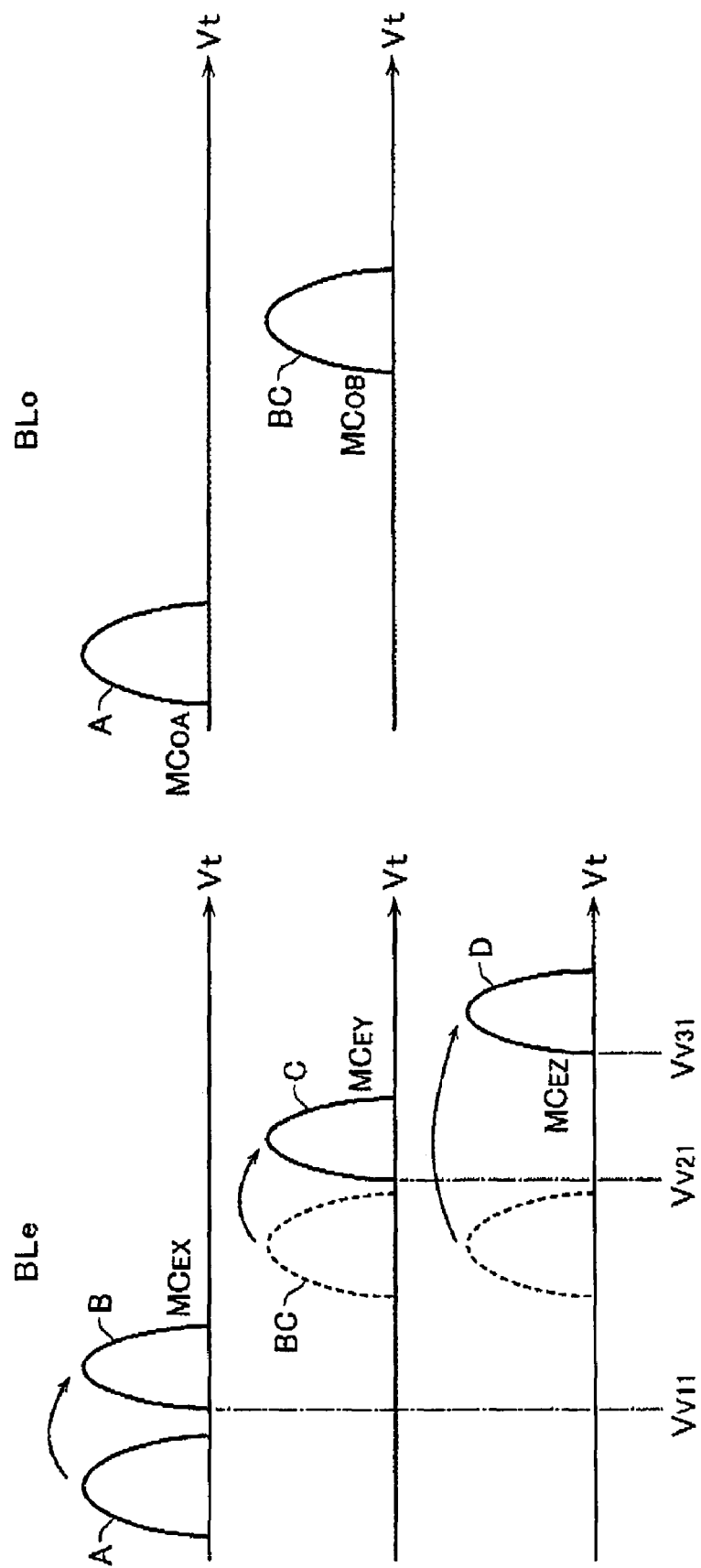
FIG. 31 shows the upper page write state in the even bit line BLe in accordance with the sixth write scheme.

Then, as shown in FIG. 31, upper page data write (i.e., preliminary write) is performed for memory cells on the even bit lines BLe. In detail, data "B" is selectively written into memory cell(s) of data "A", and data "C" or "D" is selectively written into memory cell(s) of data "BC". At this step, the verify-voltages Vv11, Vv21 and Vv31, which are to be the lowest values of threshold voltages of data "B", "C" and "D", are set to be lower than the desired threshold voltages, respectively.

Figure 32:
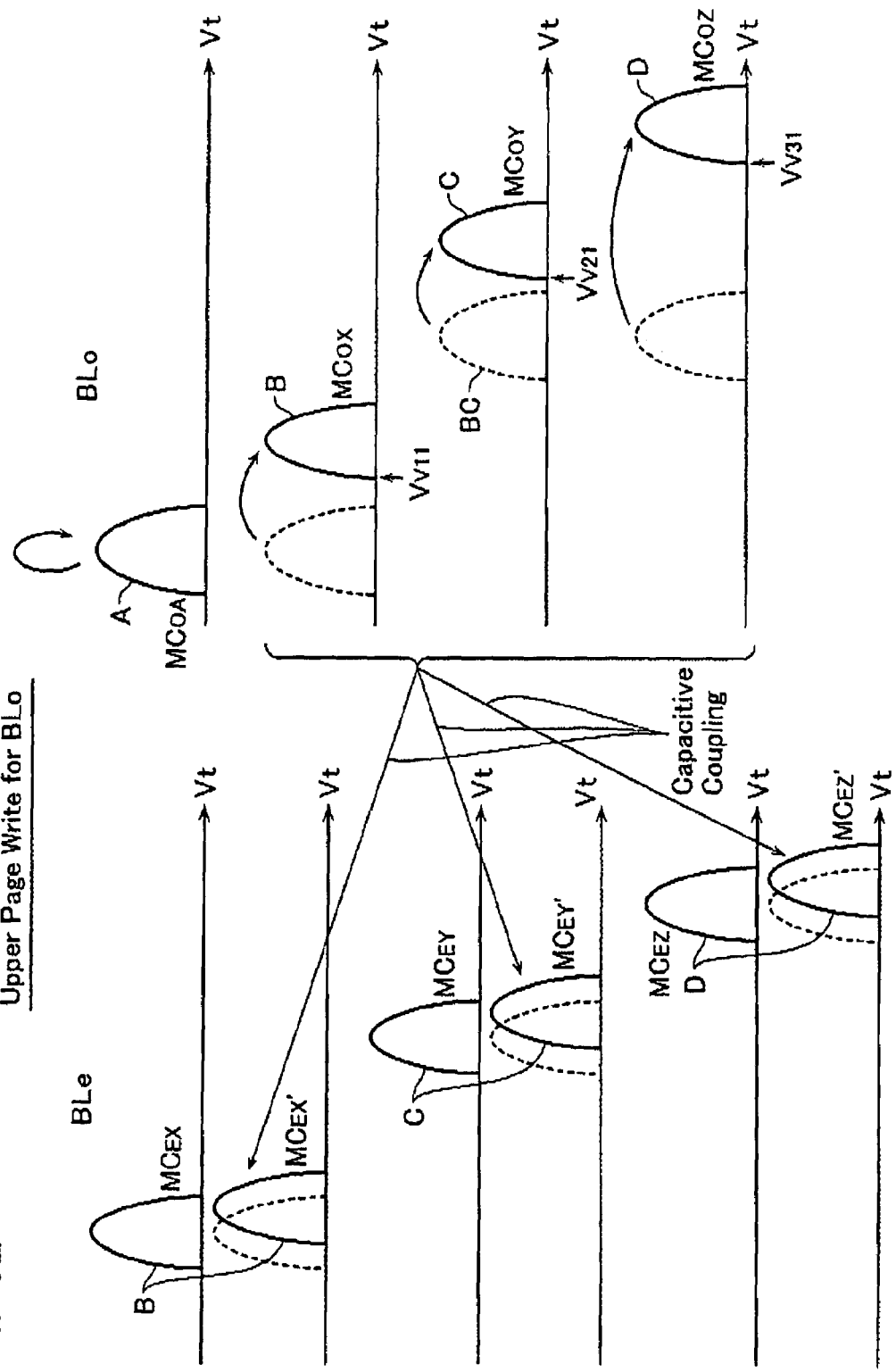
FIG. 32 shows the upper page write state in the odd bit line BLo in accordance with the sixth write scheme.

Following it, as shown FIG. 32, upper page data write (i.e., preliminary write) is performed for memory cells on the odd bit lines BLo as well as above-described upper page data write. As a result of this upper page data write on the bit lines BLo, memory cell data on the bit lines BLe are shifted in threshold voltage due to capacitive coupling between floating gates.

For example, threshold voltages of some memory cells $MC_{EX}$' in the memory cells $MC_{EX}$ of data "A" will be shifted in a positive direction as shown by a dotted line due to the write data accompanied with threshold voltage shift in the adjacent cells. The remaining cells are held in the preceding data state as it is because write data accompanied with threshold voltage shift are not written into adjacent cells. It will be explained as similar to this for the remaining data "C" and "D".

Figure 33:
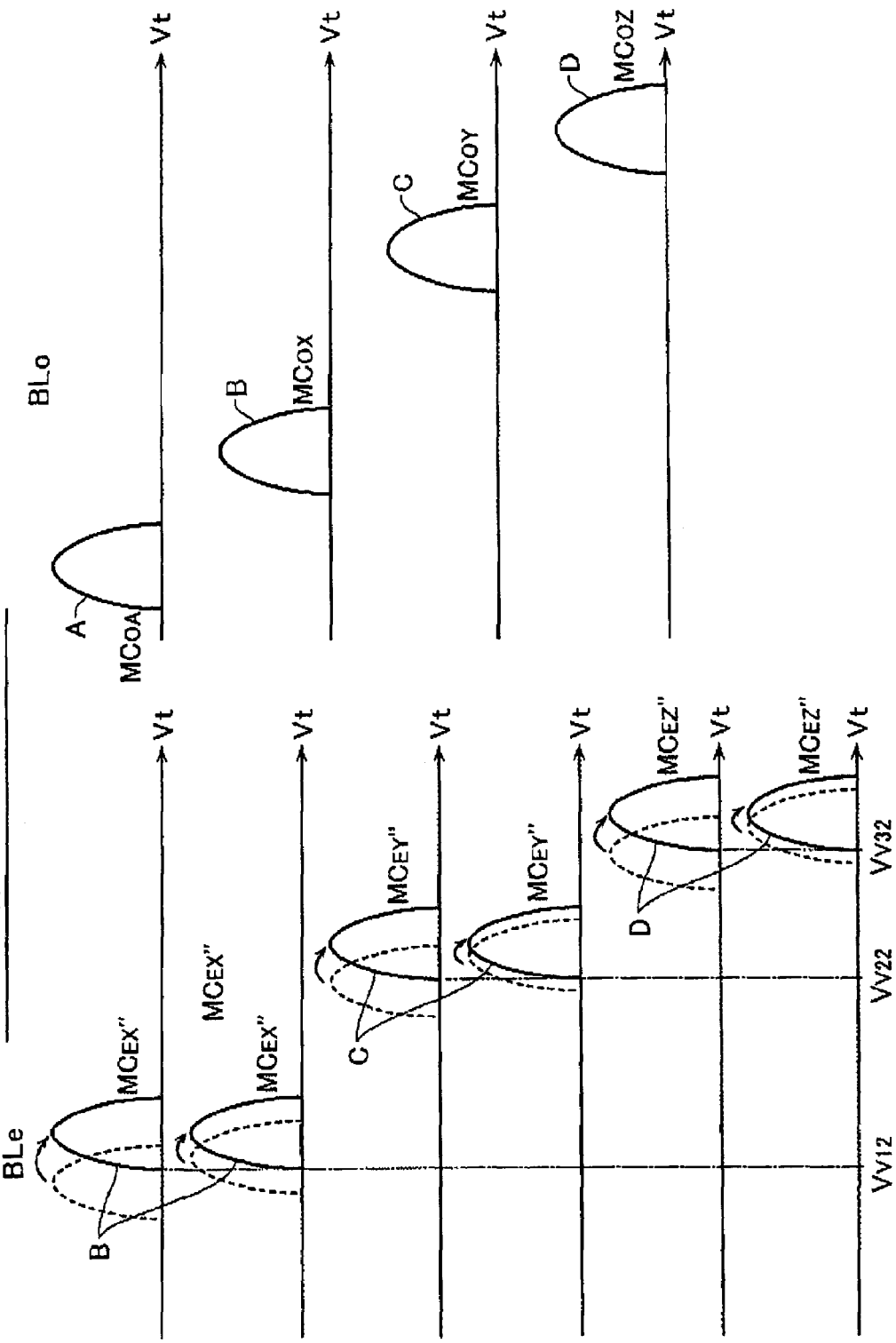
FIG. 33 shows the finishing upper page write state in the even bit line BLe in accordance with the sixth write scheme.

Next, as shown in FIG. 33, finishing upper page data write is performed for the even bit lines BLe. In detail, data write are performed for data "B", "C" and "D" with verify-voltages Vv12, Vv22 and Vv32, respectively, which are equal to the lowest values of the desired threshold voltages of these data, respectively.

As a result of this finishing write, the threshold voltage variations of the memory cells of data "B" on the even bit lines BLe, which are generated due to the influence by the adjacent cells' data on the odd bit lines BLo, are reduced, thereby resulting in that these cells of data "B" have a threshold voltage distribution, the lowest value of which is constant. Data "C" and "D" will be explained in the same way as data "B".

In this sixth write scheme, too, it is desirable that write voltage step-up in the finishing write is set to be lower than that in the preliminary write. With this write step-up, it becomes possible to perform the finishing write with high precise.

Note here that as a write scheme for reducing the influence of interference between cells on adjacent bit lines, it is effective to control the threshold voltage in accordance with data to be written next like the third or fifth write scheme.

[Seventh Write Scheme]

As s seventh write scheme, an example will be explained below, in which a noticed memory cell is subjected to a finishing write operation in consideration of the influence of plural memory cell disposed as surrounding the noticed memory cell.

This seventh write scheme is the same in principle as that of the first write scheme as follows: in case of writing data into a first memory cell, performing a first data write operation for the first memory cell in such a way as to write a threshold state lower than a desired threshold state into it (preliminary write); performing a second write operation for a second memory cell disposed adjacent to the first memory cell; and then performing a third write operation for the first memory cell in such a way as to write the desired threshold state into it (finishing write).

Figure 34:
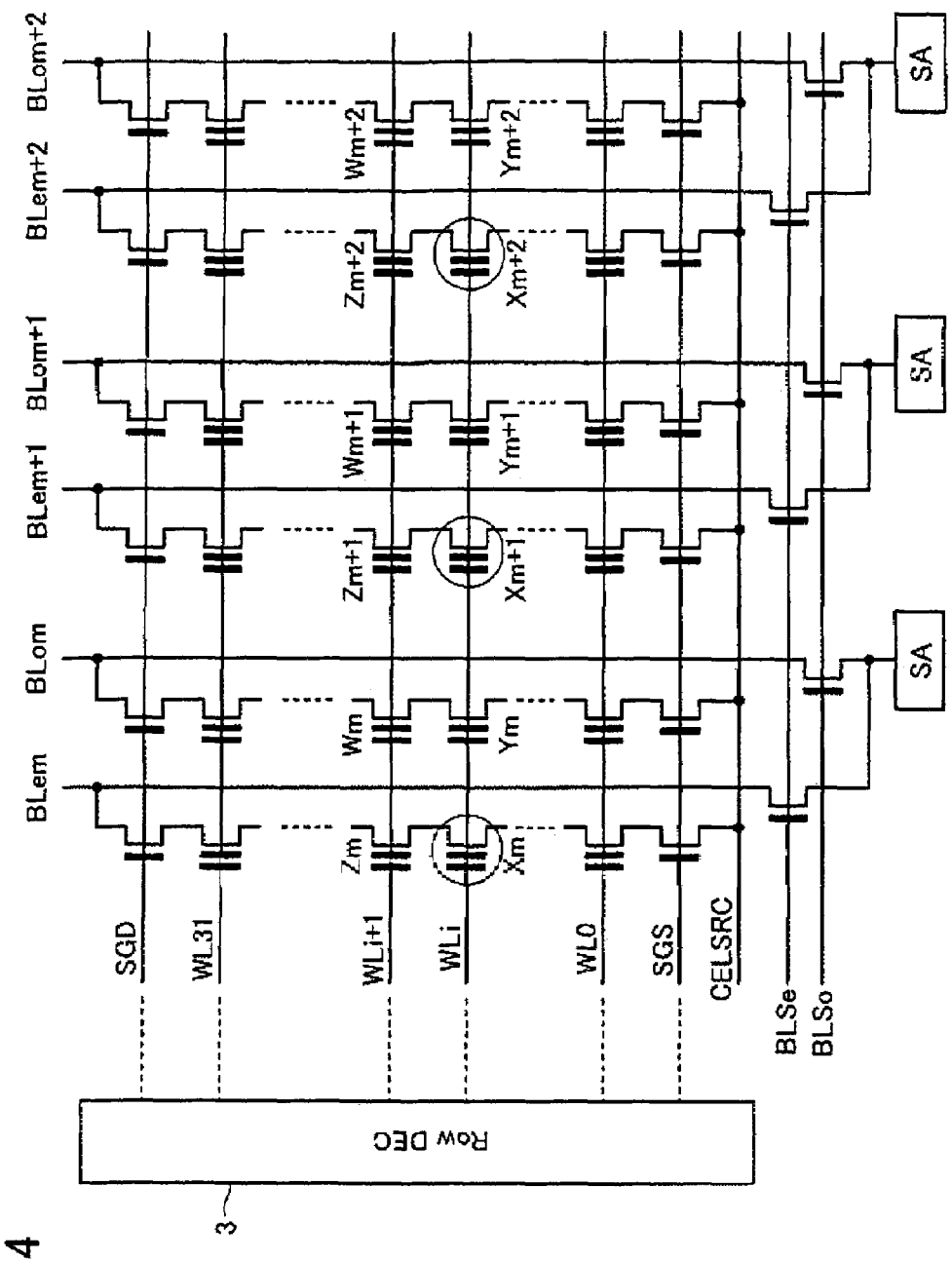
FIG. 34 shows a cell array for explaining a seventh write scheme.

In the memory cell array shown in FIG. 34, which has the sense amplifier scheme shown in FIG. 3, notice adjacent two is word lines WLi and WLi+1, and four memory cell groups (sectors) X, Y, Z and W selected with these word lines. Supposing that data write in a block is performed sequentially from the word line WL0, the data write for the noticed word lines WLi and WLi+1 is performed as follows.

Firstly, data write (i.e., preliminary write) is performed for memory cells (Xm, Xm+1, Xm+2, . . . ) in the sector X, which are selected by the word line WLi and even numbered bit lines BLe (BLem, BLem+1, BLem+2, . . . ). Next, data write (i.e., preliminary write) is performed for memory cells (Ym, Ym+1, Ym+2, . . . ) in the sector Y, which are selected by the same word line WLi and odd numbered bit lines BLo (BLom, BLom+1, BLom+2, . . . ). Following it, data write (i.e., preliminary write) is performed for memory cells (Zm, Zm+1, Zm+2, . . . ) in the sector Z, which are selected by the following word line WLi+1 and even numbered bit lines BLe (BLem, BLem+1, BLem+2, . . . ). Next, data write (i.e., preliminary write) is performed for memory cells (Wm, Wm+1, Wm+2, . . . ) in the sector W, which are selected by the same word line WLi+1 and odd numbered bit lines BLo (BLom, BLom+1, BLom+2, . . . ).

After the above-described four preliminary data write operations, return to the sector X, and perform finishing write for it. Similar finishing write operations will be successively performed for the remaining sectors Y, Z and W.

Although this seventh write scheme may be adapted in general to an M-value data storage memory (where, $M=2^N$), in which one memory cell stores N bits, an example of a four-value data storage memory, i.e., N=2, will be explained below. Supposing that data writing unit is one page, 2-bit data to be stored in one memory cell may be stored not only in different pages, respectively, but also as one page data, data quantity of which is double.

Figure 35:
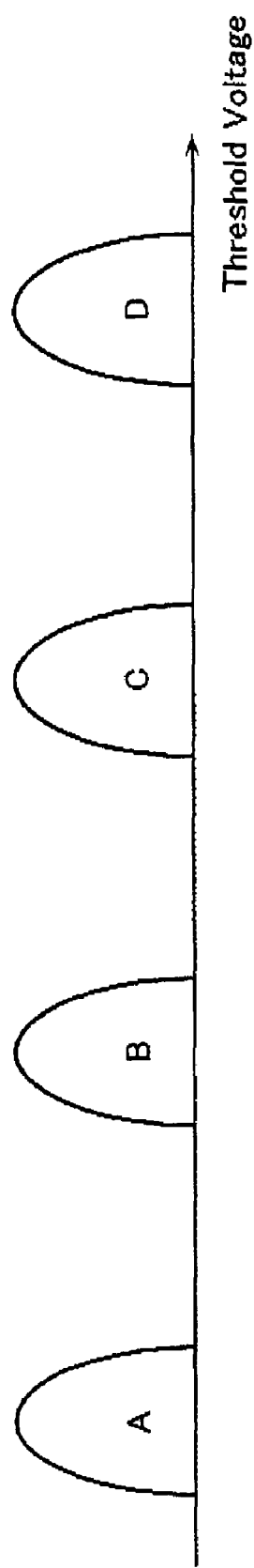
FIG. 35 shows four-value data threshold distributions used in the seventh write scheme.

As shown in FIG. 35, the four-value data "A", "B", "C" and "D" are defined in order of these threshold voltages. It doesn't matter how the data bits are assigned to the data "A", "B", "C" are "D". Data write starts in detail after the steps of: inputting a write command; inputting an address; loading write data; and inputting write-start command. Although the detail is omitted here, the write data will be loaded in the sense amplifier with data latches, and data transformation process is performed, which is necessary for writing data "A", "B", "C" and "D".

FIG. 36 shows an initial state of the noticed sectors (i.e., memory cell groups) X, Y, Z and W, i.e., these are in a data "A" state. Data "A" is, for example, an erase state with the lowest threshold voltage, or it may be permitted to be in a certain low threshold state rather than the erase state. That is, in the four-value data storage scheme explained here, data "A" is supposed as the erase state, but it is not limited to it in case other multi-value data storage schemes are used.

Figure 44:
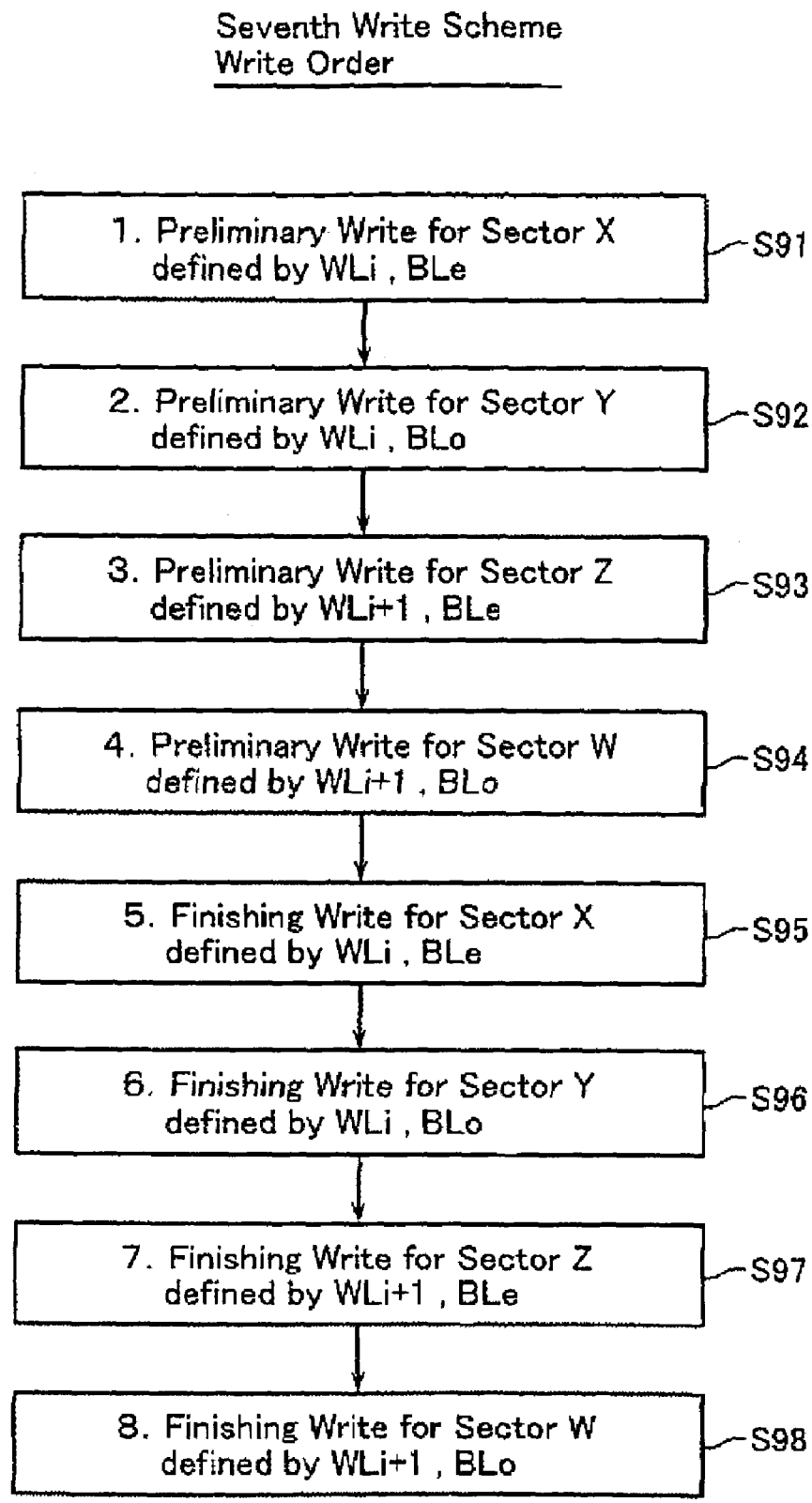
FIG. 44 shows a write order used for the seventh write scheme.

FIG. 37 shows a state where preliminary write has been performed for memory cells in the sector X (step S91 in FIG. 44). Into the memory cells in the sector X, data "B", "C" and "D" are selectively written with verify voltages Vvb1, Vvc1 and Vvd1, respectively. Note here that the verify voltages Vvb1, Vvc1 and Vvd1 are set to be lower than the lowest values of desired threshold distributions of data "B", "C" and "D", respectively. This is a result of considering the threshold voltage change due to influence of the adjacent cells written later, and there will be provided threshold distributions A0. B0, C0 and D0, which are lower than the final ones.

FIG. 38 shows a state where, following the sector X, preliminary write has been performed for memory cells in the sector Y (step S91 in FIG. 44). Data "B", "C" and "D" are selectively written into memory cells in the sector Y with the verify voltages Vvb1, Vvc1 and Vvd1, respectively.

The threshold distributions A0, B0, C0 and D0 (shown by dotted lines in FIG. 38), which are resultants of the above-described preliminary write, will be shifted to the threshold distributions A1, B1, C1 and D1 (shown by solid lines in FIG. 38) after the preliminary write for the sector Y under the influence of the cell data of the sector Y (i.e., FG-FG capacitance coupling).

FIG. 39 shows a state where, following the sector Y, preliminary write has been performed for memory cells in the sector Z (step S93 in FIG. 44). With this preliminary write, the data threshold distributions in the sector X are shifted from A1, B1, C1 and D1 (shown by dotted lines in FIG. 39) to A2, B2, C2 and D2 (shown by solid lines in FIG. 39), respectively.

FIG. 40 shows a state where, following the sector Z, preliminary write has been performed for memory cells in the sector W (step S94 in FIG. 44). With this preliminary write, the data threshold distributions in the sector X are shifted from A2, B2, C2 and D2 (shown by dotted lines in FIG. 40) to A3, B3, C3 and D3 (shown by solid lines in FIG. 40), respectively.

As described above, the predetermined preliminary data write operations are performed for the entire memory cells in the sectors X, Y, Z and W selected by the word lines WLi and WLi+1. The threshold voltages of the memory cells in the sector X firstly selected experience threshold are shifted at each preliminary write time of the sectors Y, Z and W. Therefore, the verify voltages Vvb1, Vvc1 and Vvd1 used at the preliminary time should be set in such a way that the threshold voltage in the sector X is not over the finally desired one even when the threshold shift shows the maximum.

Then, return to the sector X, and perform the finishing write for it's cells (step S95 in FIG. 44). FIG. 41 shows a state after the finishing write to the sector X. At this finishing write time, it is used the same data pattern as that at the preliminary write time, and verify voltages Vvb2, Vvc2 and Vvd2 corresponding to the lowest values of the desired threshold distributions are used for writing data "B", "C" and "D", respectively.

As a result, as shown in FIG. 41, data "B", "C" and "D" in the sector X are shifted from the last threshold distributions B3, C3 and D3 (shown by dotted lines in FIG. 41) to the finally desired threshold distributions B4, C4 and D4 (shown by solid lines in FIG. 41), respectively. The threshold distribution A4 of data "A" is the same as the last one A3. Due to this finishing write of the sector X, the threshold distributions of the sectors Y, Z and W will be slightly shifted.

Hereinafter, as shown in FIG. 42, the sectors Y, Z and W are successively subjected to finishing write with the verify voltages Vvb2, Vvc2 and Vvd2, respectively, as similar to the above-description (steps S96-S98 shown in FIG. 44). Due to these finishing write operations for the sectors Y, Z and W, as shown in FIG. 42, the threshold distributions of the sector X, which has been subjected to finishing write, will be slightly shifted from B4, C4 and D4 (shown by dotted liens in FIG. 42) to B5, C5 and D5 (shown by solid lines in FIG. 42), respectively. However, if the preliminary write is selected to write a level near the desirable threshold voltage, it is possible to suppress the threshold shift after the finish write into a negligible small level.

Figure 43:
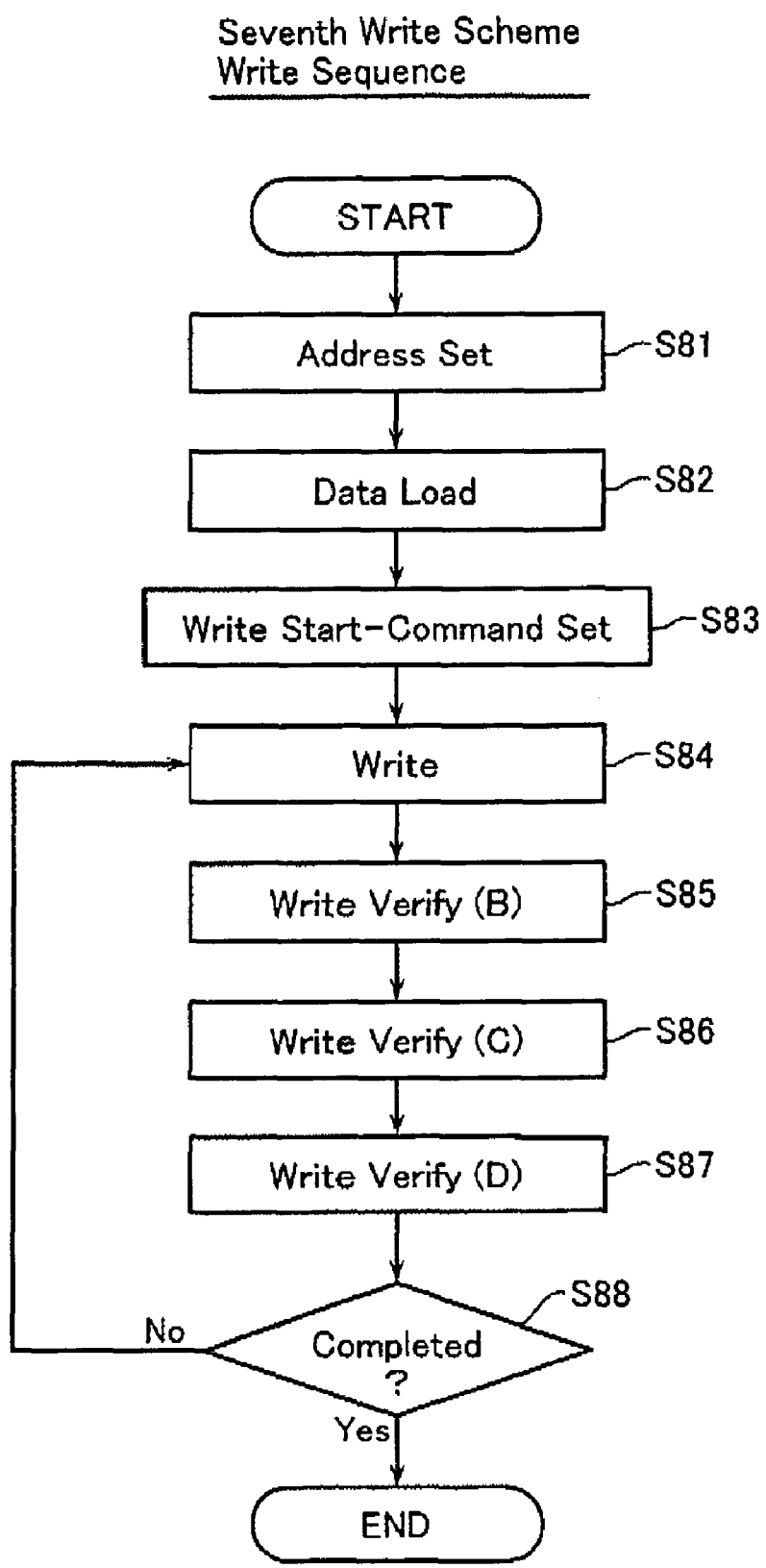
FIG. 43 shows a write sequence used for the seventh write scheme.

FIG. 43 shows a write sequence of the seventh write scheme. This sequence starts with inputting a write command. Input an address for selecting a memory cell group (i.e., sector) (step S81); load write data (step S82); and then input a write-start command (step S83), and a write operation is automatically performed in the ship.

A write cycle includes a write voltage applying step S84 and write-verifying steps S85-S87 for verifying the write states of data "B", "C" and "D". This write cycle will be repeated until the write-completion is judged in the write-completion judgment step S88.

This write sequence may be adapted to not only the preliminary write for the sectors X, Y, Z and W, but also the finishing write performed thereafter for the sectors.

So far, there has been explained for such a case that data write is performed with giving attention to the adjacent two word lines WLi and WLi+1. The point of this scheme is in that preliminary write operations are performed for the word lines WLi and WLi+1 in this order, and then finishing write is performed for the word line WLi. Therefore, in case data write is to be performed for a write area with certain pages in a block, it can be dealt so that the preliminary write and the finishing write are repeated as well as the first write scheme explained with FIG. 13.

Alternately, it may be used such a method as follows: with respect to a write area, in which (n−1) word lines, from WLi to WLi+n, are continuously disposed, the entire word lines are subjected to successive preliminary data write operations, and then finishing write is successively performed for the entire word lines. This is in principle as the second write sequence explained with FIG. 14.

Figure 45:
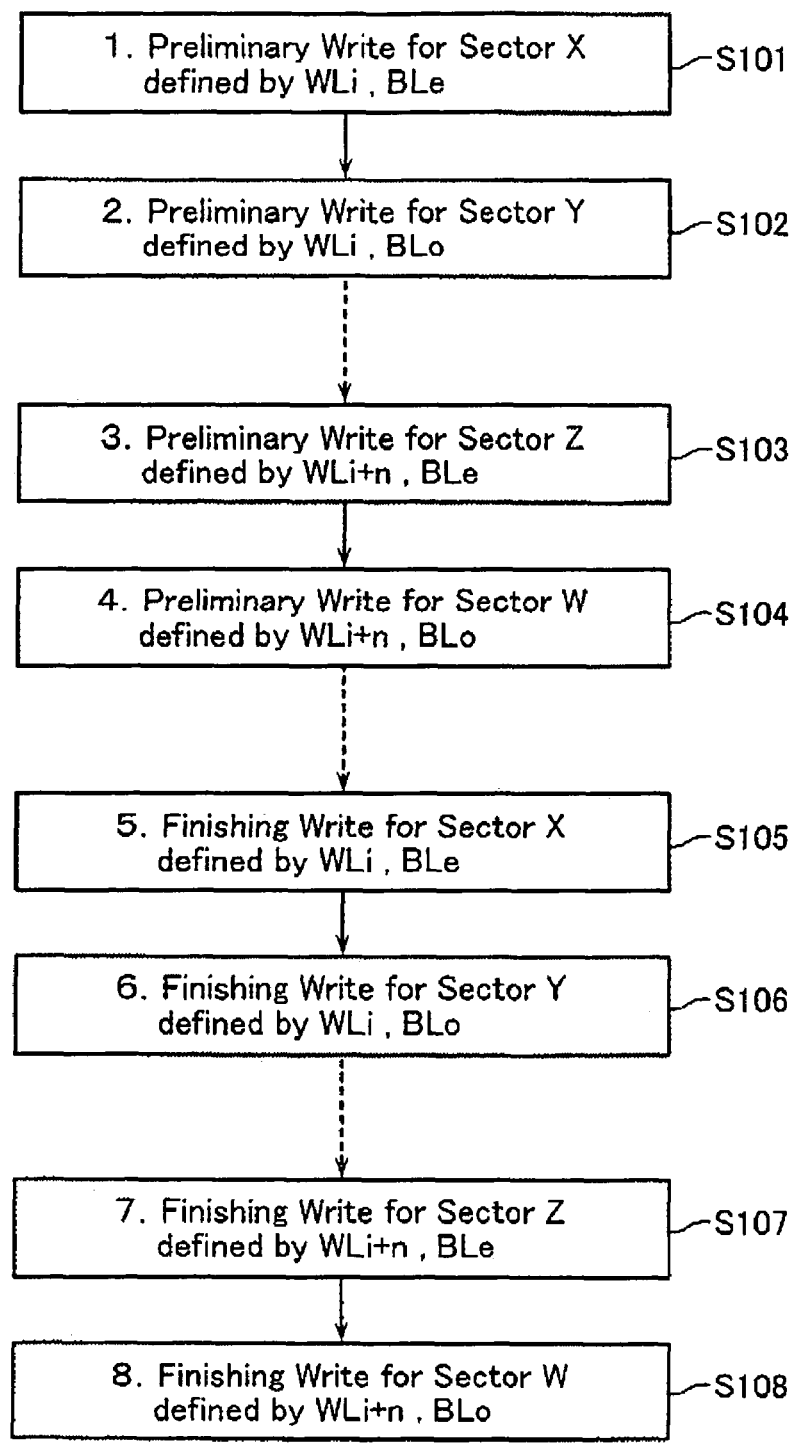
FIG. 45 shows an expanded write order for the seventh write scheme.

FIG. 45 shows such the write sequence. A preliminary write operation is performed for the sector X selected by a word line WLi and even numbered bit lines BLe (step S101), and the following preliminary write operation is performed for the sector Y selected by the same word line WLi and odd numbered bit lines BLo (step S102). Hereinafter, the preliminary write operation is repeated to reach the sectors Z and W, which are selected by a word line WLi+n and even numbered bit lines BLe (step S103), and the same word line WLi+n and odd numbered bit lines BLo (step S104), respectively.

Then, returning to the first sector X, finish write is performed to it (step S105). Following it the sector Y is subjected to finish write (step S106). Hereinafter, the finish write operation will be repeated to reach the sectors Z and W (steps S107 and S108).

According to this write scheme, not only the influence due to FG-FG coupling between adjacent cells may be reduced but also there is obtained such an effect that the influence of the back pattern (i.e., threshold variations due to memory cells data written later to a noticed cell) is reduced.

The present invention is not limited to the above-described embodiments. For example, while in the embodiments with finishing write, two write operations, preliminary write and finishing write, have been performed for a noticed cell, it will be useful to get a desirable threshold voltage with three or more write operations.

Further, if additional data latches are prepared in the sense amplifier, it has no need of externally loading the same write data as in the preliminary data write for performing the finishing write. For example, in the four-value data write scheme, two additional data latches are disposed in the sense amplifier. With this sense amplifier, write data may be held in the additional data latches so as to be used in the finishing data write.

Figure 46:
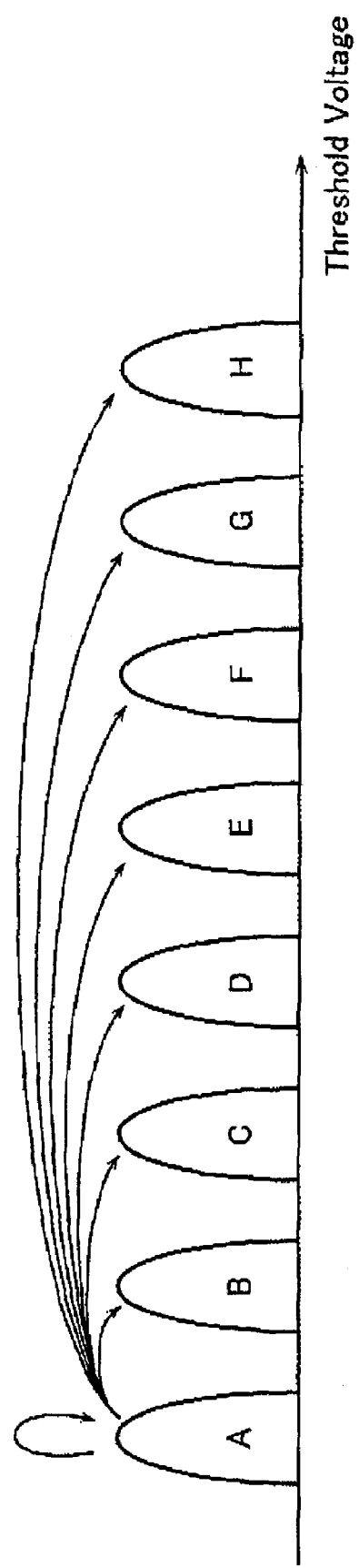
FIG. 46 shows data threshold distributions of eight-value data.
Figure 47:
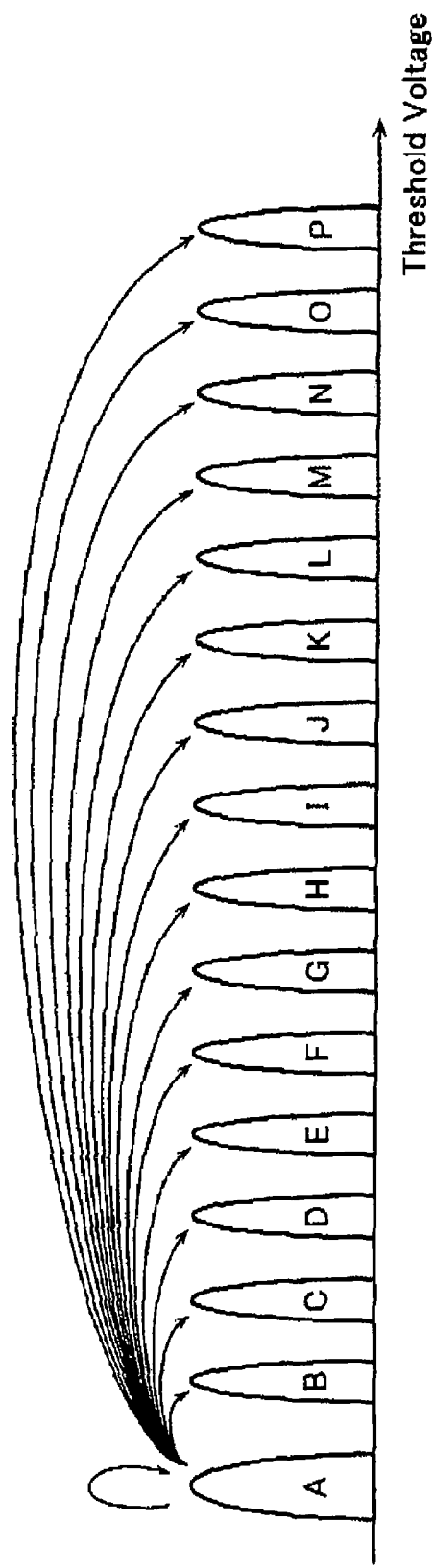
FIG. 47 shows data threshold distributions of sixteen-value data.

Further, the present invention may be adapted to an eight-value data storage scheme with data threshold distributions shown in FIG. 46, a sixteen-value data storage scheme with data threshold distributions shown in FIG. 47, and the like.

Next, as an embodiment, an electric card using the non-volatile semiconductor memory devices according to the above-described embodiments of the present invention and an electric device using the card will be described bellow.

Figure 51:
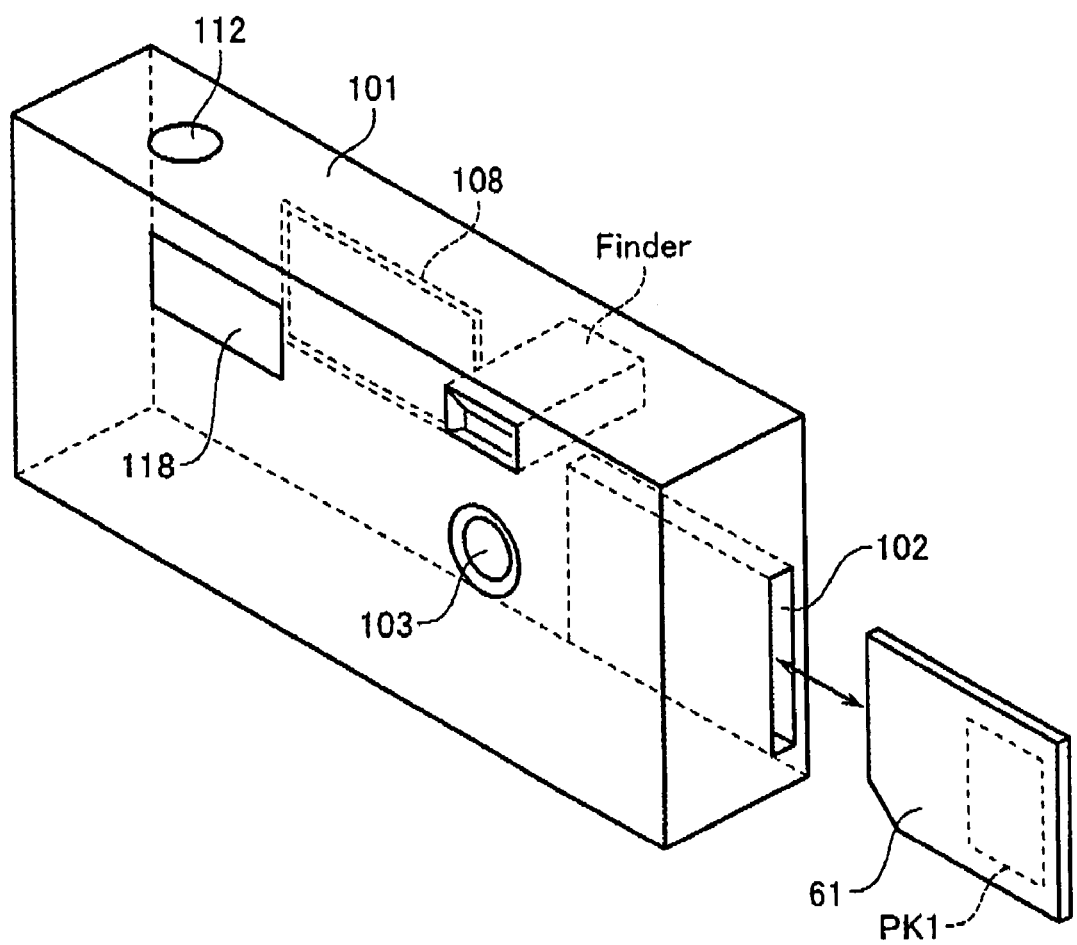
FIG. 51 shows an embodiment applied to a digital still camera.

FIG. 51 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 52:
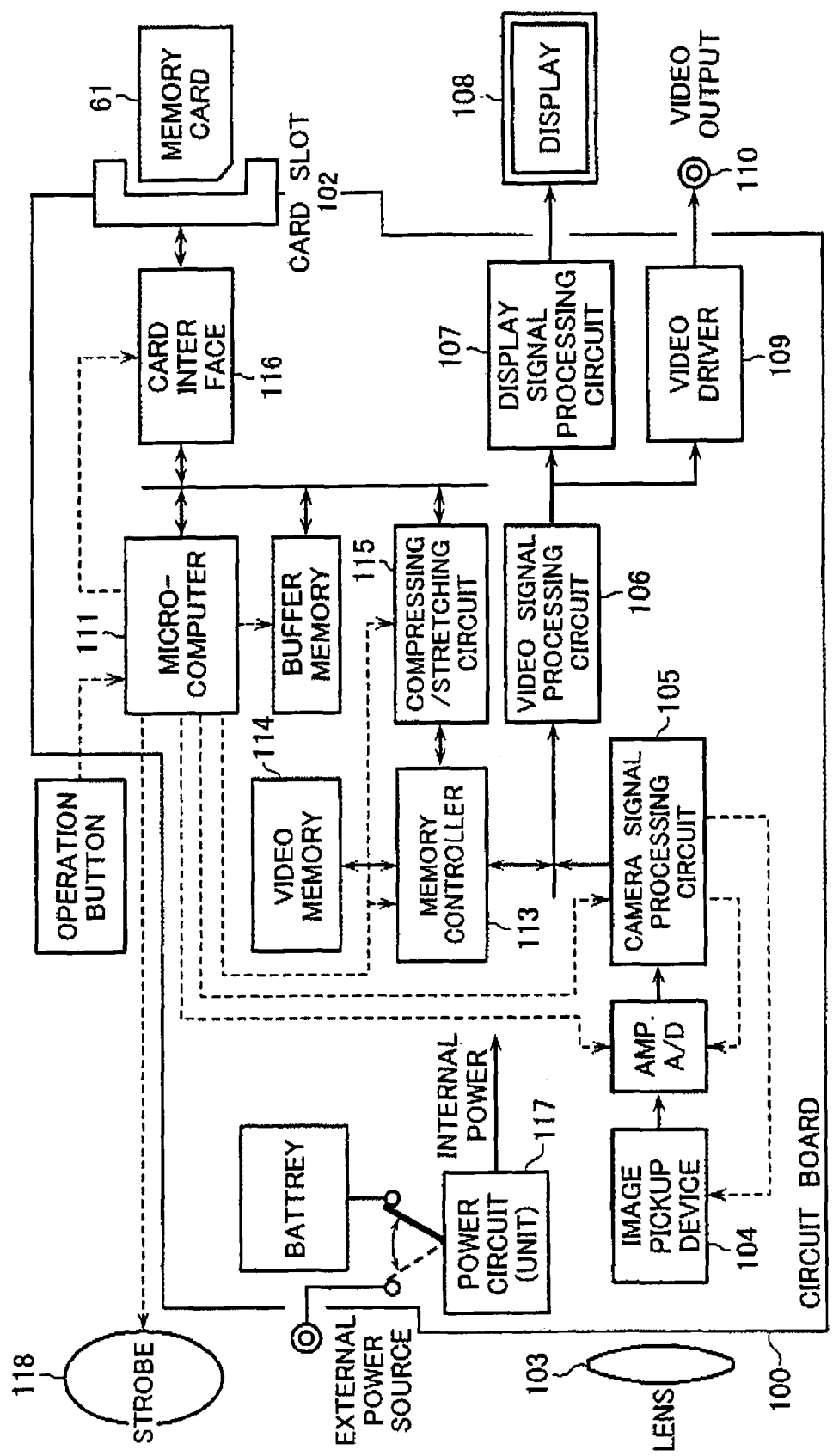
FIG. 52 shows the internal configuration of the digital still camera.

FIG. 52 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

Figure 53A:
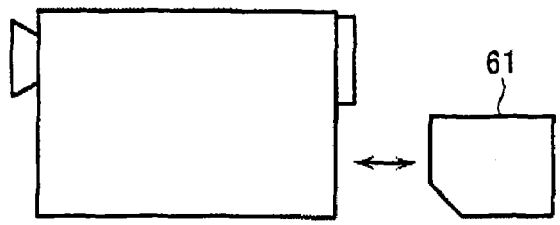
FIGS. 53A to 53J show other electric devices to which the embodiment is applied.
Figure 53F:
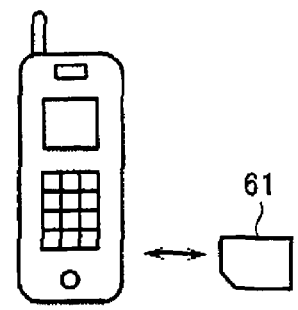
Figure 53B:
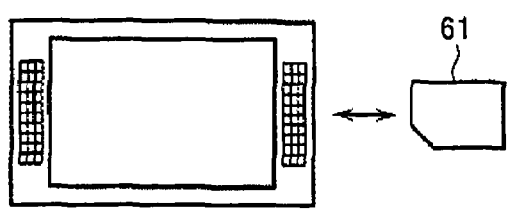
Figure 53G:
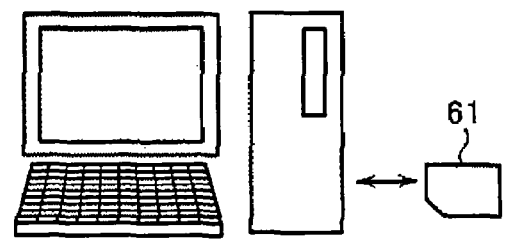
Figure 53C:
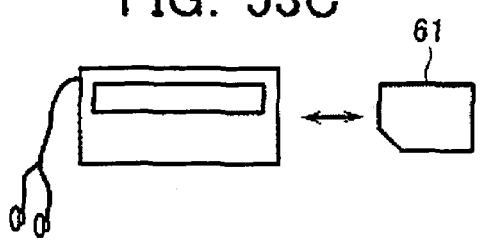
Figure 53H:
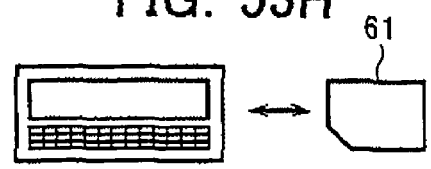
Figure 53D:
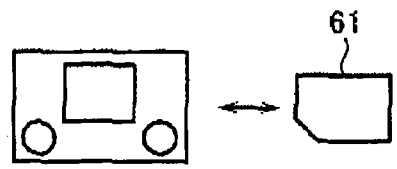
Figure 53I:
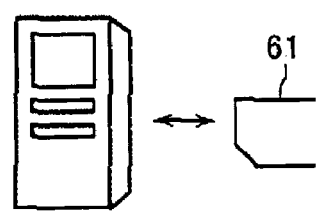
Figure 53E:
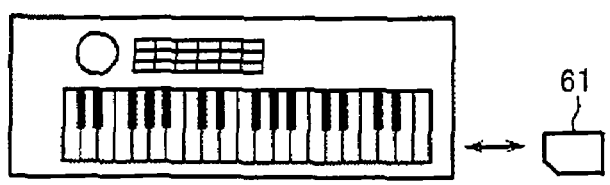
Figure 53J:
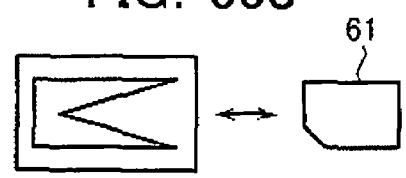

As described above, the electric card according to this embodiment can be used in portable electric devices such as the digital still camera explained above. However, the electric card can also be used in various apparatus such as shown in FIGS. 53A to 53J, as well as in portable electric devices. That is, the electric card can also be used in a video camera shown in FIG. 53A, a television set shown in FIG. 53B, an audio apparatus shown in FIG. 53C, a game apparatus shown in FIG. 53D, is an electric musical instrument shown in FIG. 53E, a cell phone shown in FIG. 53F, a personal computer shown in FIG. 53G, a personal digital assistant (PDA) shown in FIG. 53H, a voice recorder shown in FIG. 53I, and a PC card shown in FIG. 63J.

What is claimed is:

1. A method of writing data to a semiconductor memory device with memory cells, each of which stores data defined by threshold voltage thereof in a non-volatile manner, the device having first and second memory cells disposed adjacent to each other to be sequentially written in this order, the method comprising:
    performing a first data write operation for writing data defined by a threshold voltage lower than a desired threshold voltage into the first memory cell;
    performing a second data write operation for writing data into the second memory cell; and
    performing a third data writing operation for writing data defined by the desired threshold voltage into the first memory cell.

2. The method according to claim 1, wherein
    the first and second memory cells are coupled to adjacent two word lines, respectively.

3. The method according to claim 1, wherein
    the first and second memory cells are coupled to adjacent two bit lines, respectively.

4. The method according to claim 1, wherein
    each of the first to third data write operations is performed by repeat of write voltage application and write-verify, the write voltage being boosted in accordance with write cycle increase, and wherein
    a write voltage step-up in the third data write operation is set to be lower than that in the first data write operation.

5. The method according to claim 1, wherein
    the third data write operation is performed as an independent write sequence based on command input, or performed in a sequence of the second data operation as following the write completion detection therein.

6. The method according to claim 1, wherein
the third data write operation is performed by use of write data, which are written into the first memory cell in accordance with the first data write operation and then read out as the write data.

7. The method according to claim 1, wherein
the device has a memory cell array in which NAND cell units are arranged, each NAND cell unit including a plurality of memory cells connected in series.

8. The method according to claim 1, wherein
the device is configured to store multi-value data.

9. A method of writing data to a semiconductor memory device, the device comprising word lines and bit lines which are arranged as crossing each other and electrically rewritable and non-volatile memory cells disposed at the respective crossings of the word lines and bit lines, the method comprising:
performing a first data write operation for selectively writing a threshold voltage state lower than a desired threshold voltage into a first set of memory cells;
performing, after the first data write operation, a second data write operation for selectively writing data into a second set of memory cells disposed adjacent to the first set of memory cells; and
performing, after the second data write operation, a third data write operation for writing the desired threshold voltage state into the first set of memory cells with the same data pattern as in the first data write operation.

10. The method according to claim 9, wherein
the first data write operation is for preliminarily writing data into the first set of memory cells arranged along a first word line;
the second data write operation is for preliminarily writing data into the second set of memory cells arranged along a second word line disposed adjacent to the first word line and selected as following the first word line; and
the third data write operation is a finishing write operation for writing the desired threshold state into the first set of memory cells.

11. The method according to claim 9, wherein
the first data write operation is for preliminarily writing data into the first set of memory cells selected by a certain word line and even numbered bit lines;
the second data write operation is for preliminarily writing data into the second set of memory cells selected by the certain word line and odd numbered bit lines; and
the third data write operation is a finishing write operation for writing the desired threshold state into the first set of memory cells.

12. The method according to claim 9, wherein
the first set of memory cells is a first sector X, which includes memory cells selected by a first word line and even numbered bit lines;
the second set of memory cells includes a second sector Y containing memory cells selected by the first word line and odd numbered bit lines, a third sector Z containing memory cells selected by the first word line and the even numbered bit lines, and a fourth sector W containing memory cells selected by the second word line and the odd numbered bit lines; and wherein
the first data write operation Is for preliminarily writing data into the first sector;
the second data write operation is for preliminarily writing data sequentially into the second to fourth sectors; and the third data write operation is a finishing write operation for writing the desired threshold state into the first sector.

13. The method according to claim 9, wherein
the third data write operation is performed as an independent write sequence based on command input, or performed in a sequence of the second data operation as following the write completion detection therein.

14. The method according to claim 9, wherein
the third data write operation is performed by use of write data, which are written into the first memory cell in accordance with the first data write operation and then read out as the write data.

15. The method according to claim 9, wherein
the device has a memory cell array in which NAND cell units are arranged, each NAND cell unit including a plurality of memory cells connected in series.

16. The method according to claim 9, wherein
the device is configured to store multi-value data.

17. The method according to claim 9 wherein
each memory cell stores four-value data defined by lower page data and upper page data, and wherein
the first data write operation is a first preliminary write operation for writing upper page data with threshold voltages lower than desired threshold voltages into the first set of memory cells, in which lower page data have already been written;
the second data write operation is a second preliminary write operation for writing upper page data with threshold voltages lower than the desired threshold voltages into the second set of memory cells, in which lower page data have already been written; and
the third data write operation is a finishing data write operation for writing upper page data with the desired threshold voltages into the first set of memory cells for which the first preliminary data write has been performed.

18. A method of writing data to a semiconductor memory device with memory cells, each of which stores data defined by threshold voltage thereof in a non-volatile manner, the device having first and second memory cells disposed adjacent to each other to be sequentially written in this order, the method being to write data with a desired threshold voltage into the first memory cell, wherein
in case data to be written into the second memory cell is a first threshold voltage state, a first write-verify voltage equal to the desired threshold voltage is used at the data write time for the first memory cell; and
in case data to be written into the second memory cell is a second threshold voltage state higher than the first threshold voltage, a second write-verify voltage lower than the desired threshold voltage is used at the data write time for the first memory cell.

19. A method of writing data to a semiconductor memory device, the device comprising word lines and bit lines which are arranged as crossing each other and electrically rewritable and non-volatile memory cells disposed at the respective crossings of the word lines and bit lines, the method comprising:
applying a write voltage to at least two, first and second, memory cells arranged along a word line for writing data defined by a desired threshold voltage state;
in case data to be written into a third memory cell disposed adjacent to the first memory cell has no influence on the first memory cell's threshold voltage, the third memory cell being selected by a second word line selected as following the first word line, performing write-verify with a first verify-voltage equal to the desired threshold voltage; and in case data to be written into a fourth memory cell disposed adjacent to the second memory cell has influence on the second memory cell's threshold voltage, the fourth memory cell being selected by the second word line, performing write-verify with a second verify-voltage lower than the desired threshold voltage.

20. The method according to claim 19, wherein
data to be written into the third and fourth memory cells are loaded in a sense amplifier circuit at the data write time for the first and second memory cells, and write-verify operations with the first and second verify-voltages are sequentially executed in accordance with the data loaded in the sense amplifier circuit.

\* \* \* \* \*